US011832511B2

(12) United States Patent
Kim et al.

(10) Patent No.: US 11,832,511 B2
(45) Date of Patent: Nov. 28, 2023

(54) ORGANOMETALLIC COMPOUND, ORGANIC LIGHT-EMITTING DEVICE INCLUDING THE SAME, AND DIAGNOSTIC COMPOSITION INCLUDING THE ORGANOMETALLIC COMPOUND

(71) Applicants: Samsung Electronics Co., Ltd., Suwon-si (KR); University of Ulsan Foundation For Industry Cooperation, Ulsan (KR)

(72) Inventors: Sangmo Kim, Hwaseong-si (KR); Minhyung Lee, Daejeon (KR); Minsik Min, Suwon-si (KR); Hyejin Bae, Suwon-si (KR); Jhunmo Son, Yongin-si (KR); Yongsik Jung, Seoul (KR); Hyeonho Choi, Seoul (KR); Younghoon Lee, Ulsan (KR); Hasup Lee, Seoul (KR); Jun Chwae, Seoul (KR)

(73) Assignees: SAMSUNG ELECTRONICS CO., LTD., Gyeonggi-Do (KR); UNIVERSITY OF ULSAN FOUNDATION FOR INDUSTRY COOPERATION, Ulsan (KR)

( * ) Notice: Subject to any disclaimer, the term of this patent is extended or adjusted under 35 U.S.C. 154(b) by 657 days.

(21) Appl. No.: 17/035,858

(22) Filed: Sep. 29, 2020

(65) Prior Publication Data

US 2021/0167303 A1 Jun. 3, 2021

(30) Foreign Application Priority Data

Nov. 28, 2019 (KR) ........................ 10-2019-0156124

(51) Int. Cl.
*H10K 85/30* (2023.01)
*C07F 15/00* (2006.01)
(Continued)

(52) U.S. Cl.
CPC ....... *H10K 85/346* (2023.02); *C07F 15/0086* (2013.01); *C09K 11/06* (2013.01);
(Continued)

(58) Field of Classification Search
CPC .. H10K 85/346; H10K 50/11; H10K 2101/10; C07F 15/0086; C09K 11/06;
(Continued)

(56) References Cited

U.S. PATENT DOCUMENTS

| | | | |
|---|---|---|---|
| 7,553,560 | B2 | 6/2009 | Lamansky et al. |
| 2007/0176542 | A1 | 8/2007 | Ragini et al. |

(Continued)

FOREIGN PATENT DOCUMENTS

| | | | |
|---|---|---|---|
| CN | 107474074 | A | 12/2017 |
| CN | 107474075 | A | 12/2017 |

(Continued)

OTHER PUBLICATIONS

English Abstract of CN 107474075.

(Continued)

*Primary Examiner* — Michael M. Bernshteyn
(74) *Attorney, Agent, or Firm* — CANTOR COLBURN LLP

(57) ABSTRACT

An organometallic compound represented by Formula 1, an organic light-emitting device including the organometallic compound, and a diagnostic composition including the organometallic compound are provided:

$$M_1(L_{11})_{n11}(L_{12})_{n12} \quad \text{Formula 1}$$

wherein, in Formula 1, $L_{11}$ may be a ligand represented by Formula 1-1, and the other substituents may be understood by referring to the descriptions thereof provided in the detailed description:

(Continued)

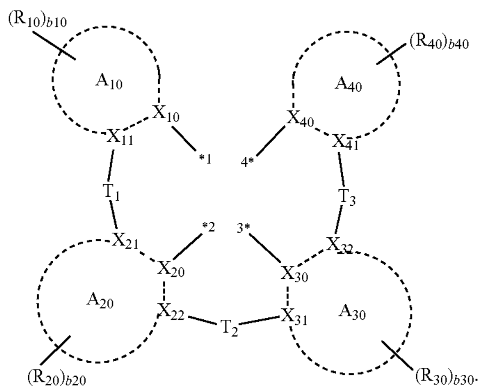

Formula 1-1

20 Claims, 5 Drawing Sheets

(51) Int. Cl.
*C09K 11/06* (2006.01)
*H10K 50/11* (2023.01)
*H10K 101/10* (2023.01)

(52) U.S. Cl.
CPC ................ *C09K 2211/1029* (2013.01); *C09K 2211/1044* (2013.01); *C09K 2211/185* (2013.01); *H10K 50/11* (2023.02); *H10K 2101/10* (2023.02)

(58) Field of Classification Search
CPC .... C09K 2211/1029; C09K 2211/1044; C09K 2211/185
USPC ........................................................ 428/690
See application file for complete search history.

(56) References Cited

U.S. PATENT DOCUMENTS

| | | | |
|---|---|---|---|
| 2009/0079340 A1 | 3/2009 | Kinoshita et al. | |
| 2014/0364605 A1 | 12/2014 | Li et al. | |
| 2018/0026210 A1* | 1/2018 | Dyatkin | H10K 85/40 257/40 |
| 2018/0337350 A1* | 11/2018 | Li | C07F 15/006 |
| 2019/0036042 A1* | 1/2019 | Kim | H10K 85/346 |
| 2019/0074455 A1* | 3/2019 | Chen | C07F 15/0086 |
| 2019/0119312 A1 | 4/2019 | Chen et al. | |
| 2019/0214584 A1* | 7/2019 | Chen | H10K 85/6572 |

FOREIGN PATENT DOCUMENTS

| | | |
|---|---|---|
| JP | 2011213674 A | 10/2011 |
| WO | 2002015645 A1 | 2/2002 |

OTHER PUBLICATIONS

English Abstract of CN107474074.
English Abstract of JP 2011-213674.
Ruben Seifert, et al., Chemical degradation mechanisms of highly efficient blue phosphorescent emitters used for organic light emitting diodes, Organic Electronics 14 (2013) 115-123.

* cited by examiner

ORGANOMETALLIC COMPOUND, ORGANIC LIGHT-EMITTING DEVICE INCLUDING THE SAME, AND DIAGNOSTIC COMPOSITION INCLUDING THE ORGANOMETALLIC COMPOUND

CROSS-REFERENCE TO RELATED APPLICATION

This application claims the priority and benefit of Korean Patent Application No. 10-2019-0156124, filed on Nov. 28, 2019, in the Korean Intellectual Property Office, the content of which is incorporated herein in its entirety by reference.

BACKGROUND

1. Field

One or more embodiments relate to organometallic compounds, organic light-emitting devices including the same, and diagnostic compositions including the same.

2. Description of Related Art

Organic light-emitting devices are self-emission devices, which have improved characteristics in terms of a viewing angle, a response time, brightness, a driving voltage, and a response speed, and produce full-color images.

In an example, an organic light-emitting device includes an anode, a cathode, and an organic layer between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Meanwhile, luminescent compounds, for example, phosphorescent compounds, may be used for monitoring, sensing, and detecting biological materials such as various cells and proteins.

SUMMARY

Provided are an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments of the disclosure.

According to an aspect of an embodiment, an organometallic compound represented by Formula 1 is provided:

$$M_1(L_{11})_{n11}(L_{12})_{n12} \qquad \text{Formula 1}$$

wherein, in Formula 1, $M_1$ is a Period 1 transition metal, a Period 2 transition metal, or a Period 3 transition metal, $L_{11}$ may be a ligand represented by Formula 1-1, $L_{12}$ may be a monodentate ligand or a bidentate ligand, n11 may be 1, and n12 may be 0, 1, or 2:

Formula 1-1

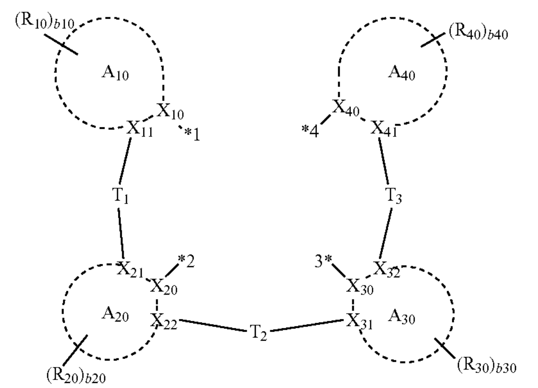

Formula 1-1A

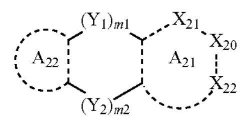

Formula 1-1B

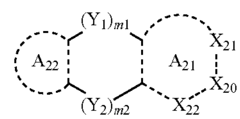

wherein in Formulae 1, 1-1, 1-1A and 1-1B, 1 to *4 may each independently indicate a binding site to $M_1$, $A_{10}$, $A_{30}$, and $A_{40}$ may each independently be a $C_5$-$C_{30}$ carbocyclic group or a $C_1$-$C_{30}$ heterocyclic group, $A_{20}$ may be a group represented by one of Formulae 1-1A or 1-1B, $A_{21}$ and $A_{22}$ may each independently be a benzene group, a naphthalene group, a pyridine group, a pyrimidine group, or a triazine group, $X_{10}$, $X_{11}$, $X_{20}$ to $X_{22}$, $X_{30}$ to $X_{32}$, $X_{40}$, and $X_{41}$ may each independently be C or N, $Y_1$ and $Y_2$ may each independently be *—O—*', *—S—*', *—N($R_{21}$)—*', *—C($R_{21}$)($R_{22}$)—*', *—Si($R_{21}$)($R_{22}$)—*', *—Ge($R_{21}$)($R_{22}$)—*', or *—Se—*', m1 and m2 may each independently be 0 or 1, wherein m1+m2=1, when m1 is 0, $Y_1$ may be a single bond, when m2 is 0, $Y_2$ may be a single bond, $T_1$ to $T_3$ may each independently be a single bond, *—N[$(L_1)_{a1}$-$(R_1)_{b1}$]—*', *—B($R_1$)—*', *—P($R_1$)—*', *—C($R_1$)($R_2$)—*', *—Si($R_1$)($R_2$)—*', *—Ge($R_1$)($R_2$)—*', *—S—*', *—Se—*', *—O—*', *—C(=O)—*', *—S(=O)—*', *—S(=O)$_2$—*', *—C($R_1$)=C($R_2$)—*', *—O(=S)—*', or *—C≡C—*', $L_1$ may be a single bond, a substituted or unsubstituted $C_5$-$C_{30}$ carbocyclic group, or a substituted or unsubstituted $C_1$-$C_{30}$ heterocyclic group, a1 may be an integer from 1 to 3, and when a1 is 2 or more, two or more of $L_1$(s) may be identical to or different from each other, $R_1$, $R_2$, $R_{10}$, $R_{20}$ to $R_{22}$, $R_{30}$, and $R_{40}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$, $R_1$, $R_2$, $R_{10}$, $R_{20}$ to $R_{22}$, $R_{30}$, and $R_{40}$ may optionally be bound to form a substituted or unsubstituted $C_5$-$C_{30}$ carbocyclic group or a substituted or unsubstituted $C_1$-$C_{30}$ heterocyclic group, b1 may be an integer from 1 to 5, and when b1 is 2 or more, two or more of $R_1$(s) may be identical to or different from each other, b10, b20, b30, and b40 may each independently be an integer from 1 to 10, when b10 is two or more, two or more of $R_{10}$(s) may be identical to or different from each other, when b20 is 2 or more, two or more of $R_{20}$(s) may be identical to or different from each other, when b30 is 2 or more, two or more of $R_{30}$(s) may be identical to or different from each other, when b40 is 2 or more, two or more of $R_{40}$(s) may be identical to or different from each other, and at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a combination thereof;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a combination thereof, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, —$P(=O)(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or a combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or a combination thereof, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, —$P(=O)(Q_{28})(Q_{29})$, or a combination thereof; or —$N(Q_{31})(Q_{32})$, —$Si(Q_{33})(Q_{34})(Q_{35})$, —$B(Q_{36})(Q_{37})$, —$P(=O)(Q_{38})(Q_{39})$, or a combination thereof, wherein $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryl group substituted with at least one a $C_1$-$C_{60}$ alkyl group and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

According to an aspect of another embodiment, an organic light-emitting device may include: a first electrode; a second electrode; and an organic layer between the first electrode and the second electrode, the organic layer including an emission layer and at least one of the organometallic compound.

Another aspect provides a diagnostic composition including at least one of the organometallic compound represented by Formula 1.

BRIEF DESCRIPTION OF THE DRAWING

The above and other aspects, features, and advantages of certain embodiments of the disclosure will be more apparent from the following description taken in conjunction with the figures.

DETAILED DESCRIPTION

Figure 1:
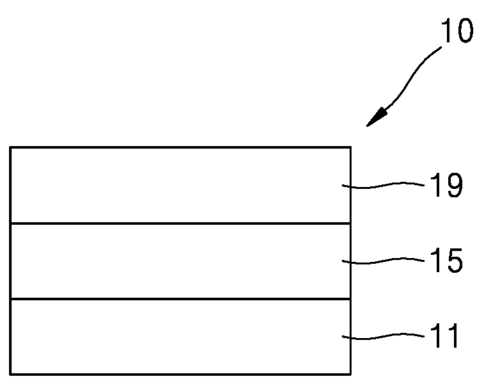
FIG. 1 shows a schematic cross-sectional view of an organic light-emitting device according to an exemplary embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the figure Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

An organometallic compound in an embodiment may be represented by Formula 1:

$$M_1(L_{11})_{n11}(L_{12})_{n12} \qquad \text{Formula 1}$$

wherein, in Formula 1, $M_1$ may be a Period 1 transition metal, a Period 2 transition metal, or a Period 3 transition metal.

In some embodiments, $M_1$ may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver, (Ag), rhenium (Re), platinum (Pt), or gold (Au).

In an embodiment, $M_1$ may be Pd, Pt, or Au.

In an embodiment, in Formula 1, $M_1$ may be Pt or Pd.

In an embodiment, in Formula 1, $M_1$ may be Pt.

In Formula 1, $A_1$ to $A_3$ may each independently be a $C_5$-$C_{30}$ carbocyclic group or a $C_1$-$C_{30}$ heterocyclic group.

In Formula 1, $L_{11}$ may be a ligand represented by Formula 1-1:

Formula 1-1

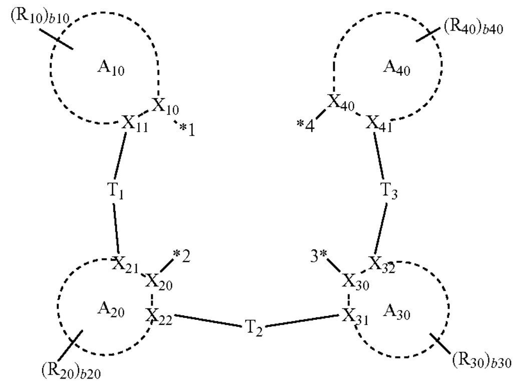

wherein, in Formula 1-1, *1 to *4 may each independently be a binding site to $M_1$.

In Formula 1, $A_{10}$, $A_{30}$, and $A_{40}$ may each independently be a $C_5$-$C_{30}$ carbocyclic group or a $C_1$-$C_{30}$ heterocyclic group.

In an embodiment, $A_{10}$, $A_{30}$ and $A_{40}$ may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, an indazole group, a benzoxazole group, a benzothiazole group, a benzoxadiazole group, a benzothiadiazole group, a benzotriazole group, a diazaindene group, a triazaindene group, a 5,6,7,8-tetrahydroisoquinoline group, or a 5,6,7,8-tetrahydroquinoline group.

In an embodiment, $A_{10}$ may be (i) a 5-membered carbocyclic group and a 5-membered heterocyclic group; (ii) a 5-membered carbocyclic group and 5-membered heterocyclic group, each substituted with a 6-membered carbocyclic group; or (iii) a 5-membered carbocyclic group and 5-membered heterocyclic group, each substituted with a 6-membered heterocyclic group.

In an embodiment, $A_{10}$ may be Formulae 2-1A or 2-1B:

2-1A

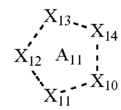

2-1B

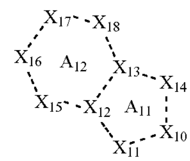

wherein in Formulae 2-1A, and 2-1B, $X_{10}$ and $X_{11}$ may respectively be understood by referring to the descriptions of $X_{10}$ and $X_{11}$ provided herein, $A_{11}$ may be a 5-membered heterocyclic group, $A_{12}$ may be a 6-membered carbocyclic group or a 6-membered heterocyclic group, $X_{12}$ may be N or C($R_{12}$), $X_{13}$ may be N or C($R_{13}$), $X_{14}$ may be N or C($R_{14}$), $X_{15}$ may be N or C($R_{15}$), $X_{16}$ may be N or C($R_{16}$), $X_{17}$ may be N or C($R_{17}$), and $X_{18}$ may be N or C($R_{18}$), and $R_{12}$ to $R_{18}$ may each independently be understood by referring to the description of $R_{10}$ provided herein.

In Formula 1-1, $A_{20}$ may be a group represented by one of Formulae 1-1A or 1-1B.

Formula 1-1A

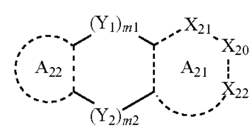

Formula 1-1B

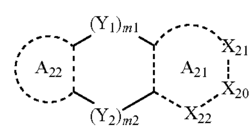

wherein, in Formulae 1-1A and 1-1B, $A_{21}$ and $A_{22}$ may each independently be a benzene group, a naphthalene group, a pyridine group, a pyrimidine group, or a triazine group.

In Formulae 1-1A and 1-1B, $Y_1$ and $Y_2$ may each independently be *—O—*', *—S—*', *—N($R_{21}$)—*', *—C($R_{21}$)($R_{22}$)—*', *—Si($R_{21}$)($R_{22}$)—*', *—Ge($R_{21}$)($R_{22}$)—*', or *—Se—*'.

In Formulae 1-1A and 1-1B, m1 and m2 may each independently be 0 or 1, wherein m1+m2=1, when m1 is 0, $Y_1$ may be a single bond, and when m2 is 0, $Y_2$ may be a single bond.

In an embodiment, $A_{20}$ may be Formulae 2-2A or 2-2B:

Formula 2-2A

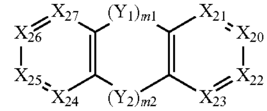

-continued

Formula 2-2B

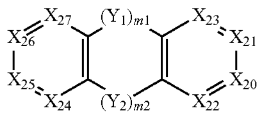

wherein in Formulae 2-2A, and 2-2B, $X_{20}$ to $X_{22}$, $Y_1$, $Y_2$, m1, and m2 may respectively be understood by referring to the descriptions of $X_{20}$ to $X_{22}$, $Y_1$, $Y_2$, m1, and m2 provided herein, $X_{23}$ may be N or $C(R_{23})$, $X_{24}$ may be N or $C(R_{24})$, $X_{25}$ may be N or $C(R_{25})$, $X_{26}$ may be N or $C(R_{26})$, and $X_{27}$ may be N or $C(R_{27})$, and $R_{23}$ to $R_{27}$ may each independently be understood by referring to the description of $R_{20}$ provided herein.

In an embodiment,

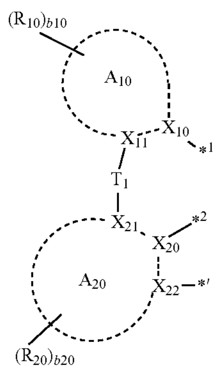

moiety in Formula 1-1 may be Formulae 4-1 to 4-8:

4-1

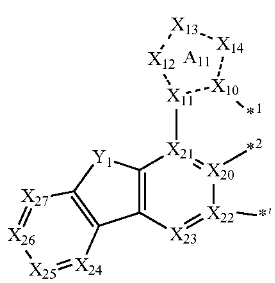

4-2

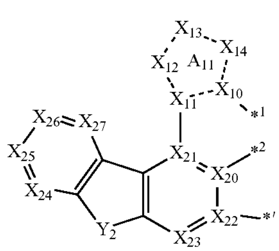

-continued 4-3

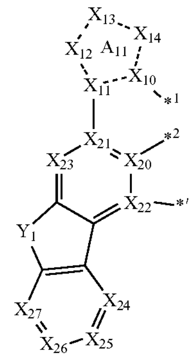

4-4

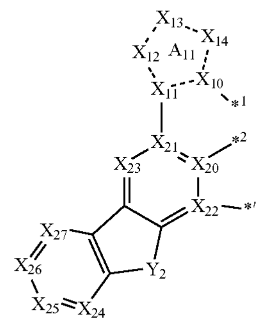

4-5

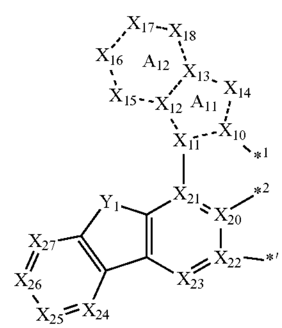

4-6

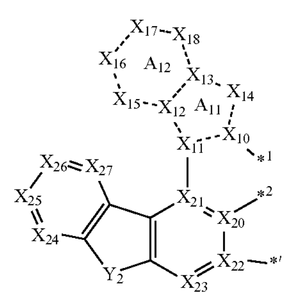

-continued 4-7

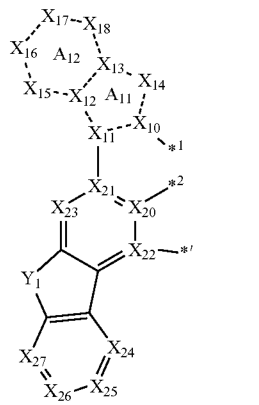

4-8

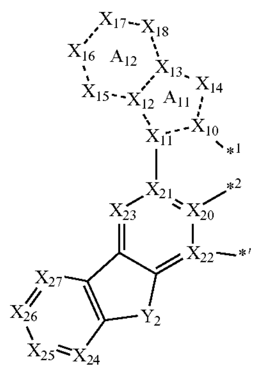

wherein, in Formulae 4-1 to 4-8, $X_{10}$, $X_{11}$, and $X_{20}$ to $X_{22}$ may respectively be understood by referring to the descriptions of $X_{10}$, $X_{11}$, and $X_{20}$ to $X_{22}$ provided herein, $A_{11}$ may be a 5-membered heterocyclic group, $A_{12}$ may be a 6-membered carbocyclic group or a 6-membered heterocyclic group, $X_{12}$ may be N or C($R_{12}$), $X_{13}$ may be N or C($R_{13}$), $X_{14}$ may be N or C($R_{14}$), $X_{15}$ may be N or C($R_{15}$), $X_{16}$ may be N or C($R_{16}$), $X_{17}$ may be N or C($R_{17}$), and $X_{15}$ may be N or C($R_{10}$), and $X_{23}$ may be N or C($R_{23}$), $X_{24}$ may be N or C($R_{24}$), $X_{25}$ may be N or C($R_{25}$), $X_{26}$ may be N or C($R_{26}$), and $X_{27}$ may be N or C($R_{27}$), $R_{12}$ to $R_{18}$ may each independently be understood by referring to the description of $R_{10}$ provided herein, and $R_{23}$ to $R_{27}$ may each independently be understood by referring to the description of $R_{20}$ provided herein.

In an embodiment, $A_{40}$ may be a 6-membered carbocyclic group or a 6-membered heterocyclic group.

In some embodiments, $A_{40}$ may be a benzene group, a naphthalene group, an anthracene group, a phenanthrene group, a triphenylene group, a pyrene group, a chrysene group, cyclopentadiene group, a 1,2,3,4-tetrahydronaphthalene group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a benzopyrazole group, a benzimidazole group, an indazole group, a benzoxazole group, a benzothiazole group, a benzoxadiazole group, a benzothiadiazole group, a benzotriazole group, a diazaindene group, a triazaindene group, a 5,6,7,8-tetrahydroisoquinoline group, or a 5,6,7,8-tetrahydroquinoline group.

In Formula 1-1, $X_{10}$, $X_{11}$, $X_{20}$ to $X_{22}$, $X_{30}$ to $X_{32}$, $X_{40}$, and $X_{41}$ may each independently be C or N.

In an embodiment, in Formula 1-1, $X_{10}$ may be N or C, $X_{20}$ and $X_{30}$ may each be C, and $X_{40}$ may be N.

In an embodiment, a bond between $M_1$ and $X_{20}$, a bond between $M_1$ and $X_{30}$, and a bond between $M_1$ and $X_{40}$ may each independently be a coordinate bond or a covalent bond.

In Formula 1, two bonds a bond between $M_1$ and $A_{10}$, a bond between $M_1$ and $A_{20}$, a bond between $M_1$ and $A_{30}$, and a bond between $M_1$ and $A_{40}$ may each be a covalent bond, and the other two bonds may each be a coordinate bond. Thus, the organometallic compound represented by Formula 1 may be electrically neutral.

In an embodiment, a bond between $M_1$ and $A_{10}$ may be a coordinate bond, a bond between $M_1$ and $A_{20}$ may be a covalent bond, a bond between $M_1$ and $A_{30}$ may be a covalent bond, and a bond between $M_1$ and $A_{40}$ may be a coordinate bond.

In Formula 1-1, $T_1$ to $T_3$ may each independently be a single bond, $*—N[(L_1)_{a1}\text{-}(R_1)_{b1}]—*'$, $*—B(R_1)—*'$, $*—P(R_1)—*'$, $*—C(R_1)(R_2)—*'$, $*—Si(R_1)(R_2)—*'$, $*—Ge(R_1)(R_2)—*'$, *—S—*', *—Se—*', *—O—*', *—C(═O)—*', *—S(═O)—*', $*—S(═O)_2—*'$, $*—C(R_1)═C(R_2)—*'$, *—C(═S)—*', or *—C≡C—*'.

In an embodiment, $T_1$ to $T_3$ may each independently be a single bond, $*—N[(L_1)_{a1}\text{-}(R_1)_{b1}]—*'$, $*—C(R_1)(R_2)—*'$, $*—Si(R_1)(R_2)—*'$, *—O—*', or *—S—*'.

In an embodiment, $T_1$ may be a single bond, $T_2$ may be *—O—*', or *—S—*', and $T_3$ may each independently be a single bond, *—O—*', *—S—*', or $*—N[(L_1)_{a1}\text{-}(R_1)_{b1}]—*'$.

In Formula 1-1, $L_1$ and $L_2$ may each independently be a single bond, a substituted or unsubstituted $C_5$-$C_{30}$ carbocyclic group, or a substituted or unsubstituted $C_1$-$C_{30}$ heterocyclic group, a1 may be an integer from 1 to 3, and when a1 is 2 or more, two or more of $L_1$ (s) may be identical to or different from each other.

In an embodiment, $L_1$ and $L_2$ may each independently be:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylene group, a pyrenylene group, a chrysenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or a combination thereof.

In Formula 1-1, $R_1$, $R_2$, $R_{10}$, $R_{20}$ to $R_{22}$, $R_{30}$, $R_{40}$, and $R_{50}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), or —P(═O)($Q_8$)($Q_9$), and two $R_1$, $R_2$, $R_{10}$, $R_{20}$ to $R_{22}$, $R_{30}$, $R_{40}$, and $R_{50}$ may optionally be bound to form a substituted or unsubstituted $C_5$-$C_{30}$ carbocyclic group or a substituted or unsubstituted $C_1$-$C_{30}$ heterocyclic group.

In Formula 1-1, b1 and b3 may each independently be an integer from 1 to 5, when b1 is 2 or more, two or more of $R_1$(s) may be identical to or different from each other, and when b3 is 2 or more, two or more of $R_3$(s) may be identical to or different from each other.

In Formula 1-1, b20, b30, and b40 may each independently be an integer from 1 to 10, when b20 is 2 or more, two or more of $R_{20}$(s) may be identical to or different from each other, when b30 is 2 or more, two or more of $R_{30}$(s) may be identical to or different from each other, and when b40 is 2 or more, two or more of $R_{40}$(s) may be identical to or different from each other.

In an embodiment, $R_1$, $R_2$, $R_{10}$, $R_{20}$ to $R_{22}$, $R_{30}$, $R_{40}$, and $R_{50}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cydopentenyl group, a cydohexenyl group, a cydoheptenyl group, a phenyl group, a naphthyl group, a pyridinyl group, a pyrimidinyl group, or a combination thereof;

a cydopentyl group, a cyclohexyl group, a cydoheptyl group, a cyclooctyl group, an adamantanyl group, a norbornanyl group, a norbornenyl group, a cydopentenyl group, a cydohexenyl group, a cydoheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoqulnolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group;

a cydopentyl group, a cyclohexyl group, a cydoheptyl group, a cyclooctyl group, an adamantanyl group, a norbornanyl group, a norbornenyl group, a cydopentenyl group, a cydohexenyl group, a cydoheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or a combination thereof; or —N($Q_1$)($Q_2$), —Si($Q_3$)($Q_4$)($Q_5$), —B($Q_6$)($Q_7$), or —P(=O)($Q_8$)($Q_9$), wherein $Q_1$ to $Q_9$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CH_3$, —$CD_2CD_3$, —$CD_2CD_2H$, or —$CD_2CDH_2$;

an n-propyl group, an isopropyl group, an n-butyl group, an iso-butyl group, a sec-butyl group, a tert-butyl group, an n-pentyl group, an iso-pentyl group, a sec-pentyl group, a tert-pentyl group, a phenyl group, or a naphthyl group; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one deuterium, a $C_1$ to $C_{10}$ alkyl group, or a phenyl group, In an embodiment, $R_1$, $R_2$, $R_{10}$, $R_{20}$ to $R_{22}$, $R_{30}$, $R_{40}$, and $R_{50}$ may each independently be hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, a group represented by one of Formulae 9-1 to 9-19, or a group represented by one of Formulae 10-1 to 10-194:

9-1

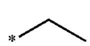

9-2

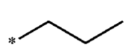

9-3

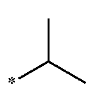

9-4

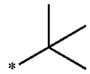

9-5

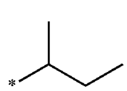

-continued 9-6

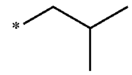

9-7

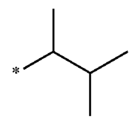

9-8

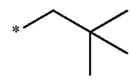

9-9

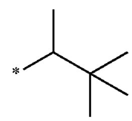

9-10

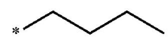

9-11

9-12

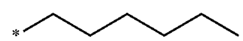

9-13

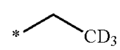

9-14

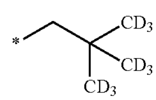

9-15

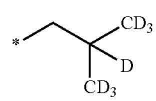

9-16

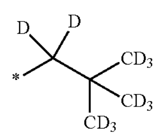

9-17

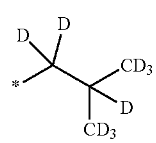

9-18

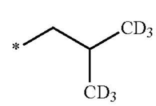

9-19

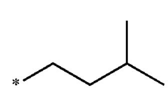

10-1

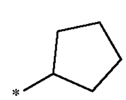

10-2

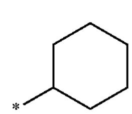

-continued
10-3
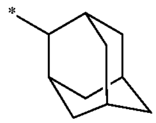
10-4
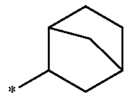
10-5
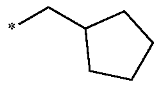
10-6
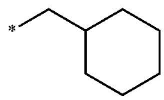
10-7
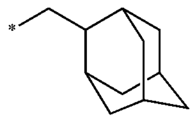
10-8
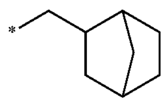
10-9
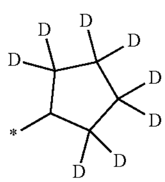
10-10
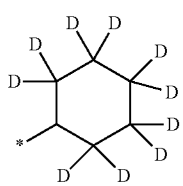
10-11
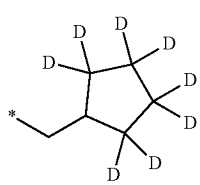
10-12
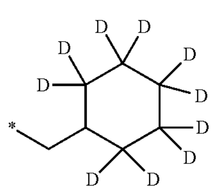
10-13
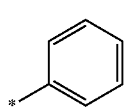
-continued
10-14
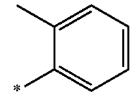
10-15
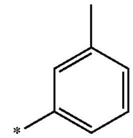
10-16
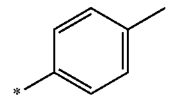
10-17
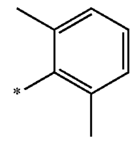
10-18
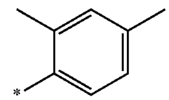
10-19
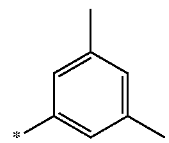
10-20
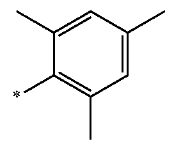
10-21
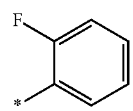
10-22
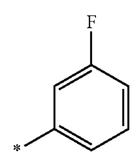
10-23
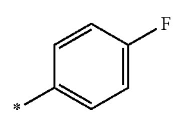
10-24
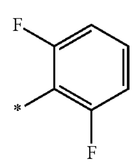
10-25
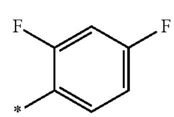

-continued
10-26
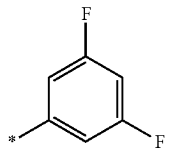
10-27
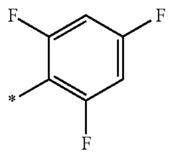
10-28
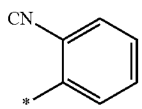
10-29
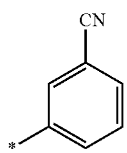
10-30
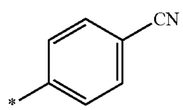
10-31
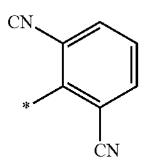
10-32
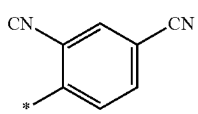
10-33
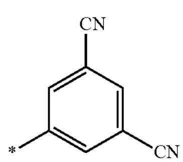
10-34
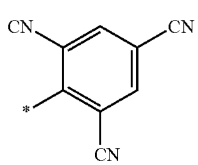
10-35
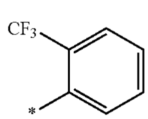
10-36
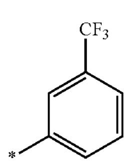
-continued
10-37
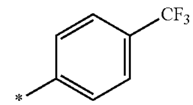
10-38
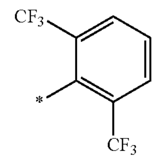
10-39
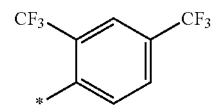
10-40
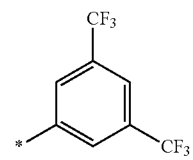
10-41
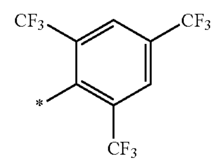
10-42
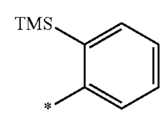
10-43
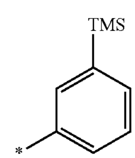
10-44
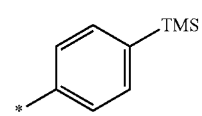
10-45
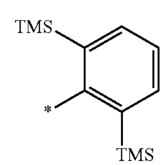
10-46
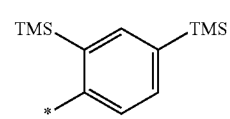
10-47
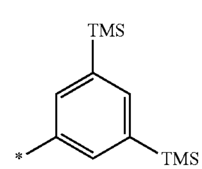

10-48
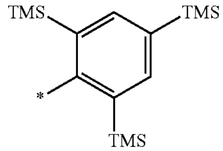
10-49
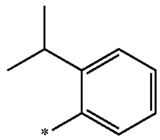
10-50
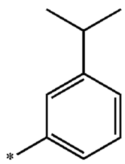
10-51
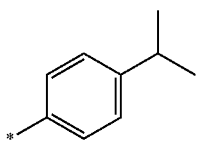
10-52
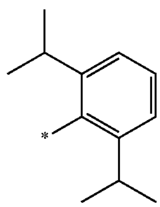
10-53
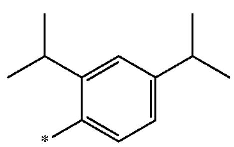
10-54
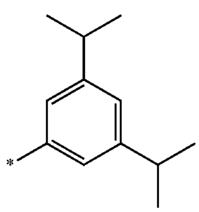
10-55
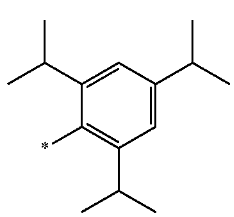
10-56
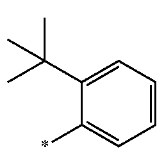
10-57
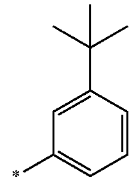
10-58
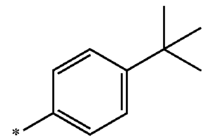
10-59
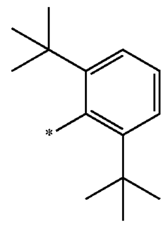
10-60
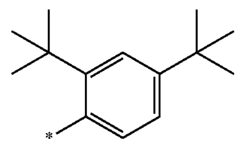
10-61
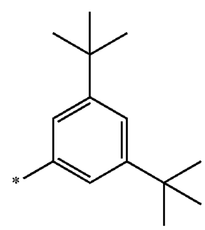
10-62
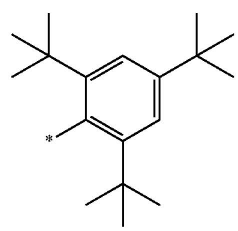
10-63
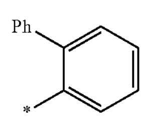
10-64
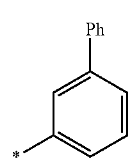
10-65
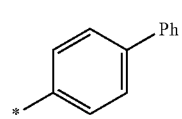

-continued
10-66
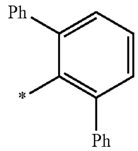
10-67
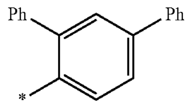
10-68
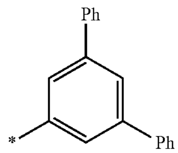
10-69
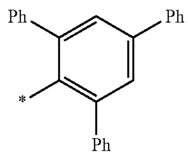
10-70
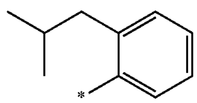
10-71
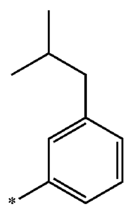
10-72
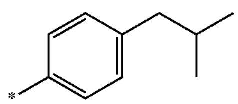
10-73
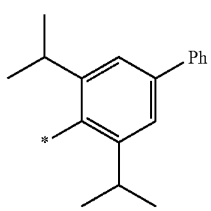
10-74
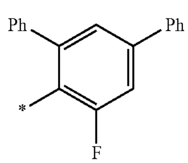
10-75
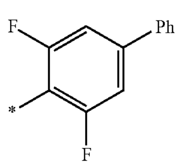
-continued
10-76
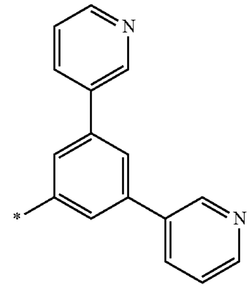
10-77
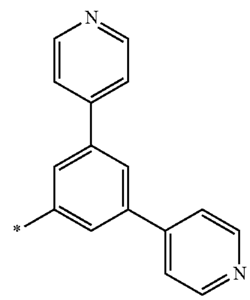
10-78
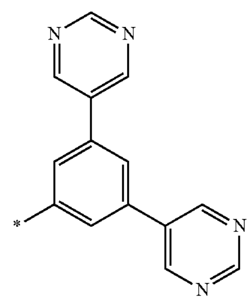
10-79
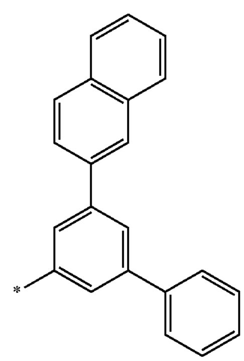
10-80
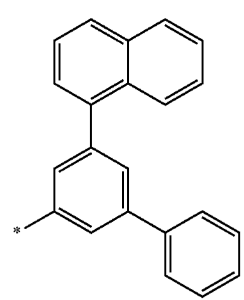

-continued
10-81
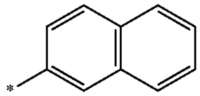
10-82
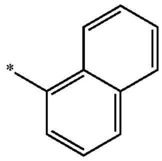
10-83
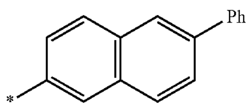
10-84
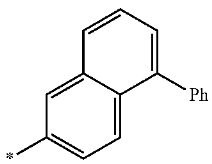
10-85
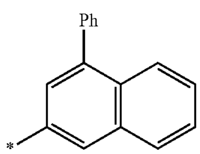
10-86
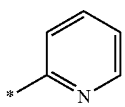
10-87
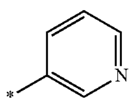
10-88
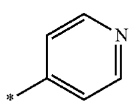
10-89
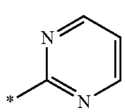
10-90
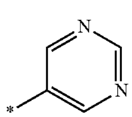
10-91
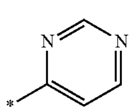
10-92
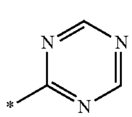
-continued
10-93
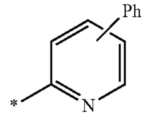
10-94
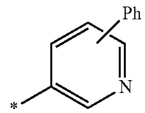
10-95
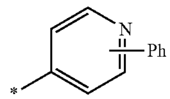
10-96
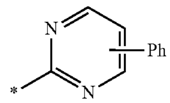
10-97
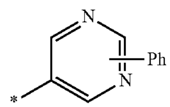
10-98
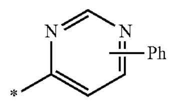
10-99
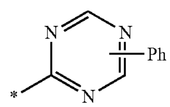
10-100
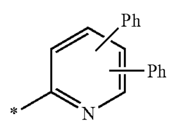
10-101
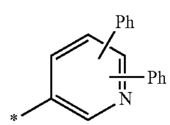
10-102
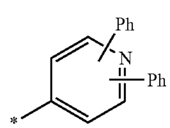
10-103
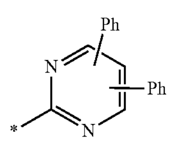
10-104
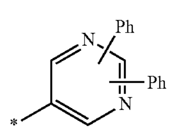
10-105
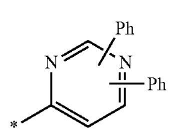

-continued
10-106
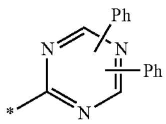
10-107
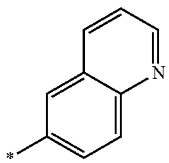
10-108
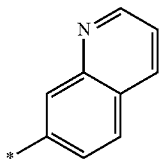
10-109
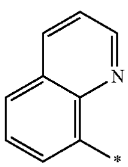
10-110
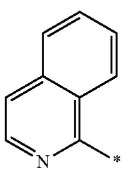
10-111
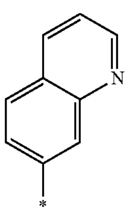
10-112
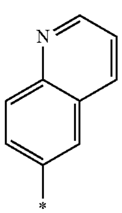
10-113
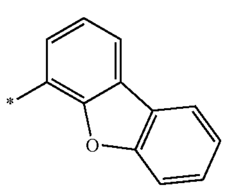
10-114
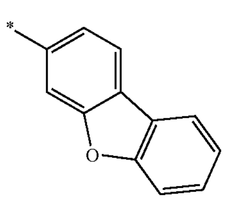
-continued
10-115
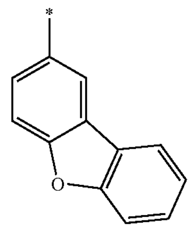
10-116
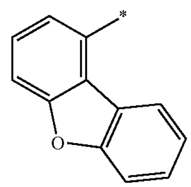
10-117
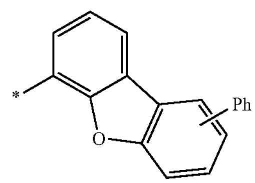
10-118
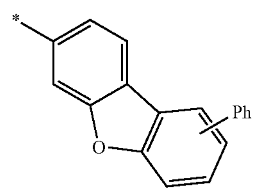
10-119
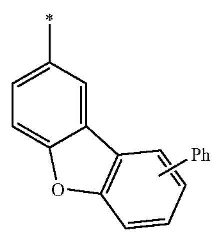
10-120
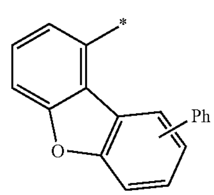
10-121
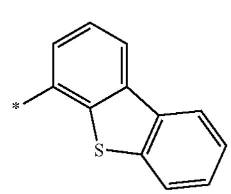
10-122
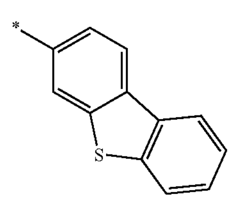

-continued
10-123
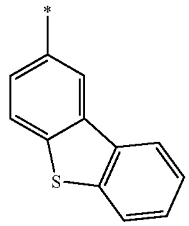
10-124
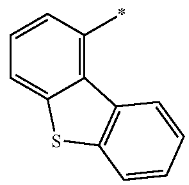
10-125
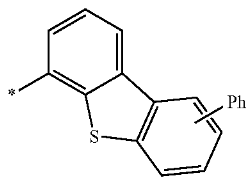
10-126
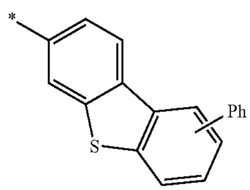
10-127
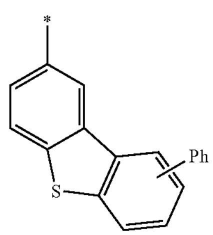
10-128
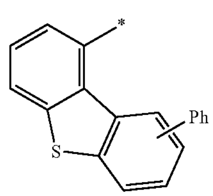
10-129
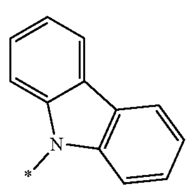
10-130
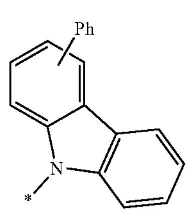
-continued
10-131
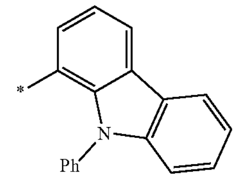
10-132
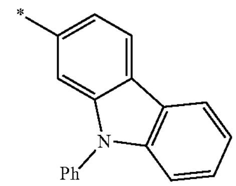
10-133
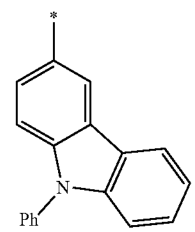
10-134
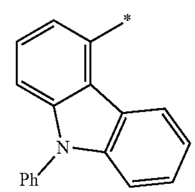
10-135
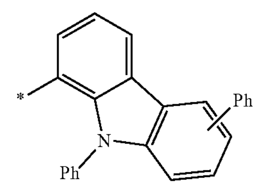
10-136
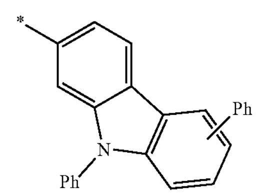
10-137
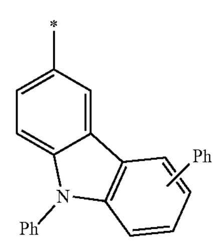
10-138
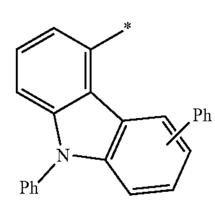

-continued
10-139
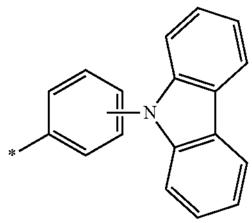
10-140
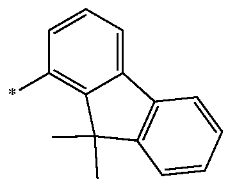
10-141
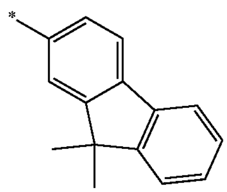
10-142
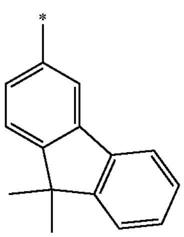
10-143
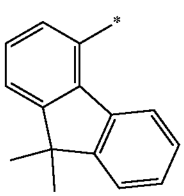
10-144
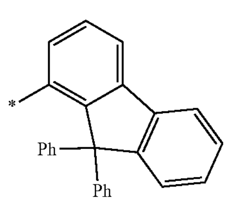
10-145
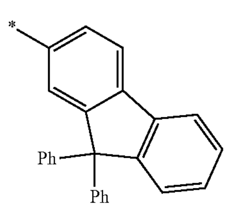
-continued
10-146
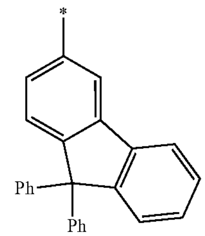
10-147
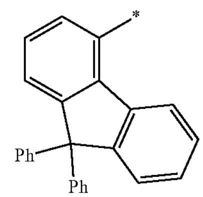
10-148
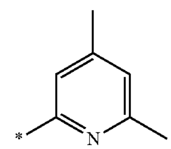
10-149
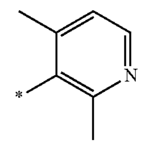
10-150
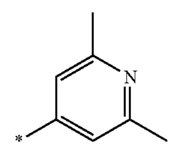
10-151
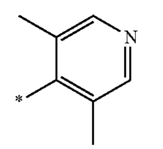
10-152
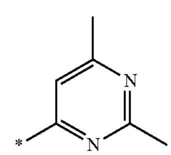
10-153
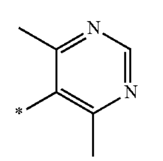
10-154
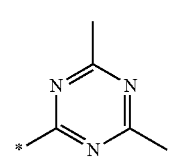
10-155
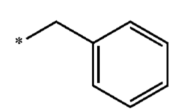

-continued
10-156
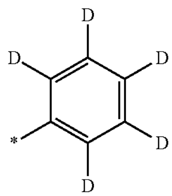
10-157
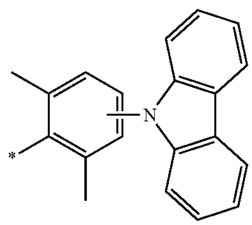
10-158
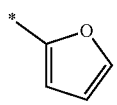
10-159
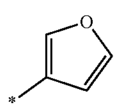
10-160
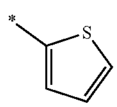
10-161
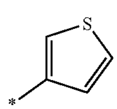
10-162
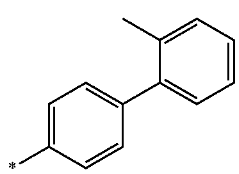
10-163
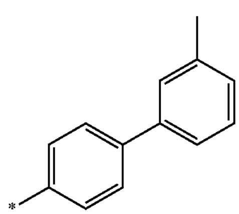
10-164
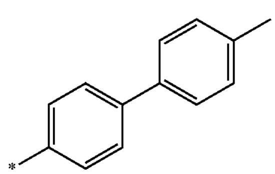
10-165
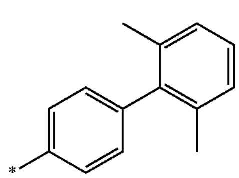
-continued
10-166
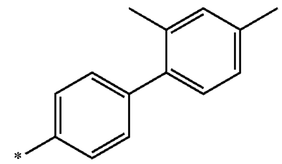
10-167
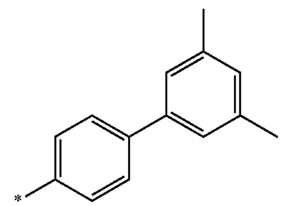
10-168
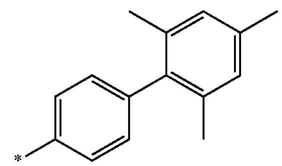
10-169
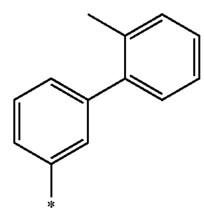
10-170
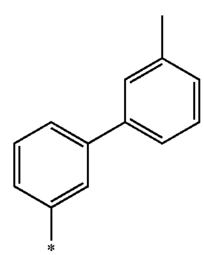
10-171
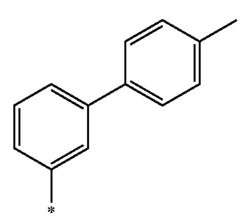
10-172
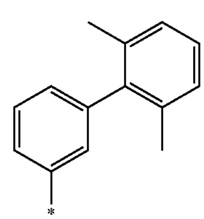

-continued
10-173
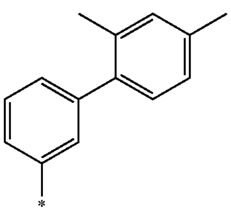
10-174
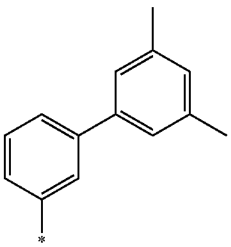
10-175
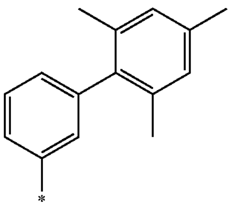
10-176
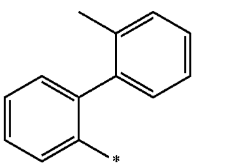
10-177
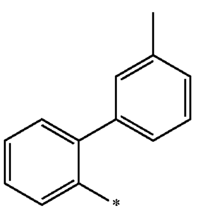
10-178
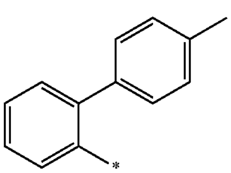
10-179
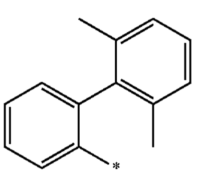
10-180
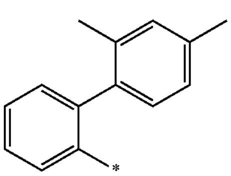
-continued
10-181
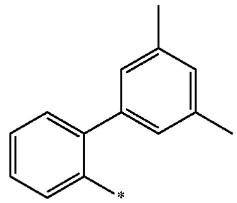
10-182
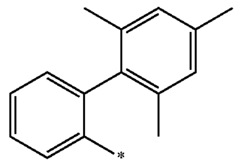
10-183
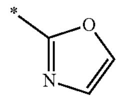
10-184
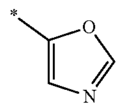
10-185
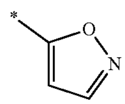
10-186
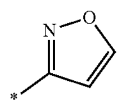
10-187
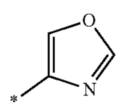
10-188
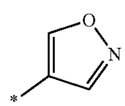
10-189
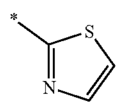
10-190
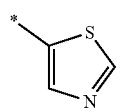
10-191
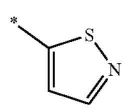
10-192
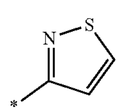
10-193
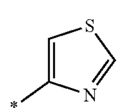

-continued 10-194

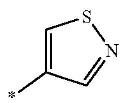

wherein, in Formulae 9-1 to 9-19 and 10-1 to 10-194, * indicates a binding site to an adjacent atom, "Ph" represents a phenyl group, and "TMS" represents a trimethylsilyl group.

In Formula 1, two $R_1$, $R_2$, $R_{10}$, $R_{20}$ to $R_{22}$, $R_{30}$, $R_{40}$ and $R_{50}$ may optionally be bound to form a substituted or unsubstituted $C_5$-$C_{30}$ carbocyclic group or a substituted or unsubstituted $C_1$-$C_{30}$ heterocyclic group.

In an embodiment, two $R_1$, $R_2$, $R_{10}$, $R_{20}$ to $R_{22}$, $R_{30}$, $R_{40}$, and $R_{50}$ may optionally be bound via a single bond, a double bond, or a first linking group to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$ (for example, a fluorene group, a xanthene group, or an acridine group unsubstituted or substituted with at least one $R_{10a}$). $R_{10a}$ may be understood by referring to the description of $R_{10}$ provided herein.

The first linking group may be *—N($R_5$)—*', *—B($R_5$)—*', *—P($R_6$)—*', *—C($R_5$)($R_6$)—*', *—Si($R_5$)($R_6$)—*', *—Ge($R_5$)($R_6$)—*', *—S—*', *—Se—*', *—O—*', *—C(=O)—*', *—S(=O)—*', *—S(=O)$_2$—*', *—C($R_5$)=*', *=C($R_5$)—*', *—C($R_5$)=C($R_6$)—*', *—C(=S)—*', or *—C≡C—*', $R_5$ and $R_6$ may each be understood by referring to the description of $R_1$ provided herein, and * and *' may each indicate a binding site to an adjacent atom.

In an embodiment, the organometallic compound represented by Formula 1 may be asymmetric.

In some embodiments, the organometallic compound represented by Formula 1 may be represented by any one of Formulae 11-1 to 11-4:

Formula 11-1

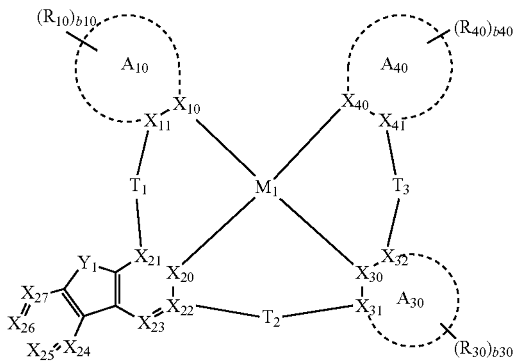

-continued

Formula 11-2

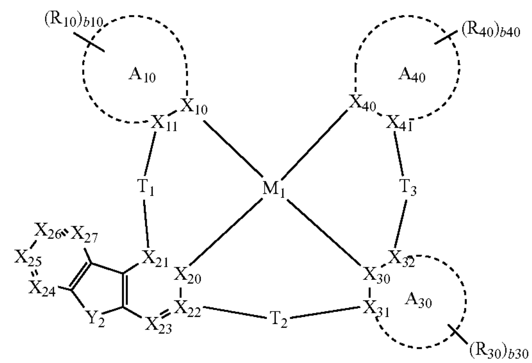

Formula 11-3

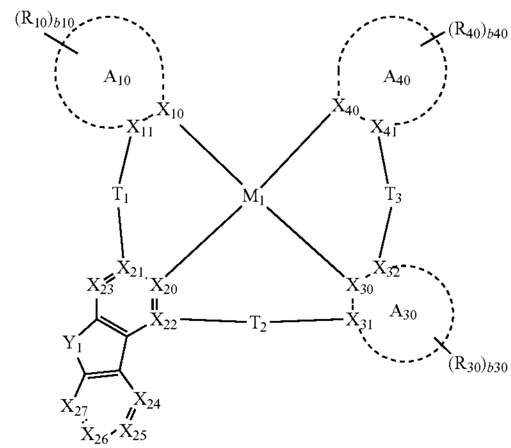

Formula 11-4

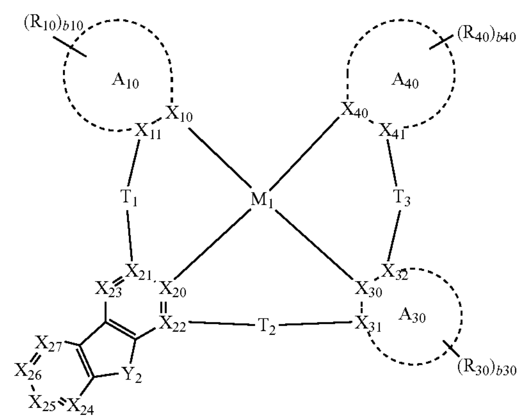

wherein, in Formulae 11-1 to 11-4, $M_1$, $A_{10}$, $A_{30}$, $A_{40}$, $Y_1$, $Y_2$, $X_{10}$, $X_{11}$, $X_{20}$ to $X_{22}$, $X_{30}$ to $X_{32}$, $X_{40}$, $X_{41}$, $T_1$ to $T_3$, $R_{10}$, $R_{30}$, $R_{40}$, b10, b30, and b40 may respectively be understood by referring to the descriptions of $M_1$, $A_{10}$, $A_{30}$, $A_{40}$, $Y_1$, $Y_2$, $X_{10}$, $X_{11}$, $X_{20}$ to $X_{22}$, $X_{30}$ to $X_{32}$, $X_{40}$, $X_{41}$, $T_1$ to $T_3$, $R_{10}$, $R_{30}$, $R_{40}$, b10, b30, and b40 provided herein, $X_{23}$ may be N or C($R_{23}$), $X_{24}$ may be N or C($R_{24}$), $X_{25}$ may be N or C($R_{25}$), $X_{26}$ may be N or C($R_{26}$), and $X_{27}$ may be N or C($R_{27}$), and $R_{23}$ to $R_{27}$ may each independently be understood by referring to the description of $R_{20}$ provided herein.

In some embodiments, the organometallic compound represented by Formula 1 may be represented by any one of Formulae 12-1 to 12-16:

-continued
12-1
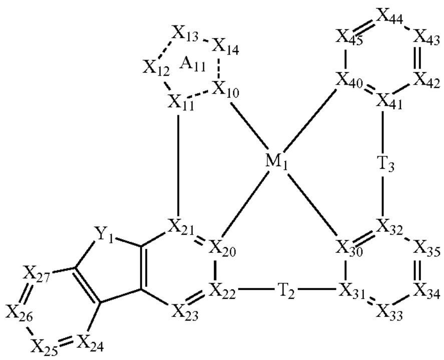
12-2
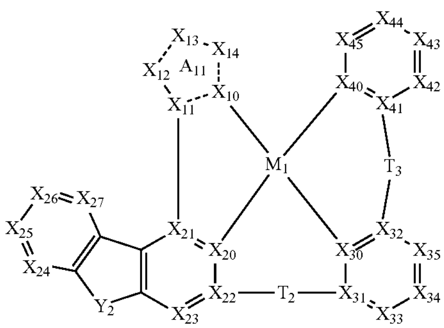
12-3
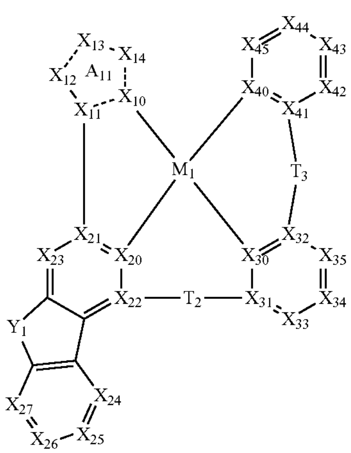
12-4
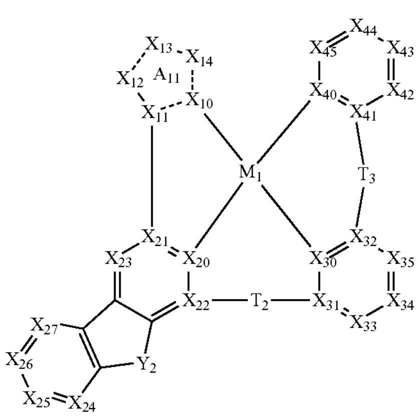
12-5
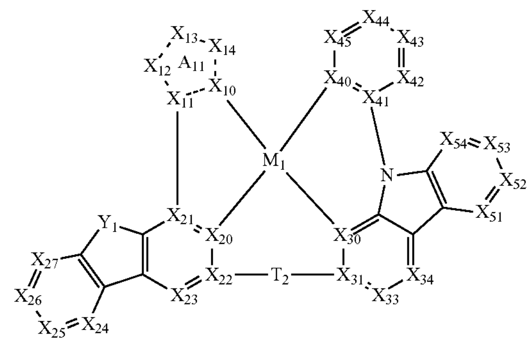
12-6
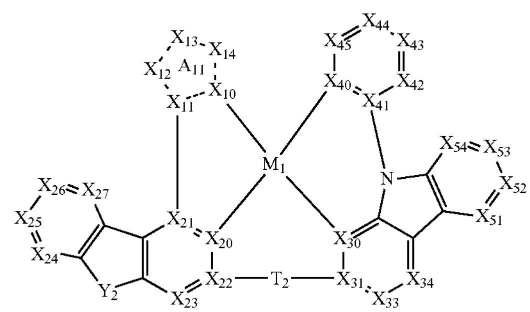
12-7
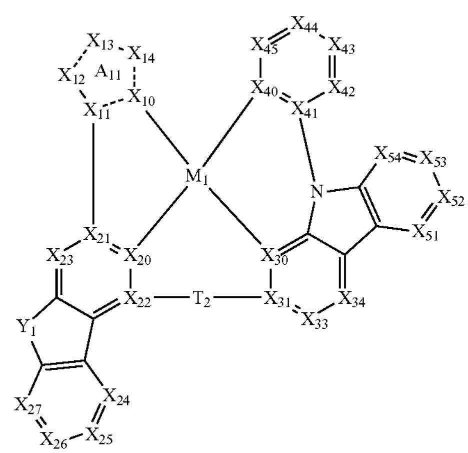
12-8
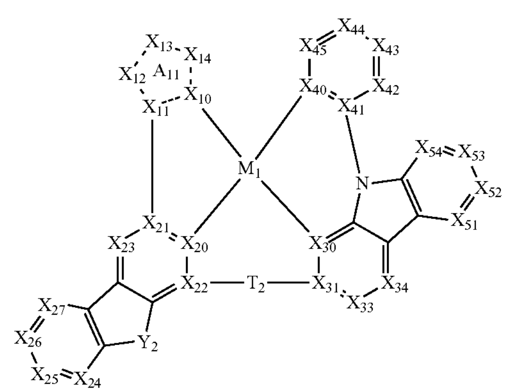

-continued
12-9
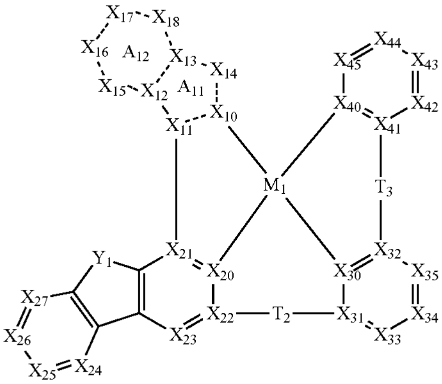
12-10
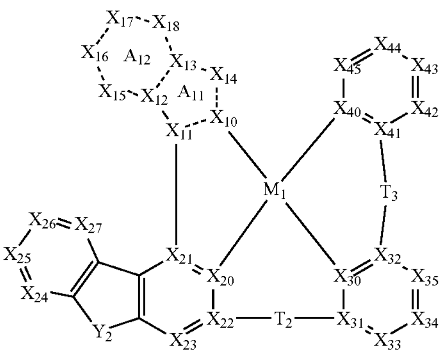
12-11
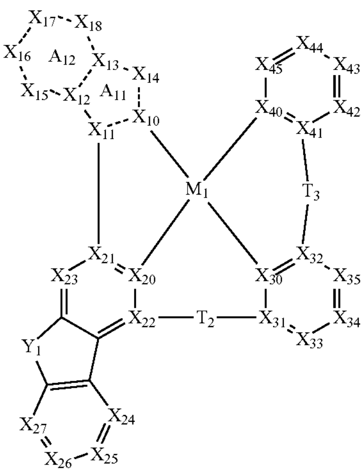
12-12
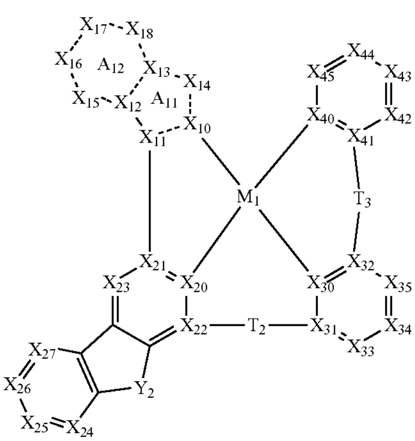
-continued
12-13
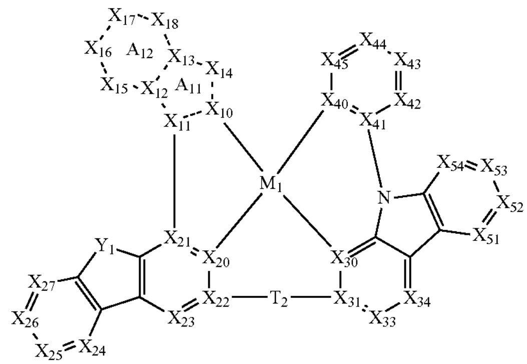
12-14
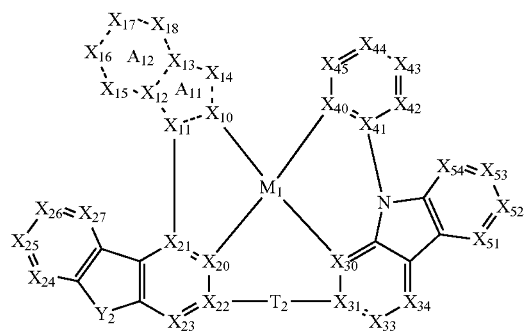
12-15
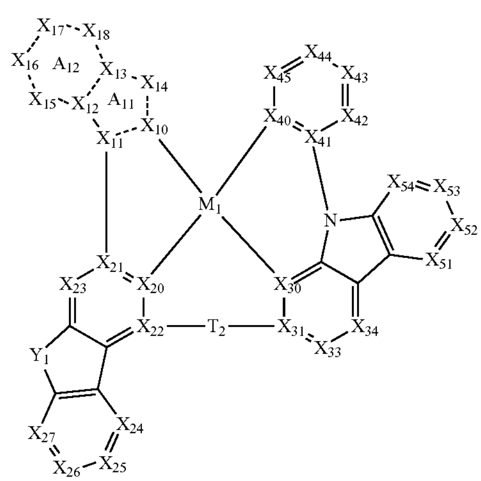

-continued 12-16

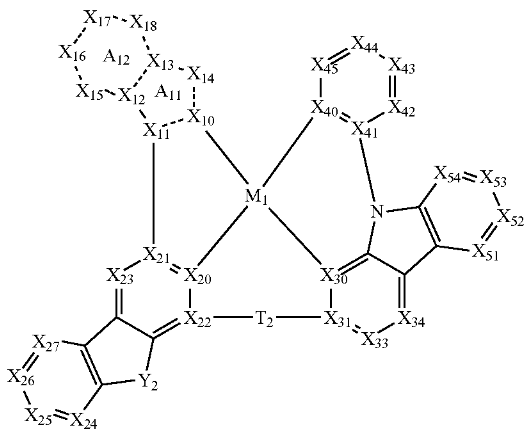

wherein, in Formulae 12-1 to 12-16, $M_1$, $X_{10}$, $X_{11}$, $X_{20}$ to $X_{22}$, $X_{30}$, $X_{31}$, $X_{40}$, and $X_{41}$ may respectively be understood by referring to the descriptions of $M_1$, $X_{10}$, $X_{11}$, $X_{20}$ to $X_{22}$, $X_{30}$, $X_{31}$, $X_{40}$, and $X_{41}$ provided herein, $A_{11}$ may be a 5-membered heterocyclic group, $A_{12}$ may be a 6-membered carbocyclic group or a 6-membered heterocyclic group, $T_2$ may be *—O—*' or *—S—*', $T_3$ may be a single bond, *—O—*', or *—S—*', $X_{12}$ may be N or $C(R_{12})$, $X_{13}$ may be N or $C(R_{13})$, $X_{14}$ may be N or $C(R_{14})$, $X_{15}$ may be N or $C(R_{15})$, $X_{16}$ may be N or $C(R_{16})$, $X_{17}$ may be N or $C(R_{17})$, and $X_{18}$ may be N or $C(R_{18})$, $X_{23}$ may be N or $C(R_{23})$, $X_{24}$ may be N or $C(R_{24})$, $X_{25}$ may be N or $C(R_{25})$, $X_{26}$ may be N or $C(R_{26})$, and $X_{27}$ may be N or $C(R_{27})$, $X_{33}$ may be N or $C(R_{33})$, $X_{34}$ may be N or $C(R_{34})$, and $X_{35}$ may be N or $C(R_{35})$, $X_{42}$ may be N or $C(R_{42})$, $X_{43}$ may be N or $C(R_{43})$, $X_{44}$ may be N or $C(R_{44})$, and $X_{45}$ may be N or $C(R_{45})$, $X_{51}$ may be N or $C(R_{51})$, $X_{52}$ may be N or $C(R_{52})$, $X_{53}$ may be N or $C(R_{53})$, and $X_{54}$ may be N or $C(R_{54})$, $R_{12}$ to $R_{18}$ may each independently be understood by referring to the description of $R_{10}$ provided herein, $R_{23}$ to $R_{27}$ may each independently be understood by referring to the description of $R_{20}$ provided herein, $R_{33}$ to $R_{35}$ may each independently be understood by referring to the description of $R_{30}$ provided herein, $R_{42}$ to $R_{45}$ may each independently be understood by referring to the description of $R_{40}$ provided herein, and $R_{51}$ to $R_{54}$ may each independently be understood by referring to the description of $R_{30}$ provided herein.

$L_2$ in Formula 1 may be a monodentate ligand or a bidentate ligand.

For example, $L_{12}$ in Formula 1 may be a ligand represented by one of Formulae 7-1 to 7-11, but embodiments are not limited thereto:

7-1

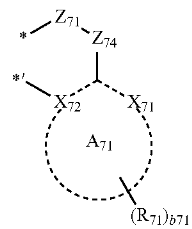

7-2

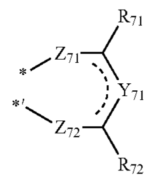

7-3

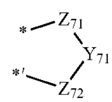

7-4

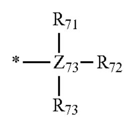

7-5

$$*-X_{71}\equiv X_{72}-R_{71}$$

7-6

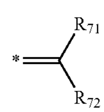

7-7

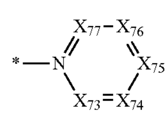

7-8

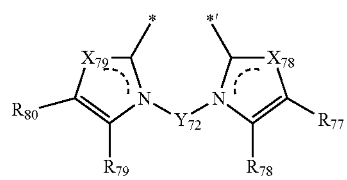

7-9

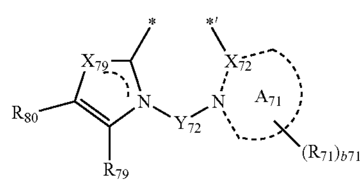

7-10

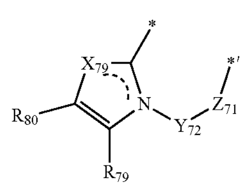

-continued 7-11

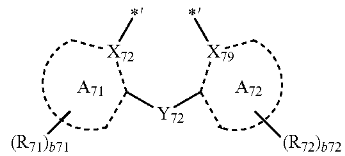

wherein, in Formulae 7-1 to 7-11, $A_{71}$ and $A_{72}$ may each independently be a $C_5$-$C_{20}$ carbocyclic group or a $C_1$-$C_{20}$ heterocyclic group, $X_{71}$ and $X_{72}$ may each independently be C or N, $X_{73}$ may be N or C($Q_{73}$), $X_{74}$ may be N or C($Q_{74}$), $X_{75}$ may be N or C($Q_{75}$), $X_{76}$ may be N or C($Q_{76}$), $X_{77}$ may be N or C($Q_{77}$), $X_{78}$ may be O, S, or N($Q_{78}$), $X_{79}$ may be O, S, or N($Q_{79}$), $Y_{71}$ and $Y_{72}$ may each independently be a single bond, a double bond, a substituted or unsubstituted $C_1$-$C_5$ alkylene group, a substituted or unsubstituted $C_2$-$C_5$ alkenylene group, or a substituted or unsubstituted $C_6$-$C_{10}$ arylene group, $Z_{71}$ and $Z_{72}$ may each independently be N, O, N($R_{74}$), P($R_{75}$)($R_{76}$), or As($R_{75}$)($R_{76}$), $Z_{73}$ may be P or As, $Z_{74}$ may be CO or $CH_2$, $R_{71}$ to $R_{80}$ and $Q_{73}$ to $Q_{79}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, wherein $R_{71}$ and $R_{72}$ may optionally be bound to form a ring, $R_{77}$ and $R_{78}$ may optionally be bound to form a ring, $R_{78}$ and $R_{79}$ may optionally be bound to form a ring, $R_{79}$ and $R_{80}$ may optionally be bound to form a ring, b71 and b72 may each independently be 1, 2, or 3, and and *' may each independently indicate a binding site to an adjacent atom.

In some embodiments, in Formula 7-1, $A_{71}$ and $A_{72}$ may each independently be a benzene group, a naphthalene group, an imidazole group, a benzimidazole group, a pyridine group, a pyrimidine group, a triazine group, a quinoline group, or an isoquinoline group, but embodiments of the present disclosure are not limited thereto.

In some embodiments, in Formula 7-1, $X_{72}$ and $X_{79}$ may each be N, but embodiments of the present disclosure are not limited thereto.

In some embodiments, in Formula 7-7, $X_{73}$ may be O($Q_{73}$), $X_{74}$ may be O($Q_{74}$), $X_{75}$ may be C($Q_{76}$), $X_{76}$ may be C($Q_{76}$), and $X_{77}$ may be C($Q_{77}$), but embodiments of the present disclosure are not limited thereto.

In some embodiments, in Formula 7-8, $X_{78}$ may be N($Q_{78}$) or $X_{79}$ may be N($Q_{79}$), but embodiments of the present disclosure are not limited thereto.

In some embodiments, in Formulae 7-2, 7-3, and 7-8, $Y_{71}$ and $Y_{72}$ may each independently be a substituted or unsubstituted methylene group or a substituted or unsubstituted phenylene group, but embodiments of the present disclosure are not limited thereto.

In some embodiments, in Formulae 7-1 and 7-2, $Z_{71}$ and $Z_{72}$ may each be O, but embodiments of the present disclosure are not limited thereto.

In some embodiments, in Formula 7-4, $Z_{73}$ may be P, but embodiments of the present disclosure are not limited thereto.

In some embodiments, in Formulae 7-1 to 7-11, $R_{71}$ to $R_{80}$ and $Q_{73}$ to $Q_{79}$ may each independently be: hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkyl-substituted phenyl group, a naphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkyl-substituted phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, or an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkyl-substituted phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, or an imidazopyrimidinyl group, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkyl-substituted phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, —Si($Q_{11}$)($Q_{12}$)($Q_{13}$), —B($Q_{11}$)($Q_{12}$), —N($Q_{11}$)($Q_{12}$), or a combination thereof; or —Si($Q_1$)($Q_2$)($Q_3$), —B($Q_1$)($Q_2$), or —N($Q_1$)($Q_2$), wherein $Q_1$ to $Q_3$ and $Q_{11}$ to $Q_{13}$ may each independently be:

a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, a phenyl group, a biphenyl group, a $C_1$-$C_{20}$ alkylphenyl group, or a naphthyl group; or a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, a phenyl group, or a naphthyl group, each substituted with at least one deuterium, a phenyl group, or a combination thereof, but embodiments of the present disclosure are not limited thereto.

In some embodiments, in Formula 1, $L_{12}$ may be a ligand represented by any one of Formulae 5-1 to 5-116 and 8-1 to 8-23, but embodiments are not limited thereto:

8-1

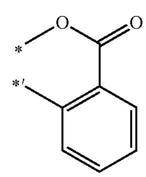

8-2

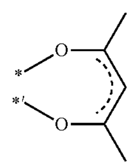

8-3

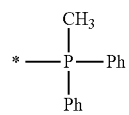

8-4

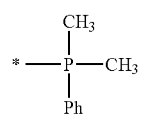

8-5

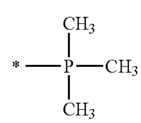

8-6

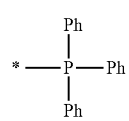

8-7

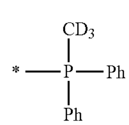

8-8

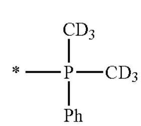

-continued
8-9
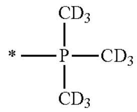
8-10
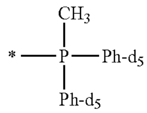
8-11
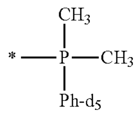
8-12
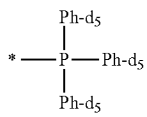
8-13
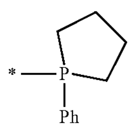
8-14
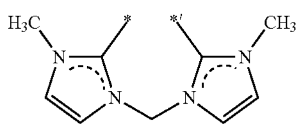
8-15
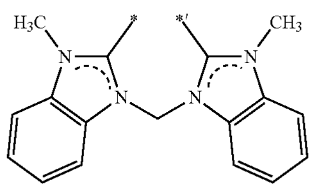
8-16
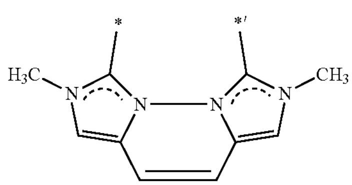
8-17
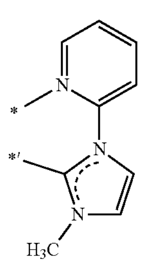
-continued
8-18
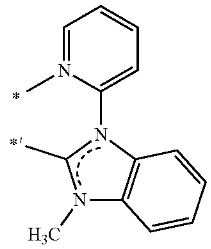
8-19
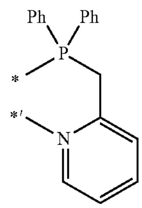
8-20
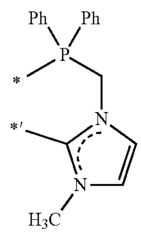
8-21
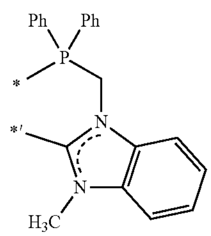
8-22
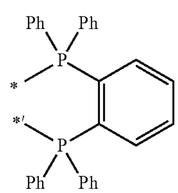
8-23
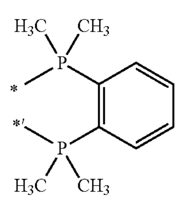
5-1
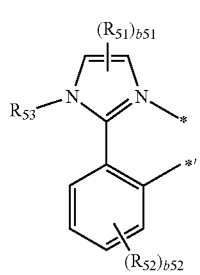

-continued
5-2
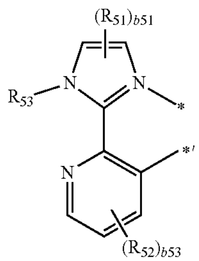
5-3
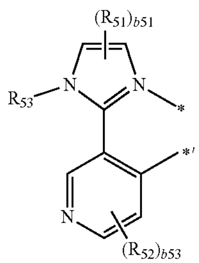
5-4
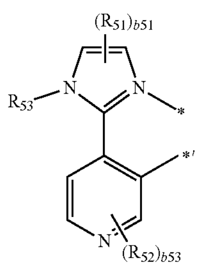
5-5
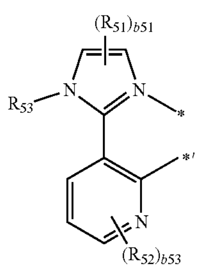
5-6
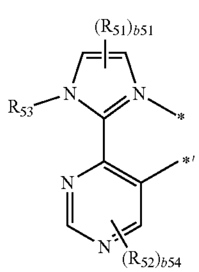
5-7
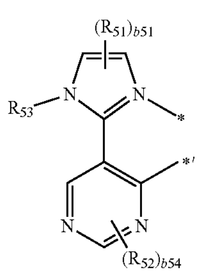
-continued
5-8
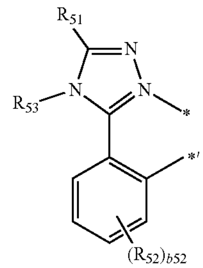
5-9
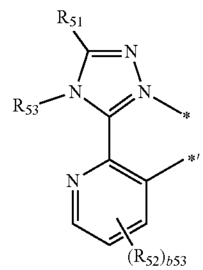
5-10
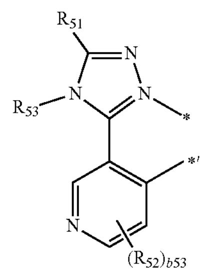
5-11
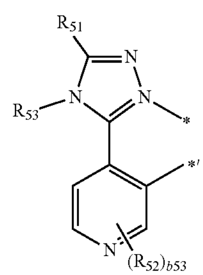
5-12
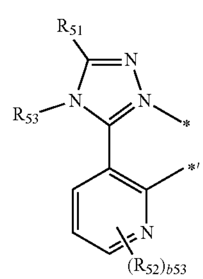
5-13
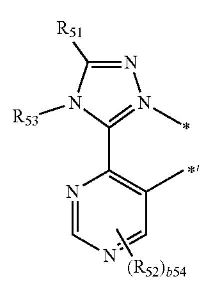

5-14
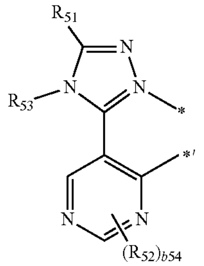
5-15
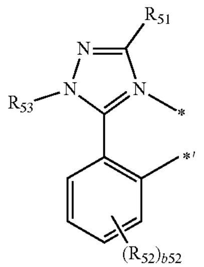
5-16
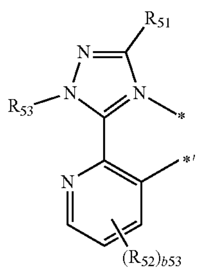
5-17
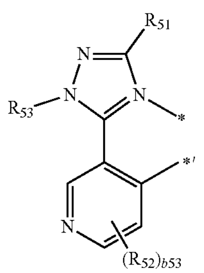
5-18
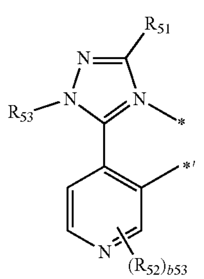
5-19
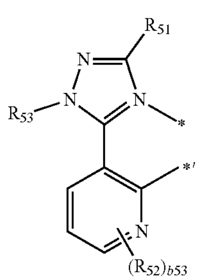
5-20
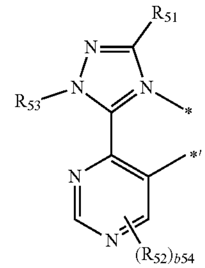
5-21
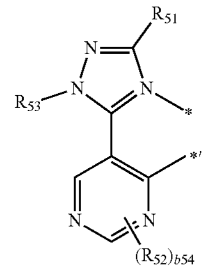
5-22
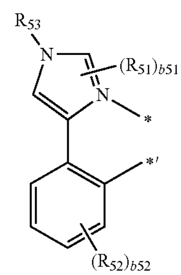
5-23
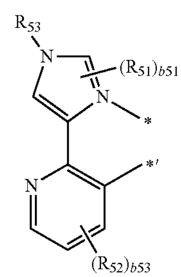
5-24
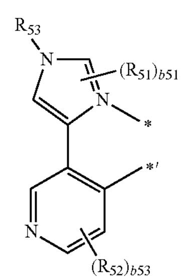
5-25
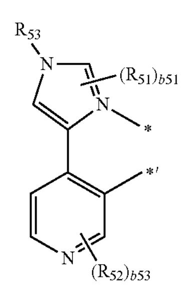

-continued
5-26
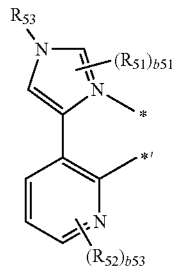
5-27
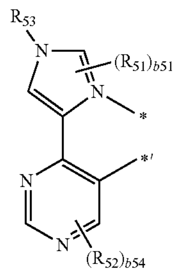
5-28
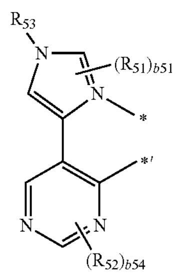
5-29
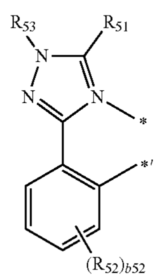
5-30
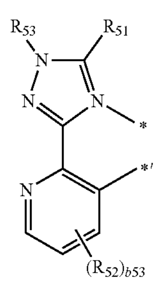
5-31
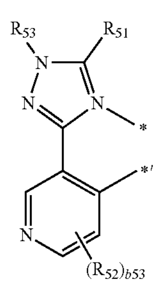
-continued
5-32
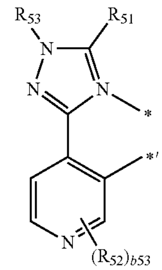
5-33
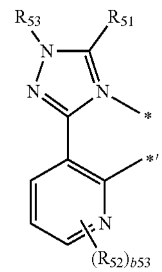
5-34
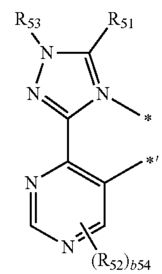
5-35
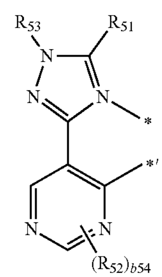
5-36
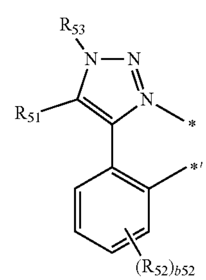
5-37
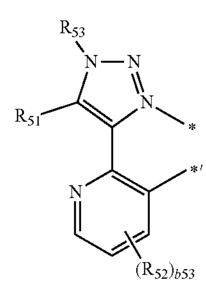

-continued
5-38
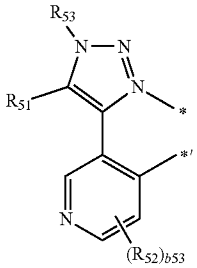
5-39
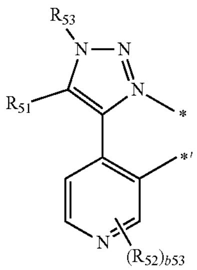
5-40
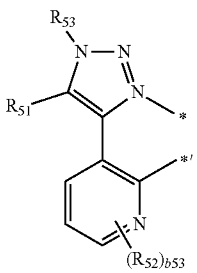
5-41
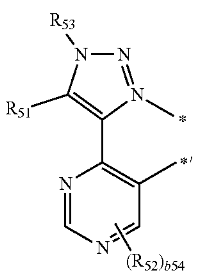
5-42
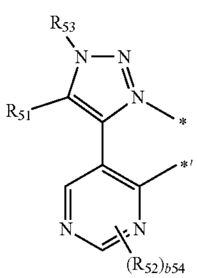
5-43
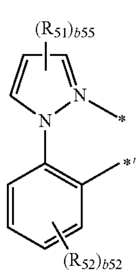
-continued
5-44
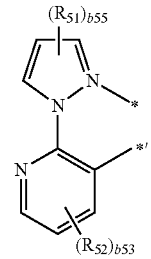
5-45
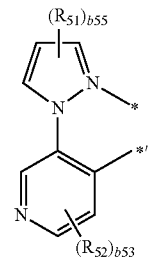
5-46
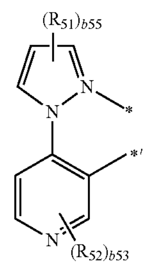
5-47
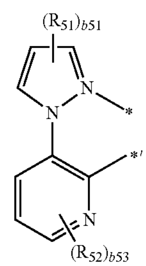
5-48
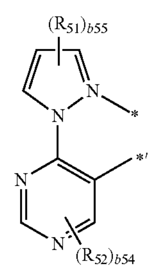
5-49
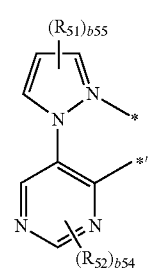

5-50
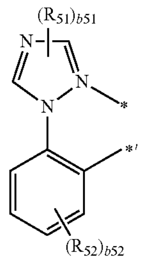
5-51
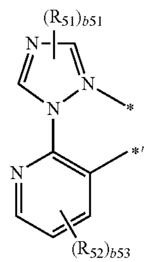
5-52
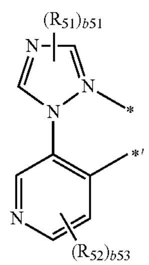
5-53
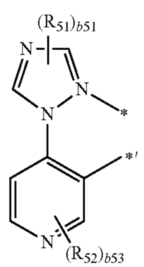
5-54
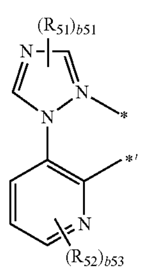
5-55
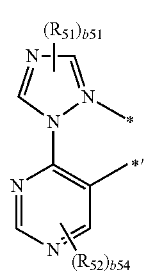
5-56
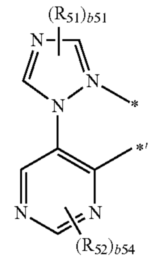
5-57
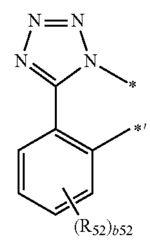
5-58
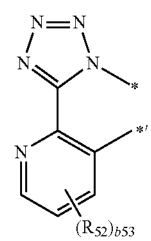
5-59
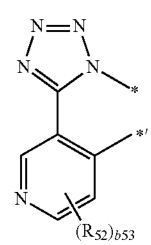
5-60
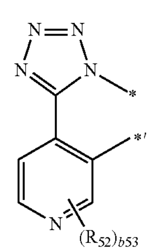
5-61
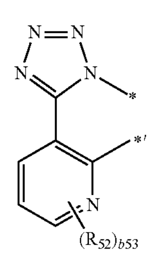

-continued
5-62
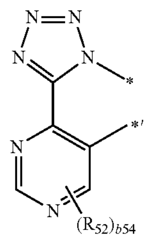
5-63
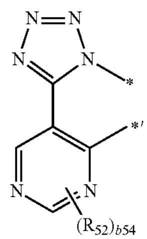
5-64
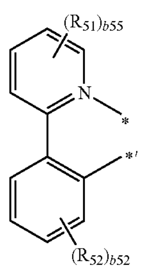
5-65
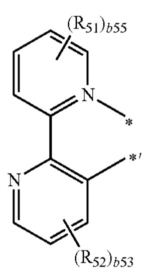
5-66
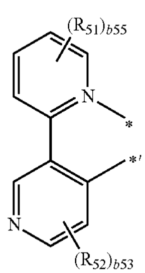
5-67
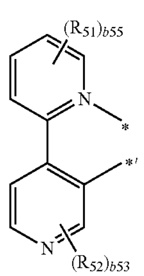
-continued
5-68
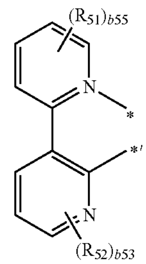
5-69
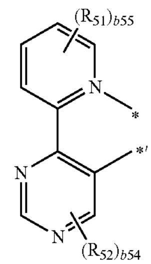
5-70
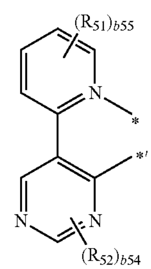
5-71
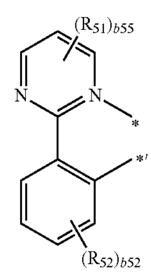
5-72
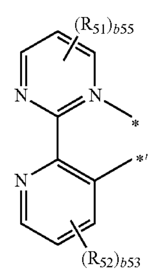
5-73
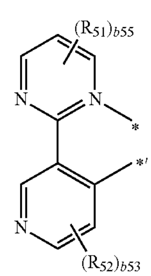

-continued
5-74
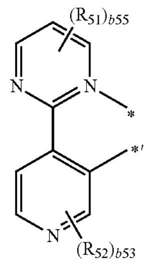
5-75
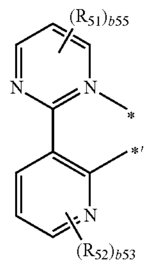
5-76
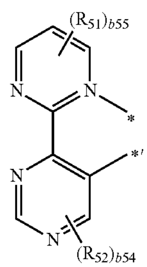
5-77
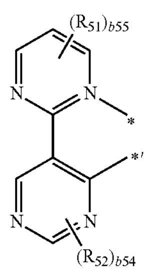
5-78
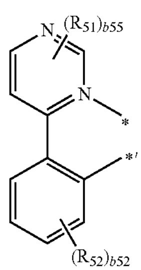
5-79
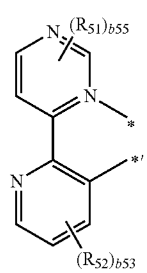
-continued
5-80
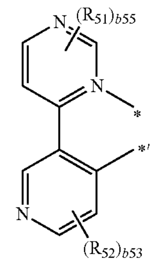
5-81
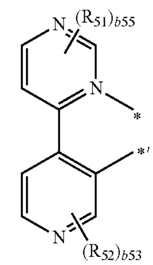
5-82
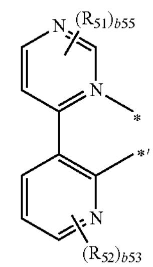
5-83
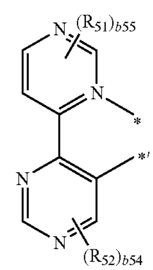
5-84
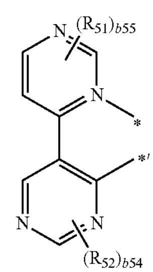
5-85
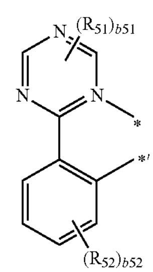

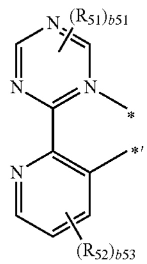
5-86
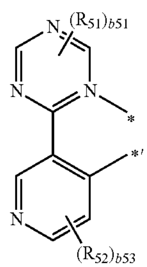
5-87
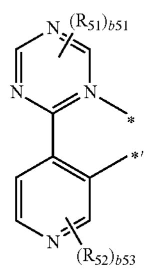
5-88
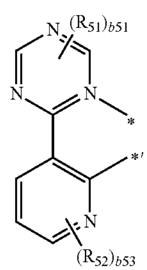
5-89
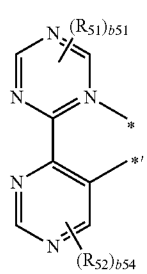
5-90
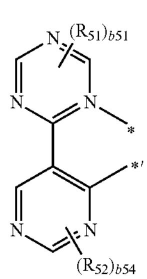
5-91
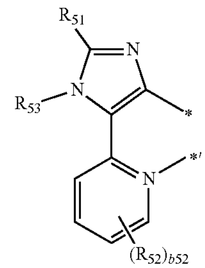
5-92
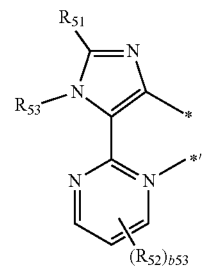
5-93
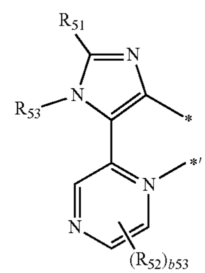
5-94
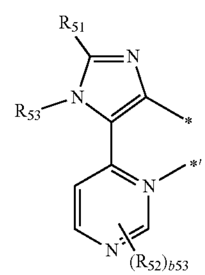
5-95
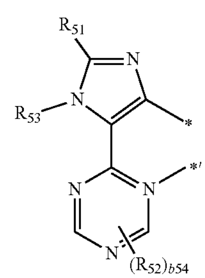
5-96
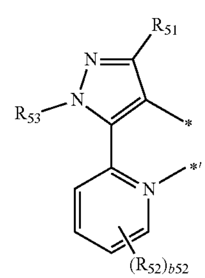
5-97

-continued
5-98
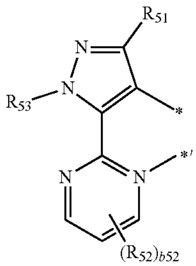
5-99
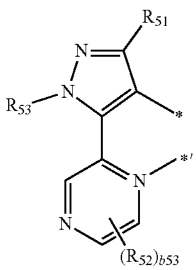
5-100
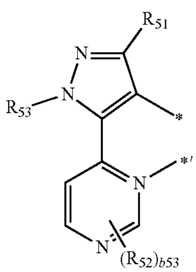
5-101
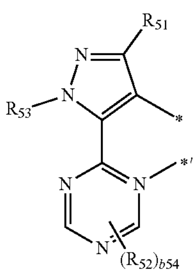
5-102
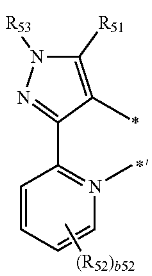
5-103
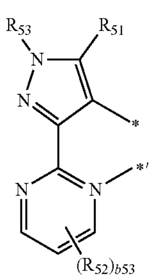
-continued
5-104
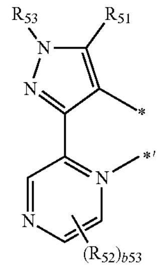
5-105
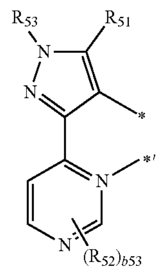
5-106
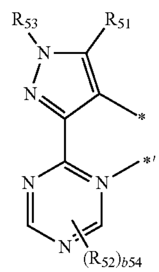
5-107
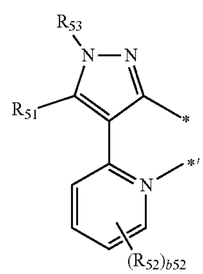
5-108
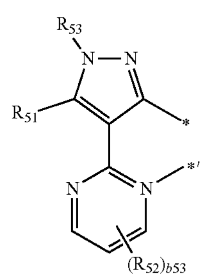
5-109
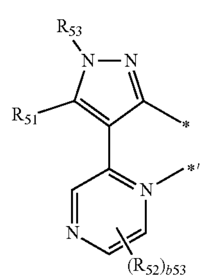

-continued 5-110

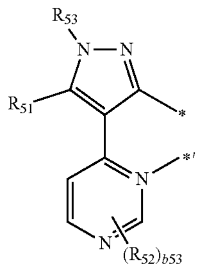

5-111

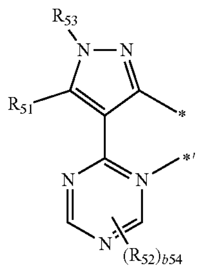

5-112

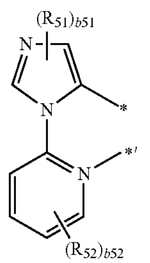

5-113

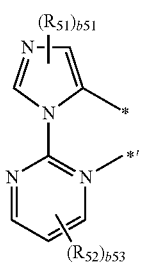

5-114

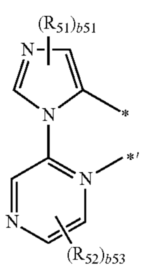

5-115

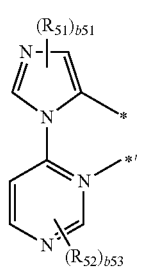

-continued 5-116

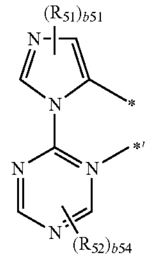

wherein, in Formulae 5-1 to 5-116 and 8-1 to 8-23, $R_{51}$ to $R_{53}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $—SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkyl-substituted phenyl group, a naphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkyl-substituted phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, or an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkyl-substituted phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, or an imidazopyrimidinyl group, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkyl-substituted phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, —$Si(Q_{11})(Q_{12})(Q_{13})$, —$B(Q_{11})(Q_{12})$, —$N(Q_{11})(Q_{12})$, or a combination thereof; or —$Si(Q_1)(Q_2)(Q_3)$, —$B(Q_1)(Q_2)$, or —$N(Q_1)(Q_2)$, wherein $Q_1$ to $Q_3$ and $Q_{11}$ to $Q_{13}$ may each independently be:

a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, a phenyl group, a biphenyl group, a $C_1$-$C_{20}$ alkylphenyl group, or a naphthyl group; or a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, a phenyl group, or a naphthyl group, each substituted with at least one deuterium or a phenyl group, b51 and b54 may each independently be 1 or 2, b53 and b55 may each independently be 1, 2, or 3, b52 may be 1, 2, 3, or 4, "Ph" represents a phenyl group, "Ph-d5" represents a phenyl group in which all hydrogen atoms are substituted with deuterium atoms, and and *' each indicate a binding site to an adjacent atom.

In Formula 1, n11 may be 1, and n12 may be 0, 1, or 2.

In some embodiments, in Formula 1, $M_1$ may be Pt, n11 may be 1, and n12 may be 0, but embodiments of the present disclosure are not limited thereto.

In an embodiment, the organometallic compound may be Compounds 1 to 35:

1

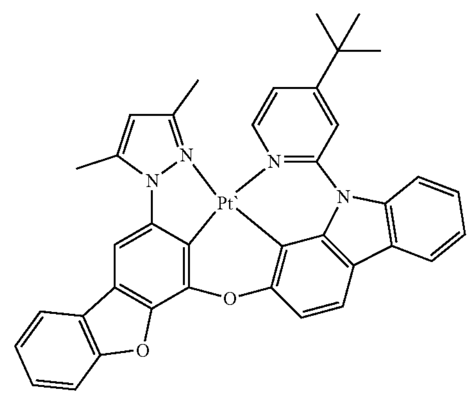

2

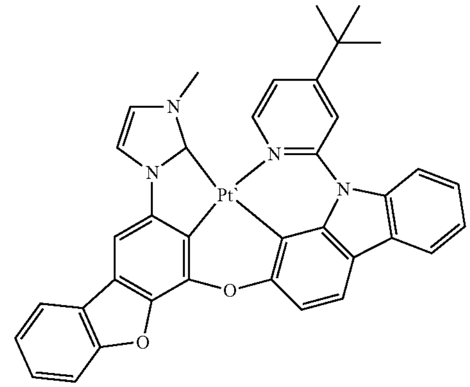

-continued
3
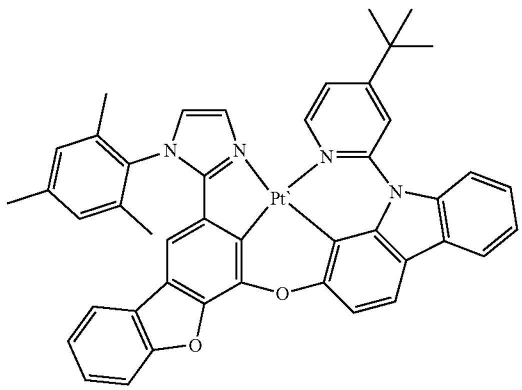
4
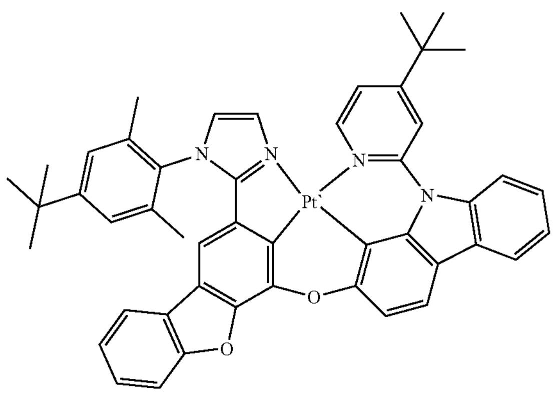
5
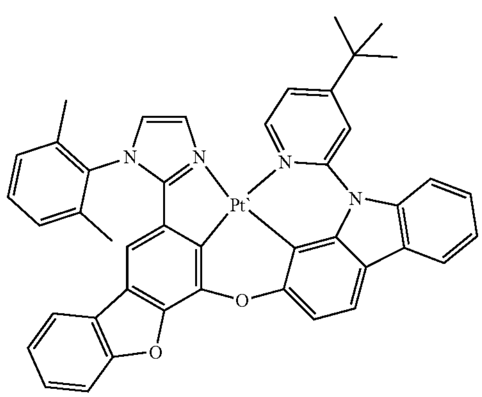
6
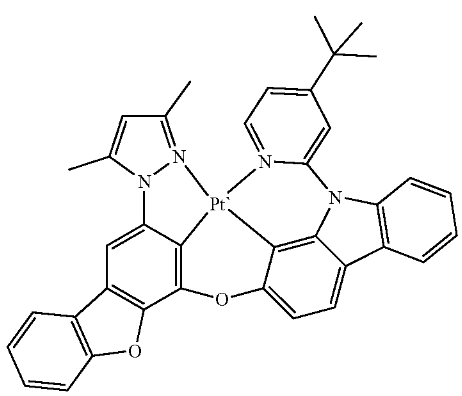
-continued
7
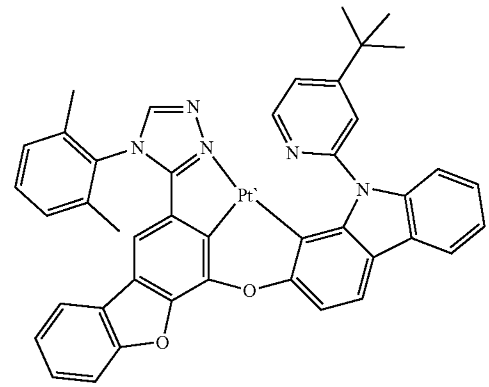
8
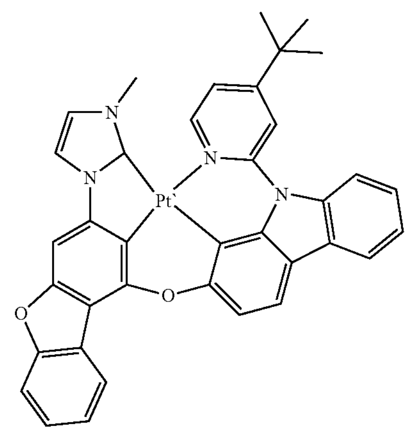
9
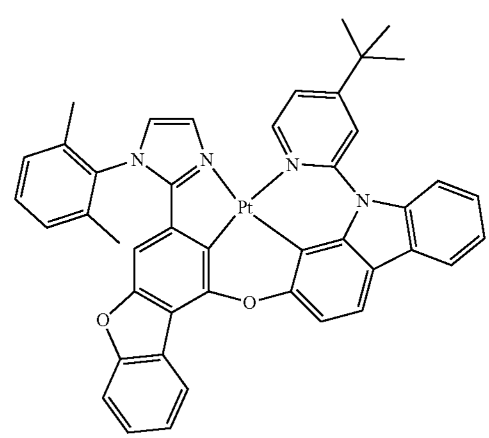

-continued
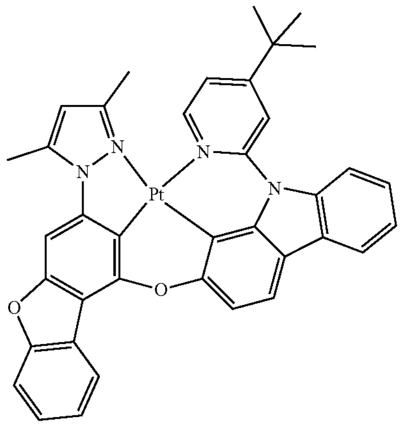
10
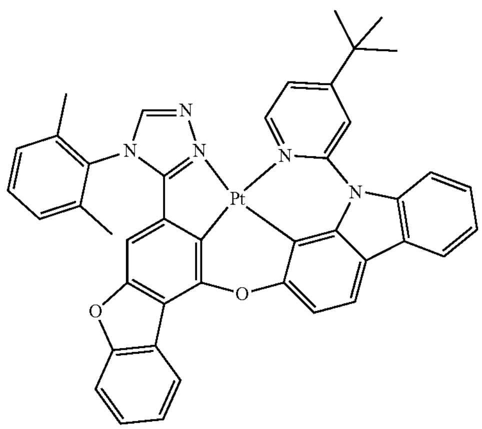
11
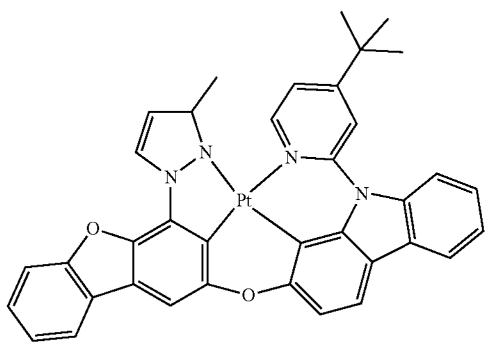
12
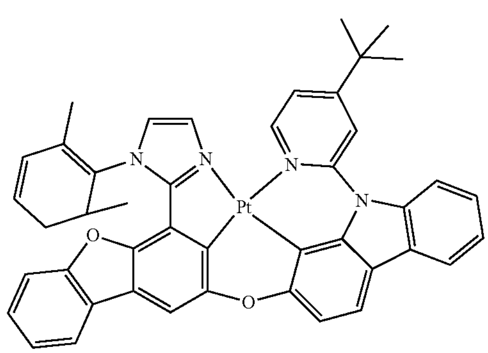
13
-continued
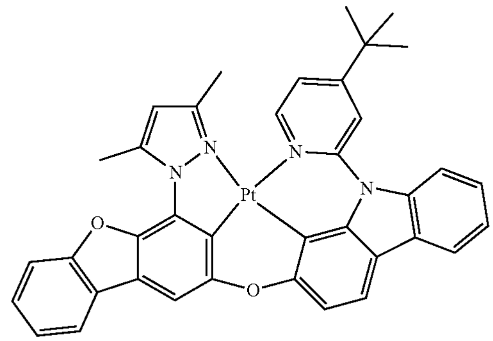
14
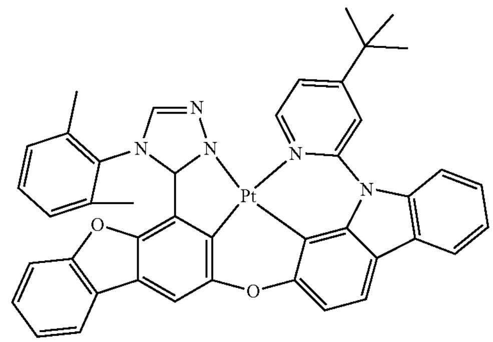
15
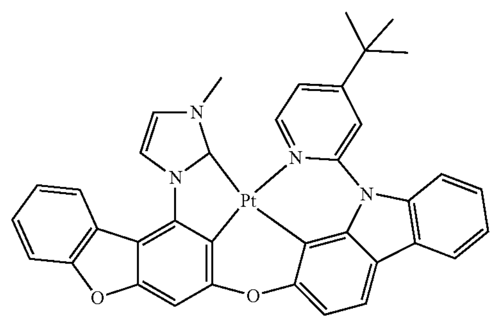
16
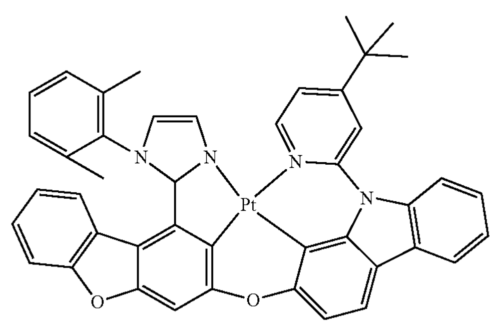
17
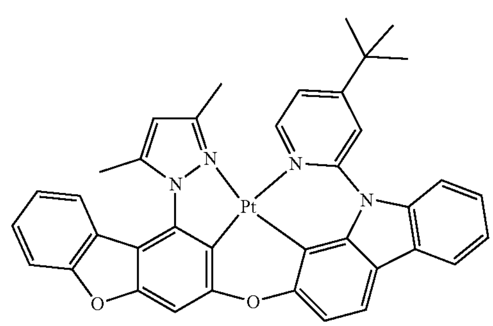
18

-continued
19
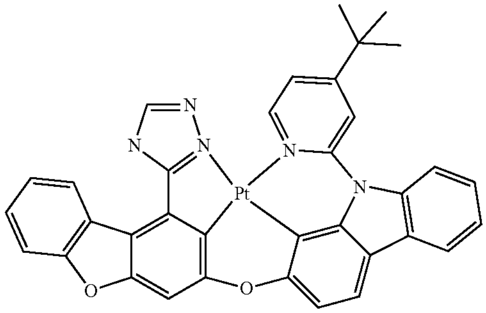
20
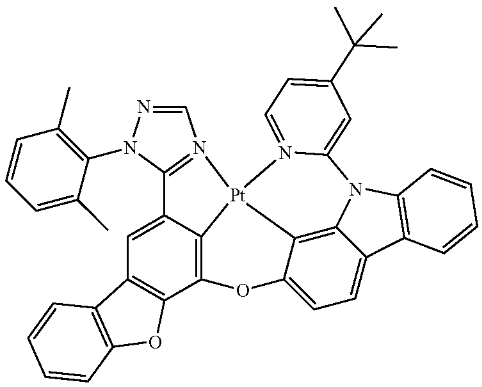
21
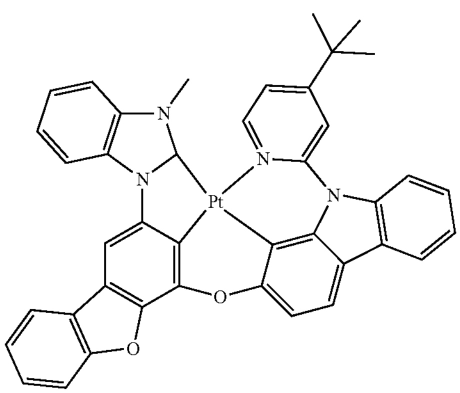
22
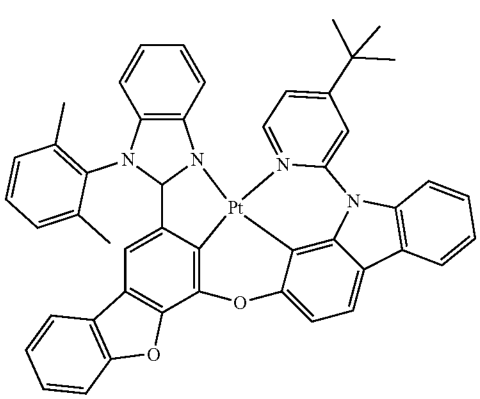
-continued
23
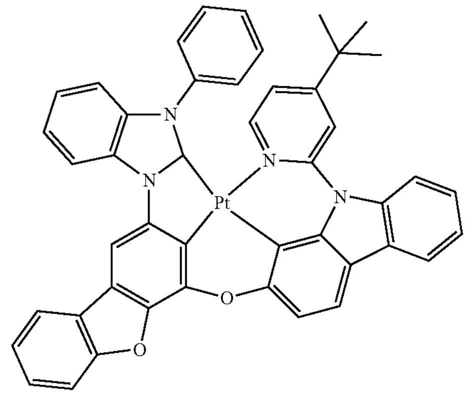
24
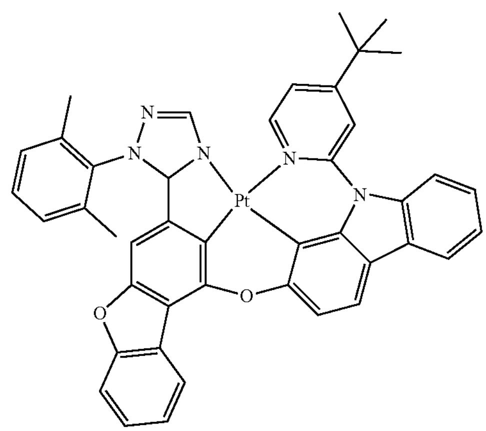
25
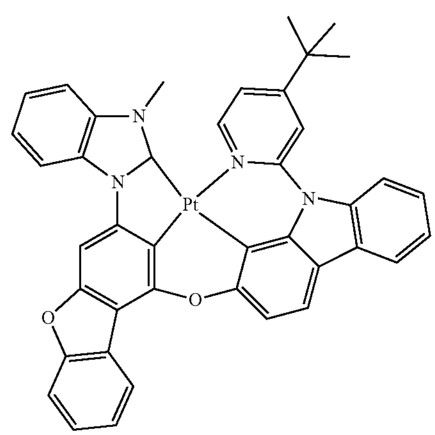

-continued
26
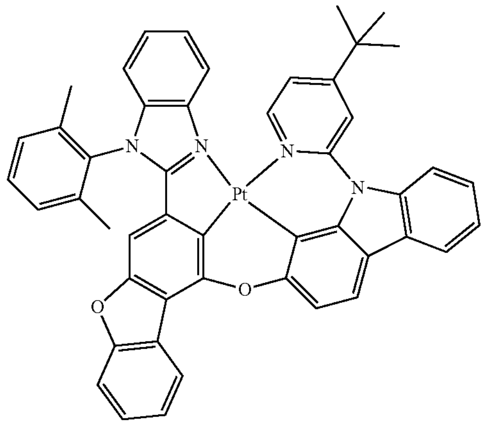
27
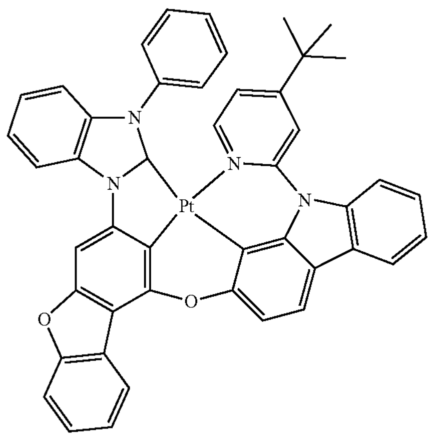
28
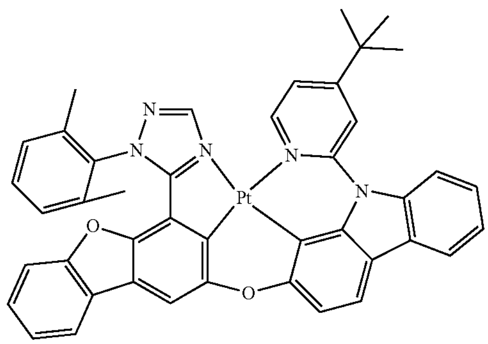
29
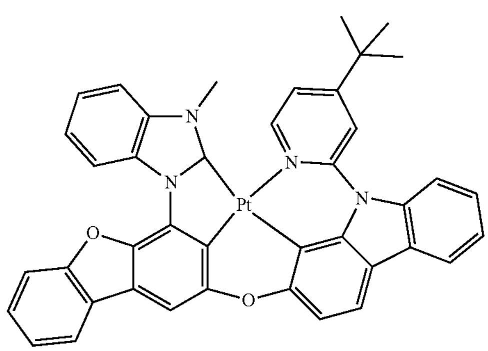
-continued
30
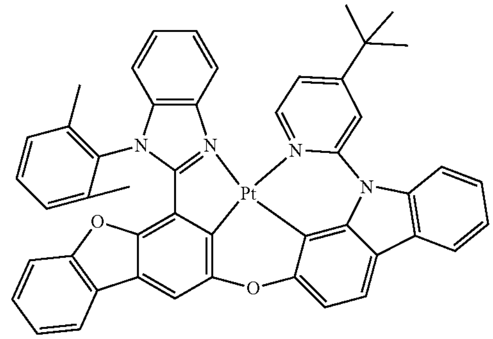
31
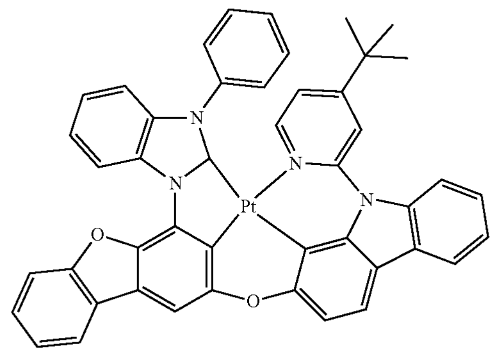
32
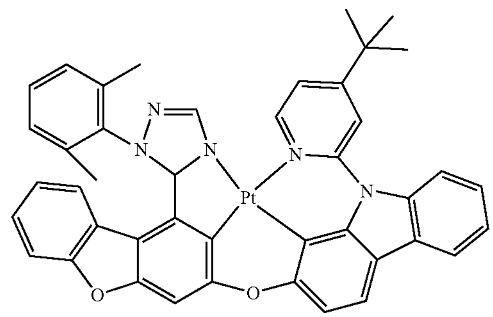
33
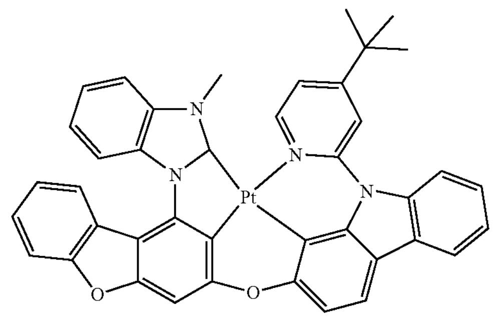
34
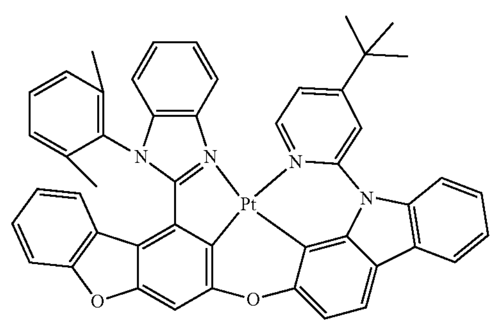

-continued

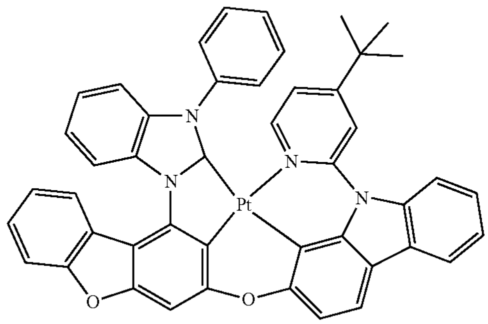

The organometallic compound represented by Formula 1 may satisfy the structure shown in Formula 1, and the ring represented by $A_{20}$ in the $L_{11}$ ligand may satisfy the structure shown in Formula 1-1A or 1-1B. Accordingly, luminescence efficiency may be improved, and the organometallic compound may be suitable for deep blue light emission. Thus, an electronic device, e.g., an organic light-emitting device, including the organometallic compound represented by Formula 1 may exhibit excellent luminescence efficiency and improved color purity.

For example, the highest occupied molecular orbital (HOMO), lowest unoccupied molecular orbital (LUMO), triplet ($T_1$), and singlet ($S_1$) energy levels of the organometallic Compounds 1 to 4 and Comparative Compounds A, B1, and C were evaluated by using a Gaussian according to a density functional theory (DFT) method (structure optimization was performed at a degree of B3LYP, and 6-31G (d,p)). The results thereof are shown in Table 1.

TABLE 1

| Compound No. | HOMO (eV) | LUMO (eV) | $T_1$ energy level (eV) | $S_1$ energy level (eV) |
|---|---|---|---|---|
| Compound 1 | −4.76 | −1.30 | 2.76 | 2.90 |
| Compound 2 | −4.68 | −1.28 | 2.73 | 2.85 |
| Compound 3 | −4.62 | −1.17 | 2.74 | 2.89 |
| Compound 4 | −4.62 | −1.17 | 2.74 | 2.89 |
| Compound A | −4.70 | −1.25 | 2.73 | 2.88 |
| Compound B1 | −5.26 | −1.01 | 2.68 | 3.63 |
| Compound C | −4.63 | −1.40 | 2.47 | 2.72 |

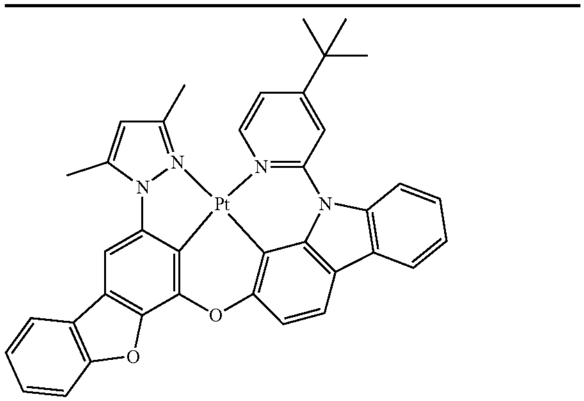

1

TABLE 1-continued

| Compound No. | HOMO (eV) | LUMO (eV) | $T_1$ energy level (eV) | $S_1$ energy level (eV) |
|---|---|---|---|---|

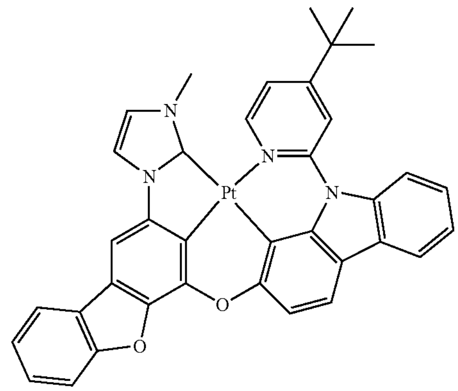

2

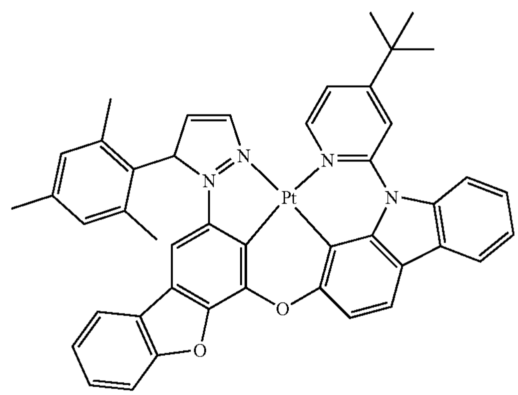

3

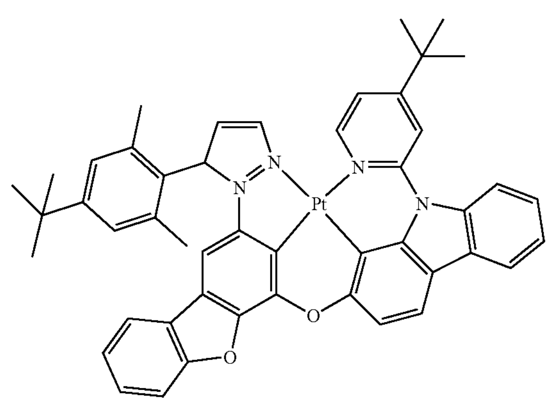

4

TABLE 1-continued

| Compound No. | HOMO (eV) | LUMO (eV) | $T_1$ energy level (eV) | $S_1$ energy level (eV) |
|---|---|---|---|---|

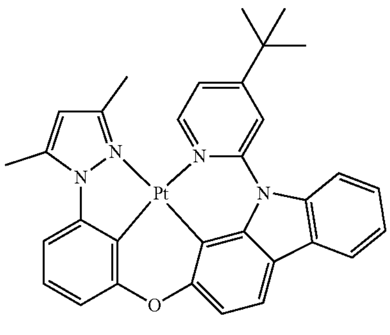

A

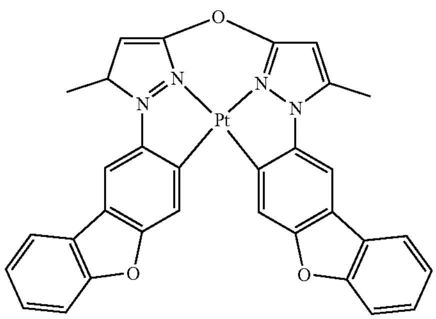

B1

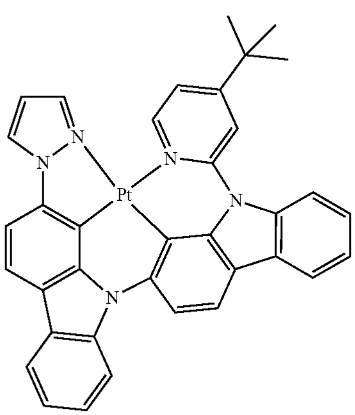

C

Referring to the results shown in Table 1, the organometallic compound represented by Formula 1 was found to have suitable electrical characteristics for use as an emission layer material in an electronic device, e.g., an organic light-emitting device.

In addition, the organometallic compound represented by Formula 1 may have a low HOMO energy level and a high triplet level. Thus, deep blue light emission may be expected.

Synthesis methods of the organometallic compound represented by Formula 1 may be recognizable by one of ordinary skill in the art by referring to Synthesis Examples provided below.

The organometallic compound represented by Formula 1 may be suitable for use in an organic layer of an organic light-emitting device, for example, as an emission layer material. Thus, according to another aspect, there is provided an organic light-emitting device that may include a first electrode; a second electrode; and an organic layer between the first electrode and the second electrode, the organic layer including an emission layer and at least one of the organometallic compound represented by Formula 1.

Since the organic light-emitting device has an organic layer including the organometallic compound represented by Formula 1, the organic light-emitting device may have a low driving voltage, high efficiency, high power, high quantum efficiency, long lifespan, low roll-off, and excellent color purity.

For example, in the organic light-emitting device, the first electrode may be an anode, the second electrode may be a cathode, and the organic layer may further include a hole transport region between the first electrode and the emission layer and an electron transport region between the emission layer and the second electrode, wherein the hole transport region may include a hole injection layer, a hole transport layer, an electron blocking layer, or a combination thereof, and the electron transport region may include a hole blocking layer, an electron transport layer, an electron injection layer, or a combination thereof.

In some embodiments, the organometallic compound represented by Formula 1 may be included in the emission layer.

In the emission layer, the organometallic compound may serve as an emitter. In some embodiments, an emission layer including the organometallic compound represented by Formula 1 may emit phosphorescence produced upon transition of triplet excitons to a ground state of the organometallic compound.

In some embodiments, an emission layer including the organometallic compound represented by Formula 1 may further include a host. The host may be any suitable hosts, and the host may be understood by referring to the description of the host provided herein. In some embodiments, a content of a host in the emission layer may be greater than a content of the organometallic compound represented by Formula 1.

In one or more embodiments, the emission layer may include a host and a dopant, the host may be any suitable hosts, and the dopant may include the organometallic compound represented by Formula 1. The emission layer may emit phosphorescence produced upon transition of triplet excitons to a ground state of the organometallic compound that serve as a dopant.

In an embodiment, the emission layer may further include a host in an amount greater than an amount of the organometallic compound.

In one or more embodiments, the emission layer may include a host and a dopant, the host may be any suitable hosts, the dopant may include the organometallic compound represented by Formula 1, and the emission layer may further include a fluorescent dopant. The emission layer may emit fluorescence produced upon transition of triplet excitons of the organometallic compound to the fluorescent dopant.

In an embodiment, the emission layer may emit blue light having a maximum emission wavelength in a range of about 410 nanometers (nm) to about 500 nm, e.g., about 410 nm to about 490 nm.

The expression "(an organic layer) includes at least one of organometallic compounds" used herein may include a case in which "(an organic layer) includes identical organometallic compounds represented by Formula 1" and a case in which "(an organic layer) includes two or more different organometallic compounds represented by Formula 1".

For example, the organic layer may include, as the organometallic compound, only Compound 1. In this regard, Compound 1 may exist in an emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 all may exist in an emission layer).

The term "organic layer" used herein refers to a single layer and/or a plurality of layers between the first electrode and the second electrode of the organic light-emitting device. The "organic layer" may include, in addition to an organic compound, an organometallic complex including metal.

FIG. 1 is a schematic cross-sectional view of an organic light-emitting device 10 according to an embodiment. Hereinafter, the structure of an organic light-emitting device according to an embodiment and a method of manufacturing an organic light-emitting device according to an embodiment will be described in connection with FIG. 1. The organic light-emitting device 10 includes a first electrode 11, an organic layer 15, and a second electrode 19, which are sequentially stacked in this stated order.

A substrate may be additionally disposed under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may be materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 11 is not limited thereto.

The organic layer 15 is located on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or a combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

When the hole transport region includes a hole injection layer (HIL), the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. In some embodiments, the deposition conditions may include a deposition temperature of about 100° C. to about 500° C., a vacuum pressure of about $10^{-8}$ torr to about $10^{-3}$ torr, and a deposition rate of about 0.01 Angstroms per second (A/sec) to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 rotations per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonicacid (PANI/CSA), polyaniline/poly(4-styrenesulfonate) (PANI/PSS), a compound represented by Formula 201 below, a compound represented by Formula 202 below, or a combination thereof:

m-MTDATA

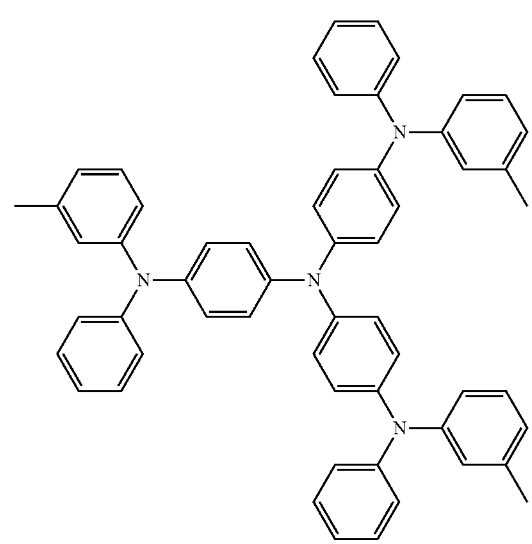

-continued
TDATA
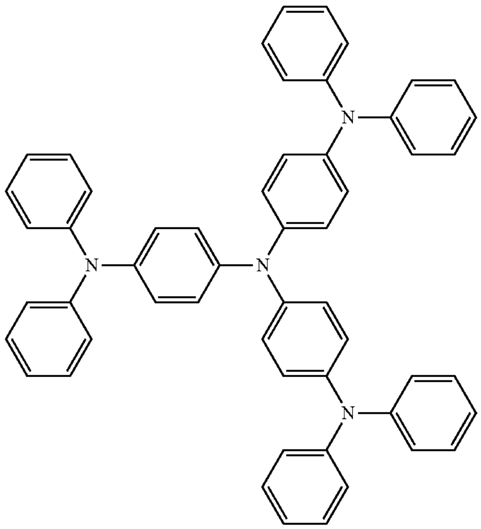
2-TNATA
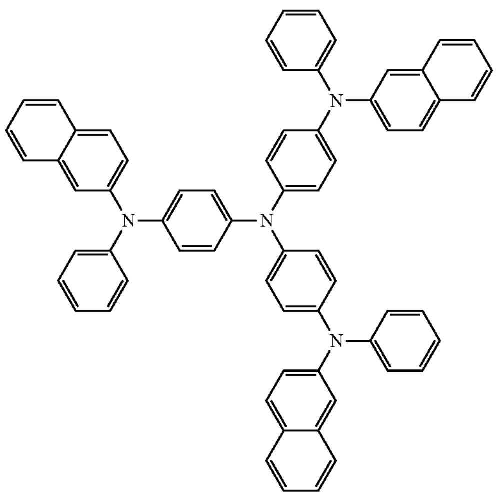
NPB
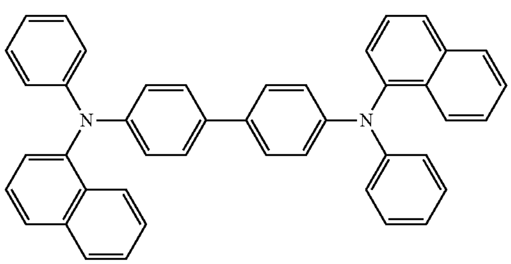
b-NPB
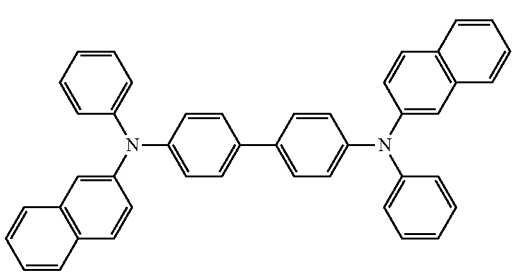
-continued
TPD
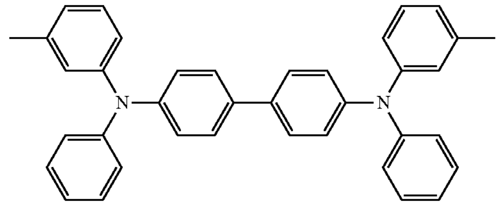
Spiro-TPD
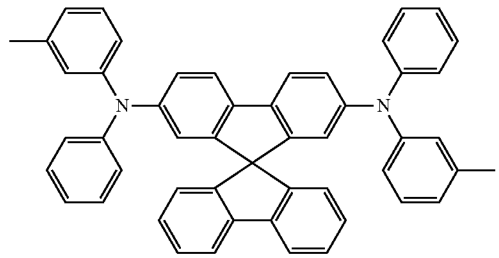
Spiro-NPB
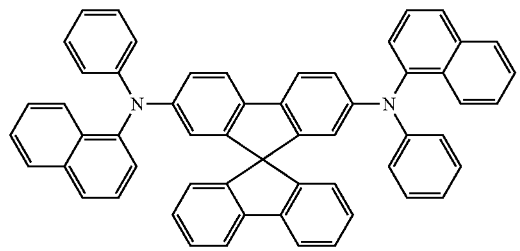
methylated NPB
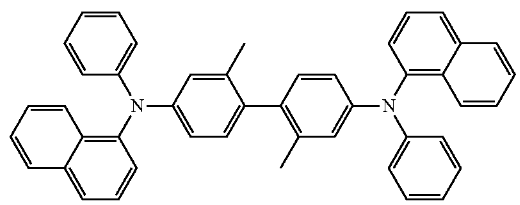
TAPC
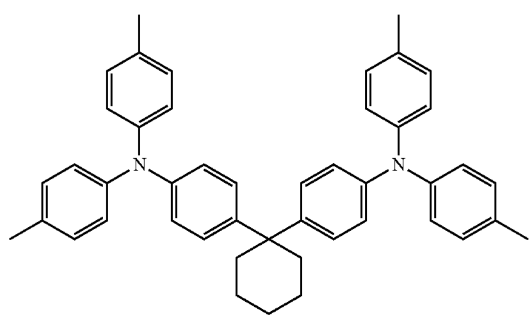
HMTPD
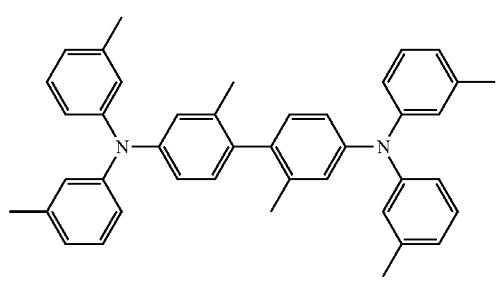

-continued

Formula 201

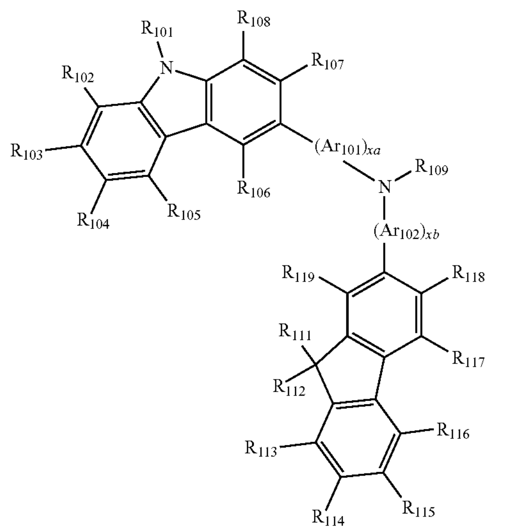

Formula 202

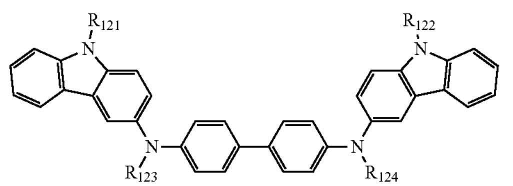

$Ar_{101}$ and $Ar_{102}$ in Formula 201 may each independently be:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylene group, a pyrenylene group, a chrysenylene group, a naphthacenylene group, a picenylene group, a perylenylene group, or a pentacenylene group, each substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_8$-$C_{80}$ arylthio group, a $C_1$-$C_{60}$ heteroaryl group, a monovalent non-aromatic condensed polycyclic group, a monovalent non-aromatic condensed heteropolycyclic group, or a combination thereof.

The designations xa and xb in Formula 201 may each independently be an integer from 0 to 5, or 0, 1, or 2. For example, xa may be 1 and xb may be 0, but xa and xb are not limited thereto.

$R_{101}$ to $R_{108}$, $R_{111}$ to $R_{119}$ and $R_{121}$ to $R_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pantyl group, a hexyl group, and so on), or a $C_1$-$C_{10}$ alkoxy group (for example, a methoxy group, an ethoxy group, a propoxy group, a butoxy group, a pentoxy group, and so on);

a $C_1$-$C_{10}$ alkyl group or a $C_1$-$C_{10}$ alkoxy group, each substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof or a combination thereof;

a phenyl group, a naphthyl group, an anthracenyl group, a fluorenyl group, or a pyrenyl group; or a phenyl group, a naphthyl group, an anthracenyl group, a fluorenyl group, or a pyrenyl group, each substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or a combination thereof, but embodiments of the present disclosure are not limited thereto.

$R_{109}$ in Formula 201 may be:

a phenyl group, a naphthyl group, an anthracenyl group, or a pyridinyl group; or a phenyl group, a naphthyl group, an anthracenyl group, or a pyridinyl group, each substituted with at least one a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or a combination thereof.

According to an embodiment, the compound represented by Formula 201 may be represented by Formula 201A below, but embodiments of the present disclosure are not limited thereto:

Formula 201A
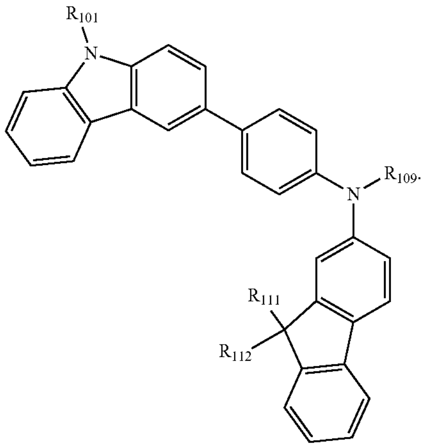
$R_{101}$, $R_{111}$, $R_{112}$, and $R_{109}$ in Formula 201A may be understood by referring to the descriptions of $R_{101}$, $R_{111}$, $R_{112}$, and $R_{109}$ provided herein.
For example, the compound represented by Formula 201, and the compound represented by Formula 202 may include a compound of HT1 to HT20 illustrated below, but are not limited thereto:
HT1
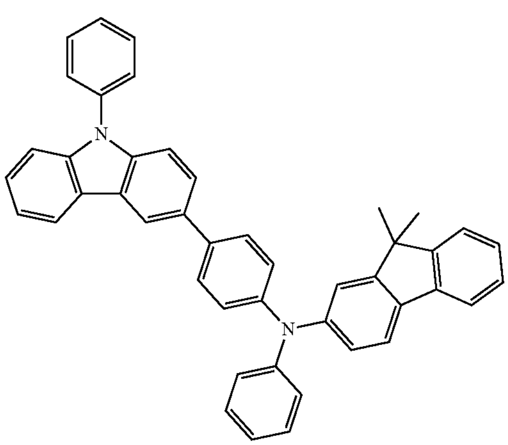
-continued
HT2
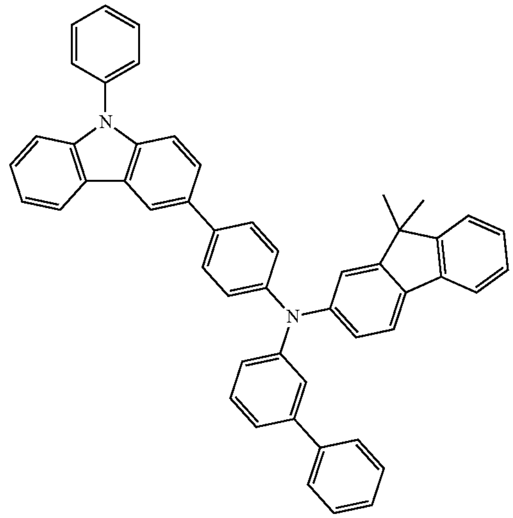
HT3
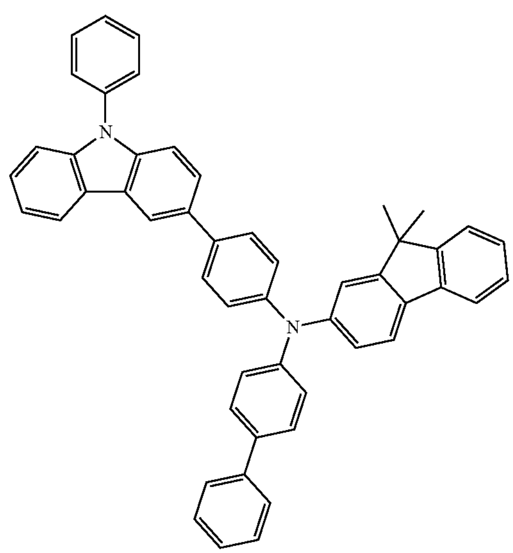

HT4
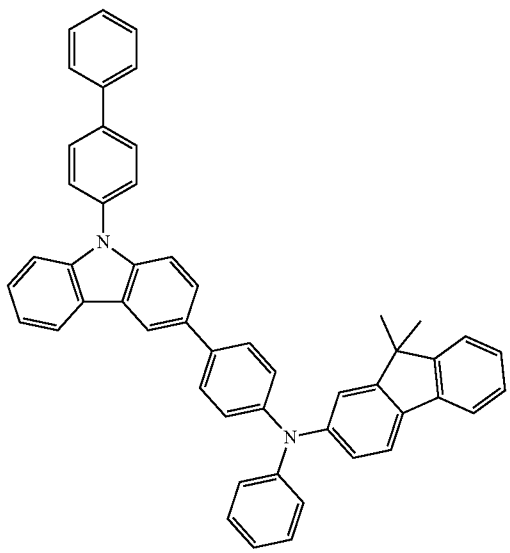
HT5
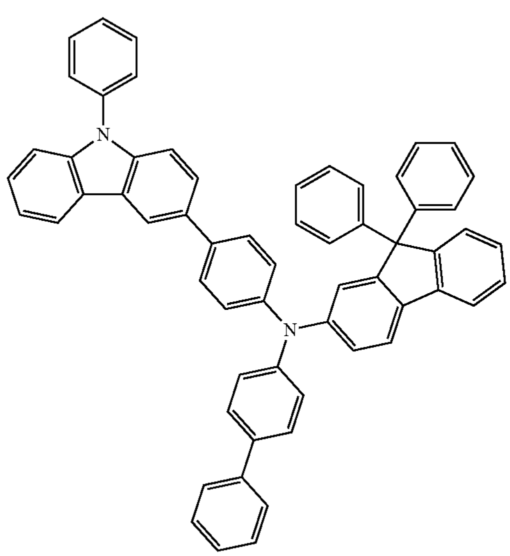
HT6
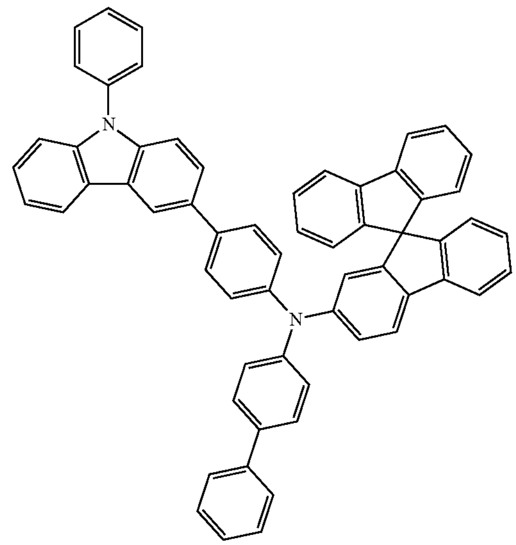
HT7
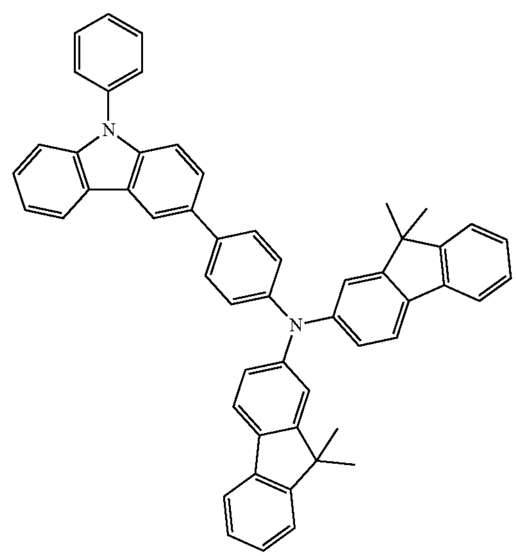
HT8
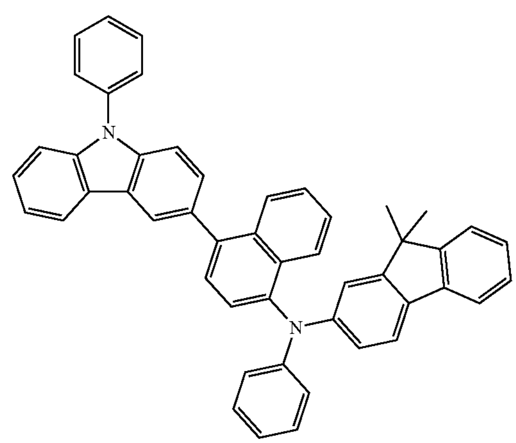

HT9
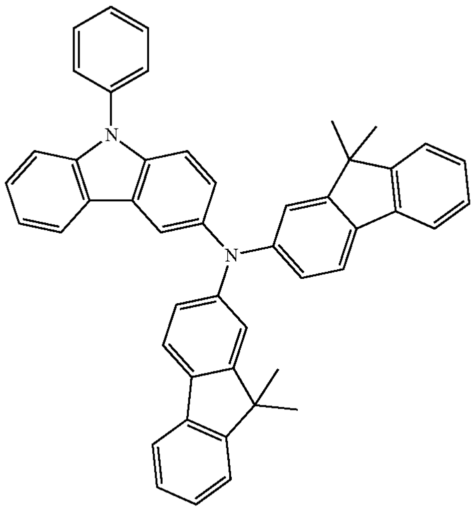
HT10
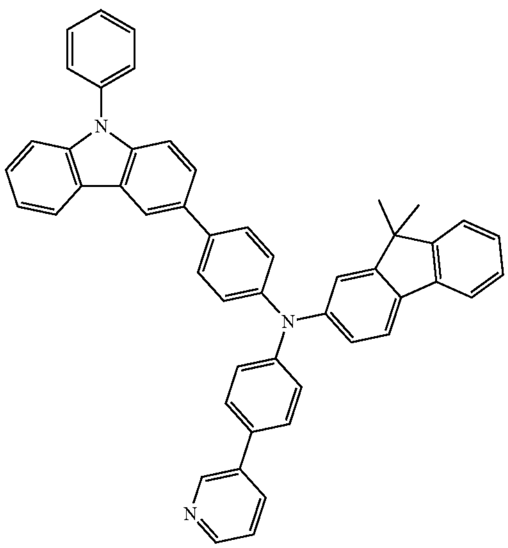
HT11
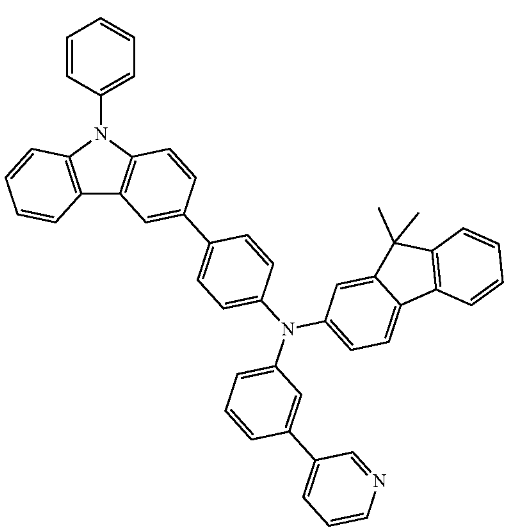
HT12
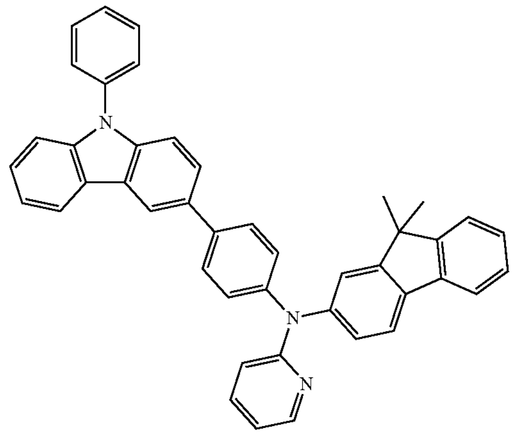
HT13
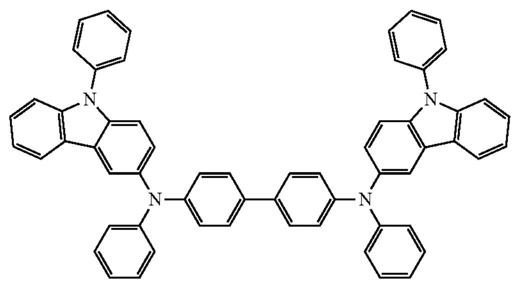
HT14
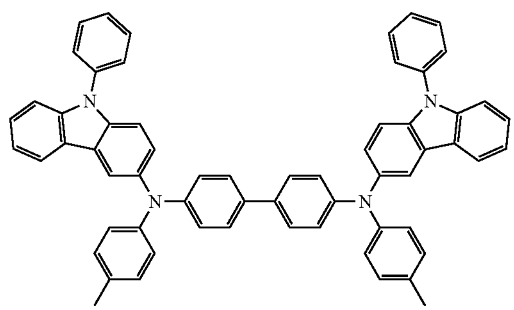
HT15
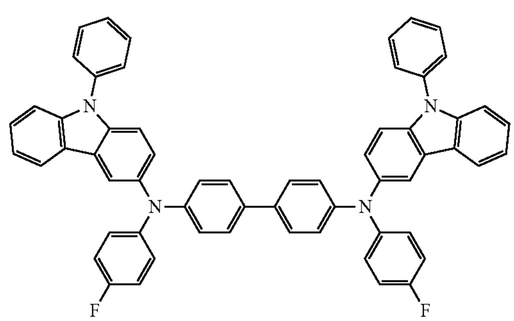

-continued

HT16

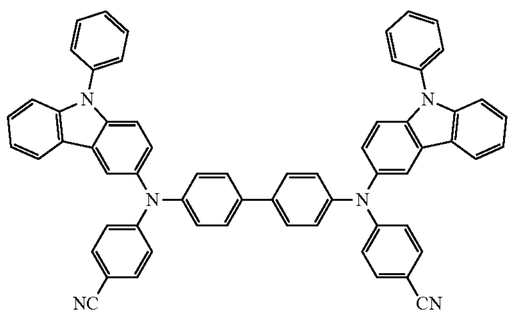

A thickness of the hole transport region may be from about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one of a quinone derivative, a metal oxide, and a cyano group-containing compound, but embodiments of the present disclosure are not limited thereto. Examples of the p-dopant are: a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1 below, or a combination thereof, but are not limited thereto:

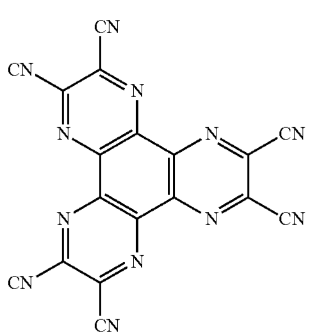

HT-D1

-continued

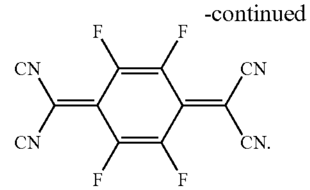

F4-TCNQ

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer (EML) may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the hole transport layer.

Meanwhile, when the hole transport region includes an electron blocking layer, a material for the electron blocking layer may be materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one TPBi, TBADN, ADN (also referred to as "DNA"), CBP, CDBP, TCP, mCP, Compound H50, Compound H51, or a combination thereof:

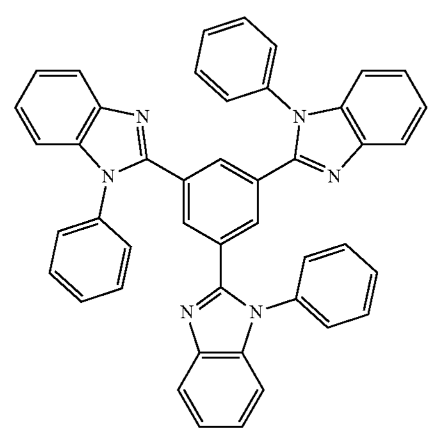

TPBi

-continued

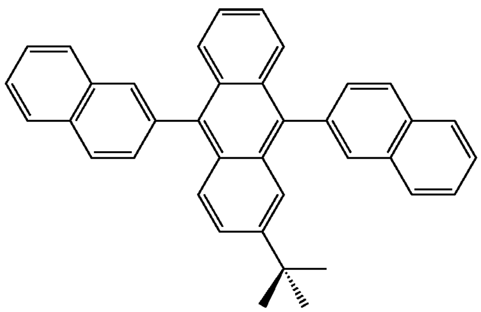

TBADN

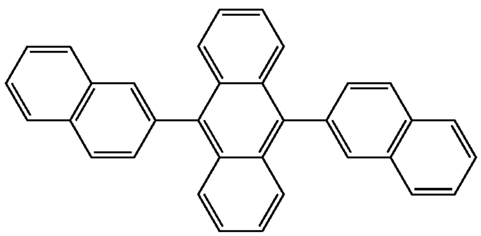

ADN

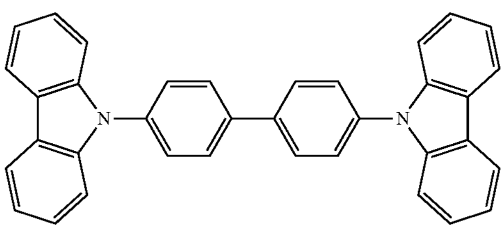

CBP

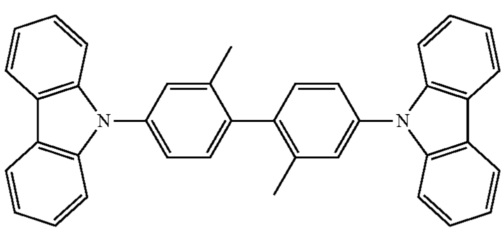

CDBP

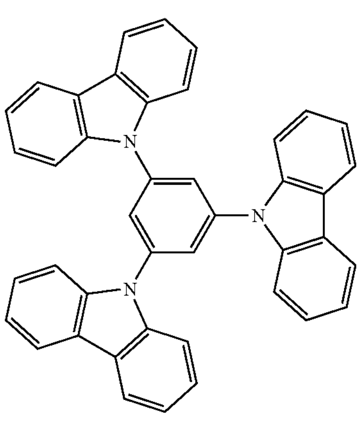

TCP

-continued

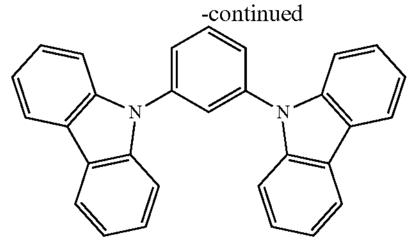

mCP

H50

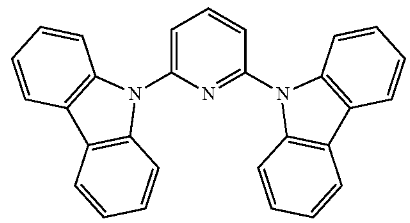

H51

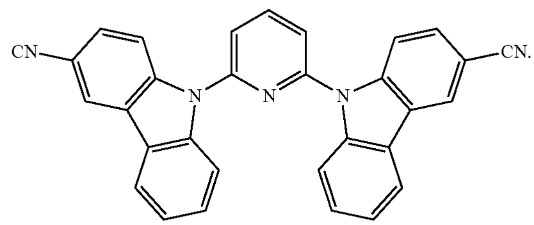

In one or more embodiments, the host may further include a compound represented by Formula 301 below:

Formula 301

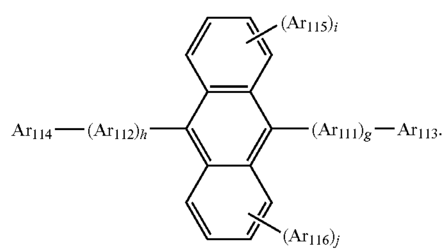

$Ar_{111}$ and $Ar_{112}$ in Formula 301 may each independently be:

a phenylene group, a naphthylene group, a phenanthrenylene group, or a pyrenylene group; and a phenylene group, a naphthylene group, a phenanthrenylene group, or a pyrenylene group, each substituted with at least one a phenyl group, a naphthyl group, an anthracenyl group, or a combination thereof.

$Ar_{113}$ and $Ar_{116}$ in Formula 301 may each independently be:

a $C_1$-$C_{10}$ alkyl group, a phenyl group, a naphthyl group, a phenanthrenyl group, or a pyrenyl group; or a phenyl group, a naphthyl group, a phenanthrenyl group, and a pyrenyl group, each substituted with at least one a phenyl group, a naphthyl group, or an anthracenyl group.

g, h, i, and j in Formula 301 may each independently be an integer from 0 to 4, and may be, for example, 0, 1, or 2.

$Ar_{113}$ and $Ar_{116}$ in Formula 301 may each independently be:

a $C_1$-$C_{10}$ alkyl group substituted with at least one a phenyl group, a naphthyl group, an anthracenyl group, or a combination thereof;

a phenyl group, a naphthyl group, an anthracenyl group, a pyrenyl group, a phenanthrenyl group, or a fluorenyl group;

a phenyl group, a naphthyl group, an anthracenyl group, a pyrenyl group, a phenanthrenyl group, or a fluorenyl group, each substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, a fluorenyl group, or a combination thereof; or thereto.

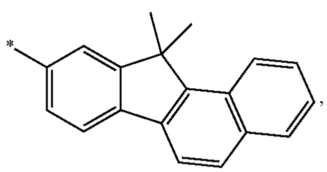 [SMILES: *c1ccc2c(c1)C(C)(C)c1c-2ccc2ccccc12]

but embodiments of the present disclosure are not limited thereto.

In one or more embodiments, the host may include a compound represented by Formula 302 below:

Formula 302

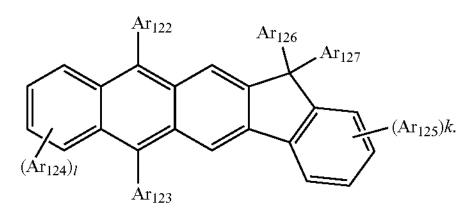

$Ar_{122}$ to $Ar_{125}$ in Formula 302 may each be understood by referring to the description of Arm in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer from 0 to 4. For example, k and l may be 0, 1, or 2.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, the amount of the dopant may be in a range of about 0.01 parts to about 15 parts by weight based on 100 parts by weight of the host, but embodiments are not limited thereto.

The thickness of the emission layer may be in a range of about 100 Å to about 1,000 Å, and in some embodiments, about 200 Å to about 600 Å. When the thickness of the emission layer is within any of these ranges, excellent light-emission characteristics may be obtained without a substantial increase in driving voltage.

Then, an electron transport region may be located on the emission layer.

The electron transport region may include a hole blocking layer, an electron transport layer, an electron injection layer, or a combination thereof.

For example, the electron transport region may have a hole blocking layer/electron transport layer/electron injection layer structure or an electron transport layer/electron injection layer structure, and the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, BAlq, or a combination thereof, but embodiments of the present disclosure are not limited thereto:

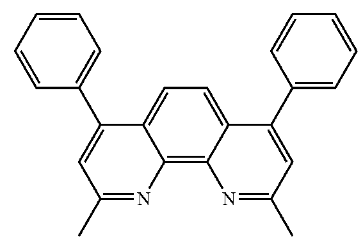

BCP

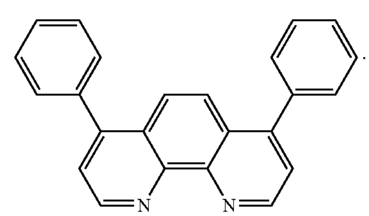

Bphen

A thickness of the hole blocking layer may be in a range of about 20 Å to about 1,000 Å, for example, about 30 Å to about 300 Å. When the thickness of the hole blocking layer is within these ranges, the hole blocking layer may have excellent hole blocking characteristics without a substantial increase in driving voltage.

The electron transport layer may further include at least one of BCP, Bphen, $Alq_3$, BAlq, TAZ, NTAZ, or a combination thereof:

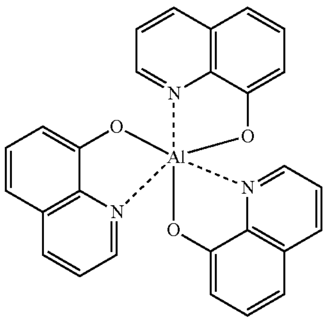
Alq3
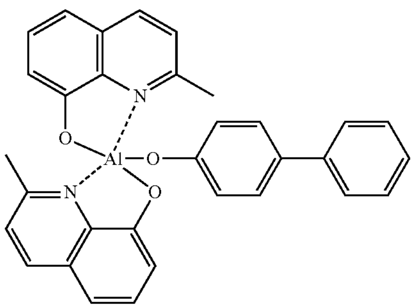
BAlq
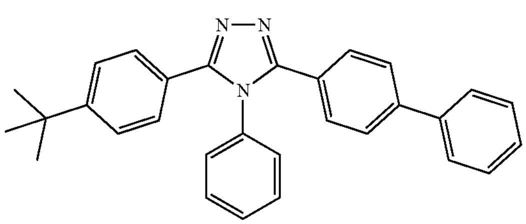
TAZ
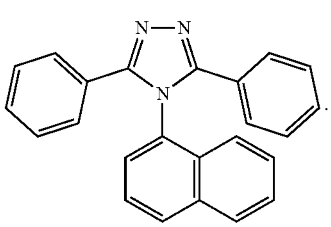
NTAZ
In one or more embodiments, the electron transport layer may include at least one of ET1 to ET25, but are not limited thereto:
ET1
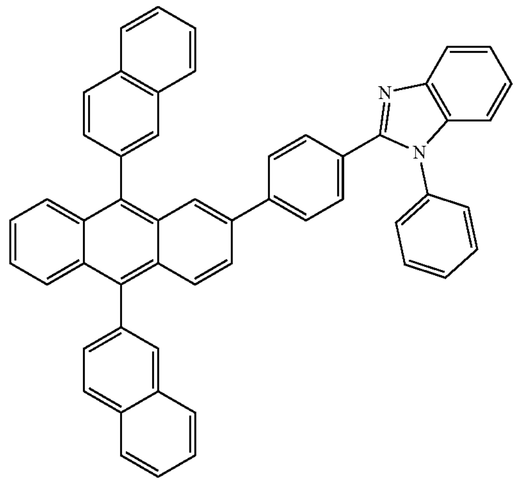
ET2
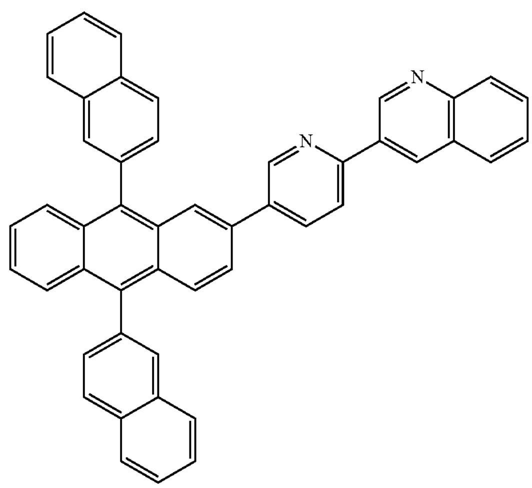
ET3
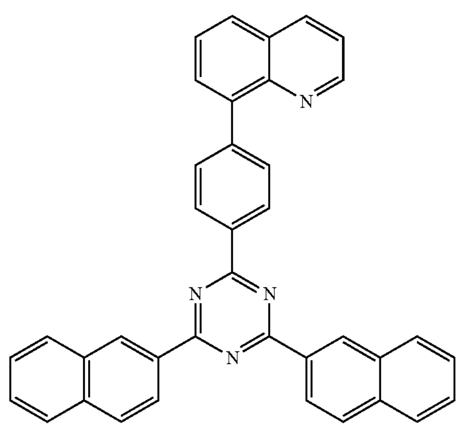

-continued
ET4
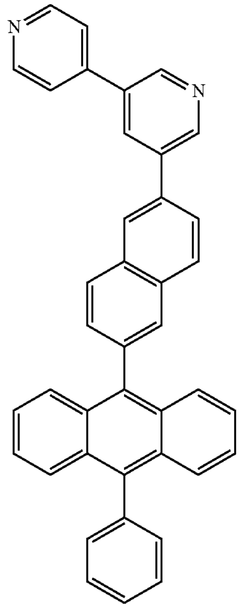
ET5
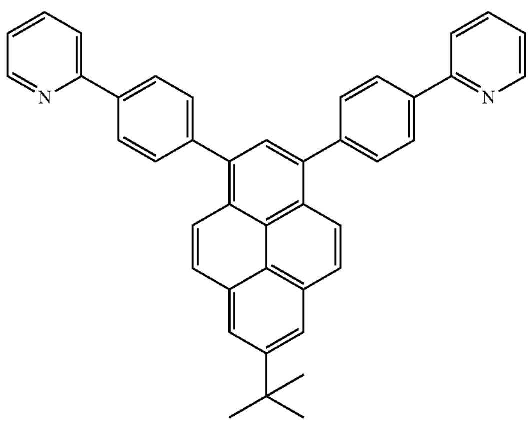
ET6
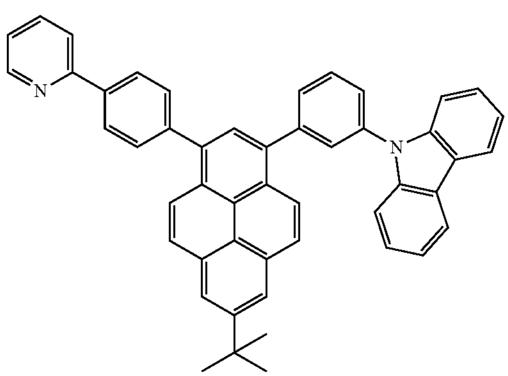
-continued
ET7
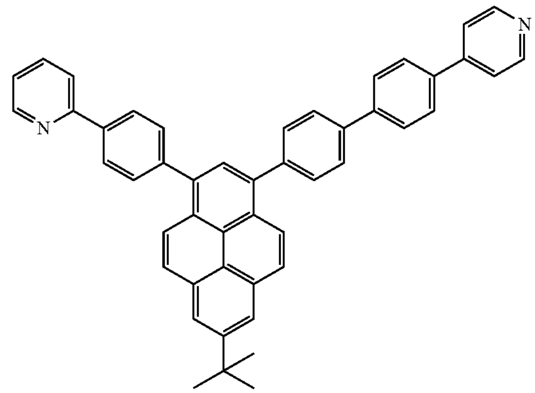
ET8
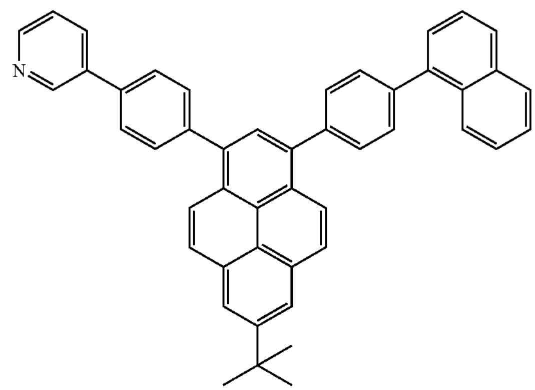
ET9
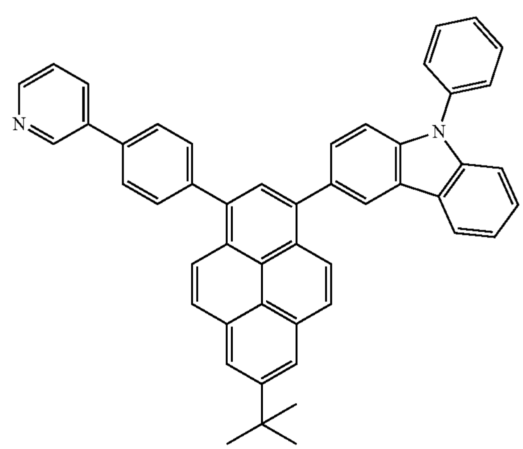

-continued
ET10
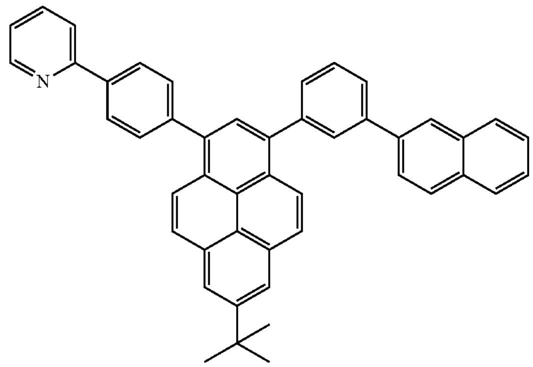
ET11
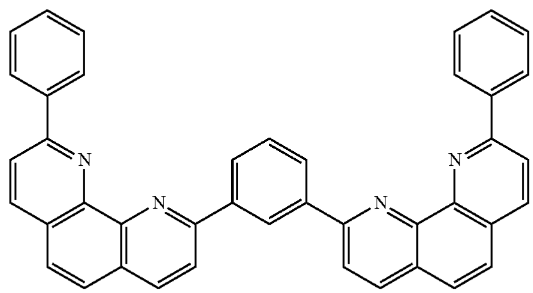
ET12
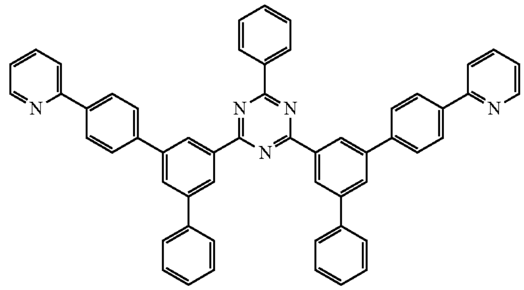
ET13
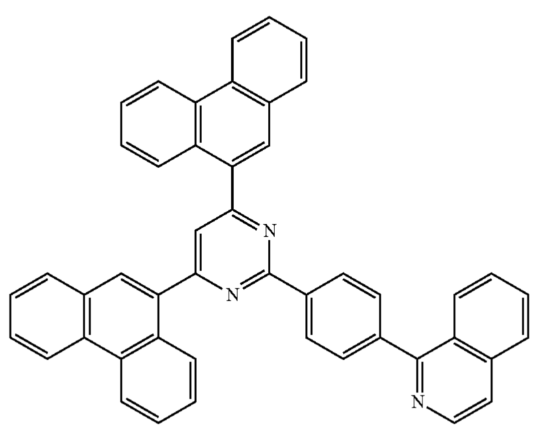
-continued
ET14
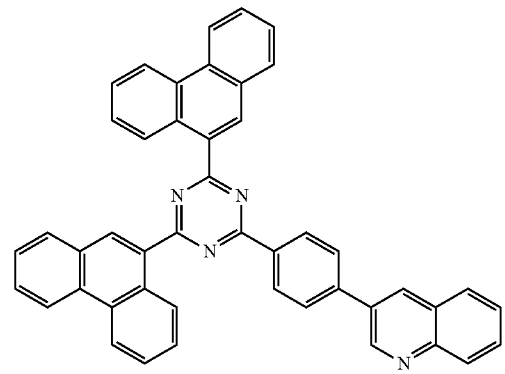
ET15
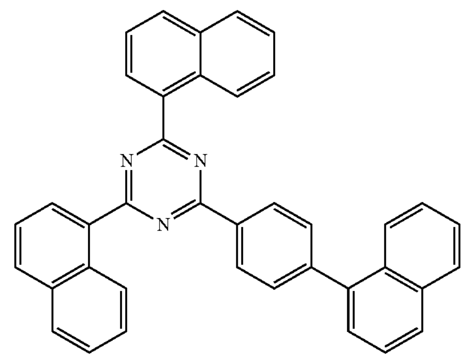
ET16
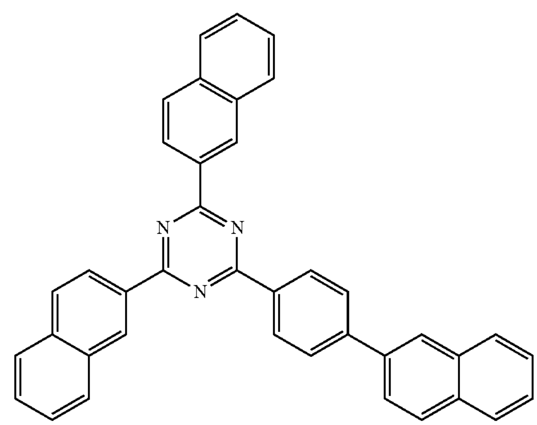
ET17
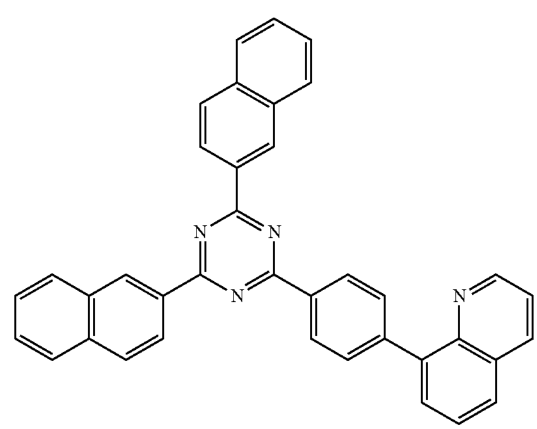

-continued
ET18
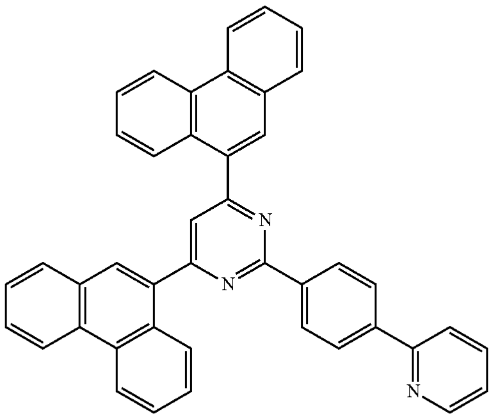
ET19
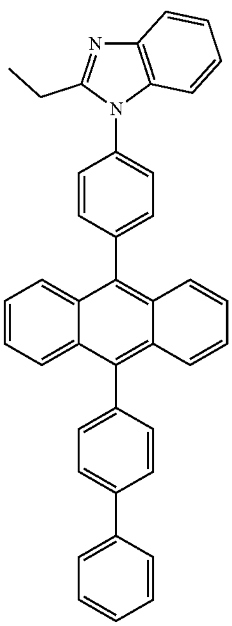
ET20
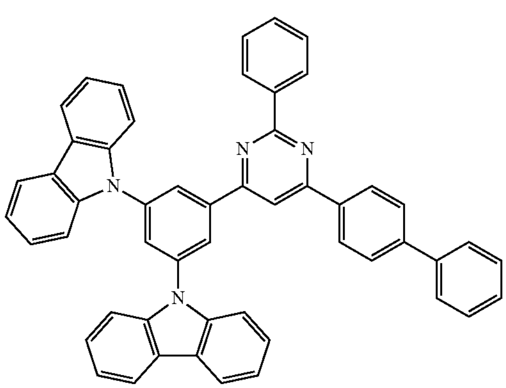
-continued
ET21
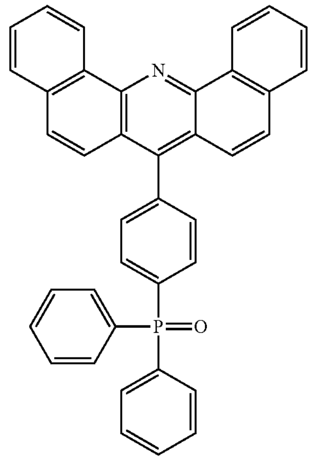
ET22
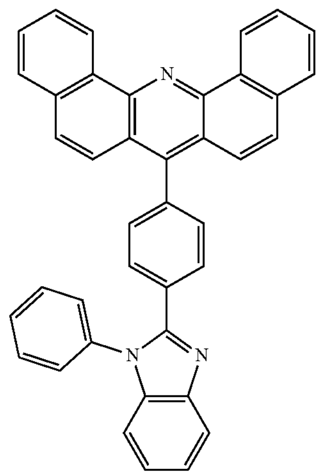
ET23
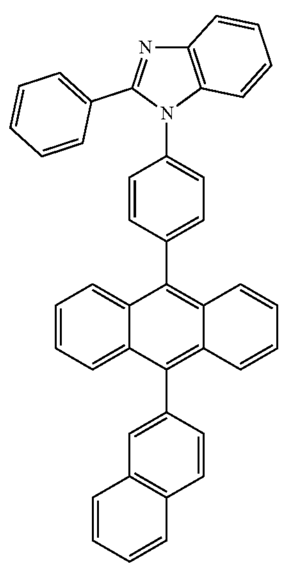

-continued

ET24

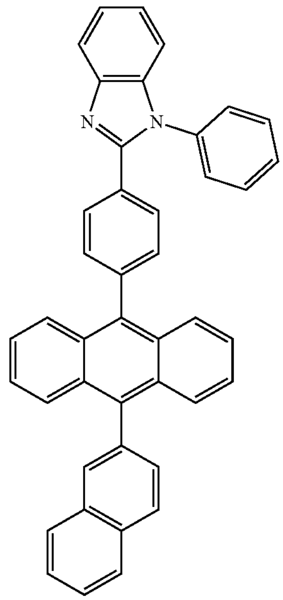

ET25

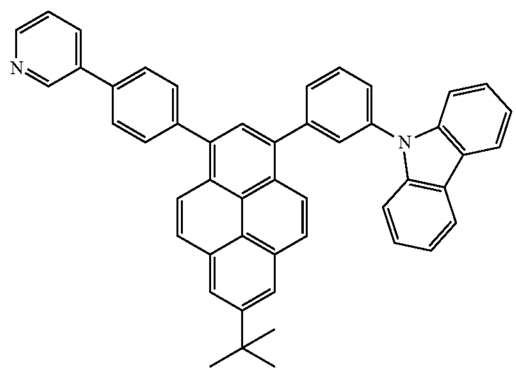

A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium 8-hydroxyquinolate, LiQ) or ET-D2:

ET-D1

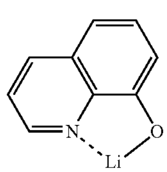

-continued

ET-D2

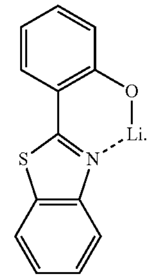

The electron transport region may include an electron injection layer (EIL) that promotes flow of electrons from the second electrode 19 thereinto.

The electron injection layer may include at least one LiF, NaCl, CsF, $Li_2O$, BaO, or a combination thereof.

A thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

The second electrode 19 is located on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be formed as the material for forming the second electrode 19. To manufacture a top-emission type light-emitting device, a transmissive electrode formed using ITO or IZO may be used as the second electrode 19.

Hereinbefore, the organic light-emitting device has been described with reference to FIG. 1, but embodiments of the present disclosure are not limited thereto.

In an embodiment, provided is an electronic apparatus including: a substrate; and an organic light-emitting device located on the substrate. The first compound may be the same as described above.

In an embodiment, the electron apparatus may further include a color conversion layer, The color conversion layer is located on at least one of traveling paths of light emitted from the organic light-emitting device and may include a quantum dot.

The quantum dot is a particle having a crystal structure of several to several tens of nanometers and includes hundreds to thousands of atoms.

Since the quantum dot is very small in size, a quantum confinement effect may occur. The quantum confinement effect refers to a phenomenon in which a band gap of the object becomes large when the object becomes smaller than a nanometer size. Accordingly, when light having a wavelength having an energy intensity that is greater than the band gap of the quantum dot is irradiated to the quantum dot, the quantum dot is excited by absorbing the light and emits light having a specific wavelength and transits to the ground state. In this case, the wavelength of the emitted light has a value corresponding to the band gap.

The quantum dot may be a semiconductor material. For example, the quantum dot may consist of a Group II-VI semiconductor compound, a Group III-V semiconductor compound, a Group IV-VI semiconductor compound, a Group IV element or compound, or a combination thereof. The Group II-VI semiconductor compound may be, for example, a binary compound, such as CdS, CdSe, CdTe, ZnS, ZnSe, ZnTe, ZnO, HgS, HgSe, HgTe, or a combination thereof; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, or a combination thereof; or a quaternary compound, such as CdHgZnTe, CdZnSeS, CdZnSeTe, CdZnSTe, CdHgSeS, CdHgSeTe, CdHgSTe, HgZnSeS, HgZnSeTe, HgZnSTe, or a combination thereof. The Group III-V semiconductor compound may be, for example, a binary compound, such as GaN, GaP, GaAs, GaSb, AlN, AlP, AlAs, AlSb, InN, InP, InAs, InSb, or a combination thereof; a ternary compound, such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a combination thereof; or a quaternary compound, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof. The Group IV-VI semiconductor compound may be, for example, a binary compound, such as SnS, SnSe, SnTe, PbS, PbSe, PbTe, or a combination thereof; a ternary compound, such as SnSeS, SnSeTe, SnSTe, PbSeS, PbSeTe, PbSTe, SnPbS, SnPbSe, SnPbTe, or a combination thereof; a quaternary compound, such as SnPbSSe, SnPbSeTe, SnPbSTe, or a combination thereof. The Group IV element or compound may be, for example Si, Ge, SiC, SiGe, or a combination thereof.

The quantum dot may have a core structure, a core-shell structure, or a core-shell-shell structure. The quantum dot core may have a diameter of about 1 nm to several tens of nm depending on a composition material therefor. The core-shell structure of the quantum dot may be, for example, a CdSe/CdS structure or an InP/ZnS structure. The quantum dot core-shell-shell structure may be, for example, a CdSe/CdS/ZnS structure.

The quantum dot may adjust the color of emitted light according to the particle size. Therefore, the quantum dot may various emission colors such as blue, red, or green.

In addition, the shape of the quantum dot is not particularly limited. For example, the quantum dot may be a spherical, cubic, pyramid, or multi-arm nanoparticle. In one or more embodiments, the quantum dot may have the form of nanotubes, nanowires, nanofibers, nanoplate particles.

Another aspect provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" used herein refers to a divalent group having the same structure as that of the $C_1$-$C_{60}$ alkyl group.

The term "$C_1$-$C_{60}$ alkoxy group" used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" used herein refers to a divalent group having the same structure as that of the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as that of the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as that of the $C_3$-$C_{10}$ cycloalkyl group.

The term "$C_1$-$C_{10}$ heterocycloalkyl group" as used herein refers to a monovalent saturated monocyclic group having at least one N, O, P, Si, B, Se, Ge, Te, S, or a combination thereof as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has at least one heteroatom N, O, P, Si, Se, Ge, Te, S, or a combination thereof as a ring-forming atom, 2 to 10 carbon atoms, and at least one carbon-carbon double bond in its ring. Examples of the $C_2$-$C_{10}$ heterocycloalkenyl group are a 2,3-dihydrofuranyl group, and a 2,3-dihydrothiophenyl group. The term "$C_2$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other. The $C_7$-$C_{60}$ alkylaryl group refers to a $C_6$-$C_{60}$ aryl group substituted with at least one $C_1$-$C_{60}$ alkyl group.

The term "$C_1$-$C_{60}$ heteroaryl group" as used herein refers to a monovalent group having a carbocyclic aromatic system that has at least one N, O, P, Si, B, Se, Ge, Te, S, or a combination thereof as a ring-forming atom, and 1 to 60 carbon atoms. The term "$C_1$-$C_{60}$ heteroarylene group" as used herein refers to a divalent group having a carbocyclic aromatic system that has at least one heteroatom N, O, P, B, Se, Ge, Te, S, or a combination thereof as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the rings may be fused to each other. The $C_2$-$C_{60}$ alkylheteroaryl group refers to a $C_1$-$C_{60}$ heteroaryl group substituted with at least one $C_1$-$C_{60}$ alkyl group.

The term "$C_6$-$C_{60}$ aryloxy group" as used herein indicates -$OA_{102}$ (wherein $A_{102}$ is the $C_6$-$C_{60}$ aryl group), and the term "$C_6$-$C_{60}$ arylthio group" as used herein indicates -$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one N, O, Si, P, B, Se, Ge, Te, S, or a combination thereof other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a combination thereof;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a combination thereof, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, —$P(=O)(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, or a combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, or a combination thereof each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(=O)($Q_{28}$)($Q_{29}$), or a combination thereof; or —N($Q_{31}$)($Q_{32}$), —Si($Q_{33}$)($Q_{34}$)($Q_{35}$), —B($Q_{36}$)($Q_{37}$), —P(=O)($Q_{38}$)($Q_{39}$), or a combination thereof, wherein $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one deuterium, a $C_1$-$C_{60}$ alkyl group, a $C_6$-$C_{60}$ aryl group, or a combination thereof, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryl group substituted with at least one deuterium, a $C_1$-$C_{60}$ alkyl group, a $C_6$-$C_{60}$ aryl group, or a combination thereof, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1: Synthesis of Compound 1

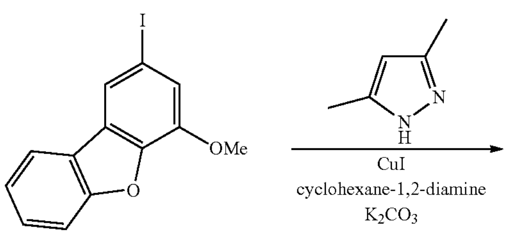

1a

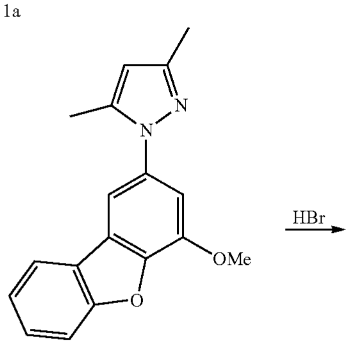

1b

-continued

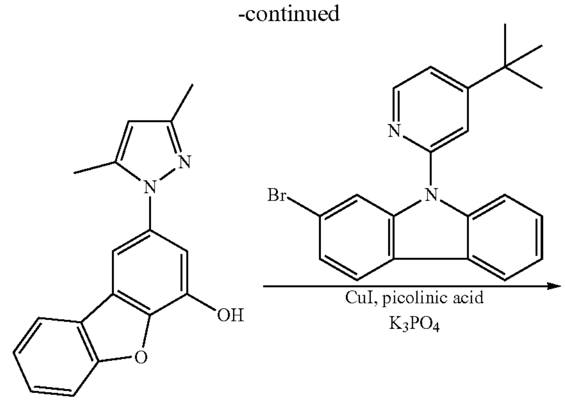

1c

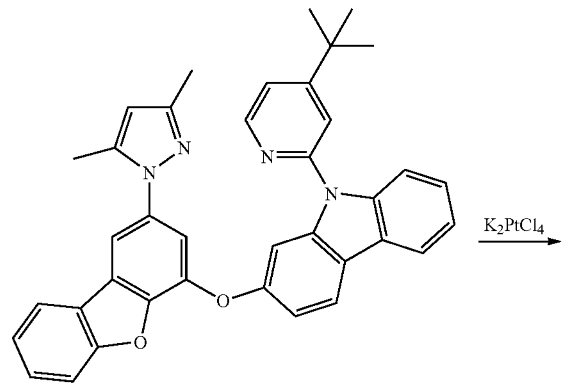

1d

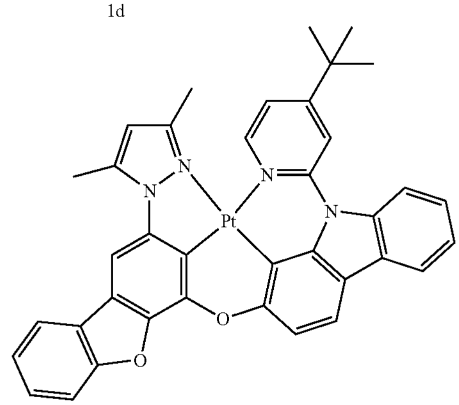

1

(1) Synthesis of Intermediate 1b 1.1 g (3.40 mmol) of Compound 1a, 0.39 g (4.08 mmol) of 3,5-dimethyl-1H-pyrazole, 0.032 g (0.17 mmol) of CuI, 0.04 mL (0.34 mmol) of cyclohexane-1,2-diamine, 0.94 g (6.80 mmol) of $K_2CO_3$, and 2 mL of dry toluene were added to a 10 mL Schlenk flask. Then, the mixture was heated under reflux for 2 days in a nitrogen atmosphere. Once the reaction was complete, the solvent was removed therefrom, and the resultant was purified through a column (ethyl acetate/n-hexane=1:5) to thereby obtain 0.63 g of Intermediate 1b in the form of light brown powder (yield: 63%). $^1$H NMR ($CDCl_3$, 300 MHz): δ 7.93 (dq, J=7.8, 0.9 Hz, 1H), 7.66 (d, J=8.4 Hz, 1H), 7.57 (sd, J=1.8 Hz, 1H), 7.53-7.47 (m, 1H), 7.37 (td, J=7.8, 1.2 Hz, 1H), 7.10 (sd, J=1.8 Hz, 1H), 6.05 (s, 1H), 4.10 (s, 3H), 2.35 (sd, J=1.5 Hz, 6H).

(2) Synthesis of Intermediate 1c 0.62 g (2.12 mmol) of Intermediate 1 b and excessive amount of HBr (48%, 6 mL) were added to a 10 mL flask. Then, the resulting mixture was heated under reflux for 36 hours at a temperature of 120° C. The temperature was lowered to room temperature, and the resultant product was neutralized using $K_2CO_3$ aqueous solution. The resulting product was filtered and dried to obtain 0.56 g of Intermediate 1c in the form of brown powder (yield: 95%). $^1H$ NMR (DMSO-$d_6$, 300 MHz): δ 10.64 (s, 1H), 8.18 (d, J=7.5 Hz, 1H), 7.73 (d, J=8.1 Hz, 1H), 7.69 (sd, J=1.8 Hz, 1H), 7.54 (t, J=7.2 Hz, 1H), 7.40 (t, J=7.5 Hz, 1H), 7.06 (sd, J=1.8 Hz, 1H), 6.07 (s, 1H), 2.32 (s, 3H), 2.19 (s, 3H).

(3) Synthesis of Intermediate 1d 0.73 g (2.62 mmol) of 2-(3,5-dimethyl-1H-pyrazol-1-yl) dibenzo[b,d]furan-4-ol, 1.1 g (2.90 mmol) of 2-bromo-9-(4-(tert-butyl)pyridin-2-yl)-9H-carbazole, 0.1 g (0.525 mmol) of CuI, 0.15 g (1.22 mmol) of picolinic acid, 1.4 g (6.60 mmol) of $K_3PO_4$, and 30 mL of dry dimethyl sulfoxide (DMSO) were added to a 100 mL round flask. Then, the mixture was stirred at a temperature of 120° C. for 5 days in a nitrogen atmosphere. The reaction mixture was cooled to room temperature upon completion of the reaction. Then, 200 mL of water was added thereto, and a product was extracted therefrom using ethyl acetate (30 mL×3). Then, the resultant product was purified through a column (ethyl acetate/n-hexane=1:3) to thereby obtain 1.07 g of Intermediate 1d in the form of white powder (yield: 71%). $^1H$ NMR ($CD_2Cl_2$, 300 MHz): δ 8.56 (d, J=5.4 Hz, 1H), 8.18-8.13 (m, 2H), 8.05 (d, J=7.8 Hz, 1H), 7.81-7.78 (m, 2H), 7.68-7.65 (m, 2H), 7.60-7.57 (m, 2H), 7.48-7.43 (m, 2H), 7.37 (td, J=7.8, 0.9 Hz, 1H), 7.31 (dd, J=5.1, 1.8 Hz, 1H), 7.20 (dd, J=8.4, 2.1 Hz, 1H), 7.15 (d, J=2.1 Hz, 1H), 5.99 (s, 1H), 2.27 (s, 3H), 2.24 (s, 3H), 1.32 (s, 9H).

(4) Synthesis of Compound 1

0.3 g (0.520 mmol) of Intermediate 1d, 0.25 g (0.601 mmol) of $K_2PtCl_4$, 0.02 g (0.062 mmol) of n-$Bu_4NBr$, and 30 mL of $CH_3COOH$ as solvent were added to a pressure reactor in a nitrogen atmosphere. Then, the mixture was stirred at room temperature for 24 hours and further stirred at a temperature of 120° C. for 3 days. The temperature was lowered to room temperature, and 50 mL of water was added thereto. A filtration process was performed thereon under reduced pressure to thereby obtain yellow powder. This powder was dissolved in $CH_2Cl_2$, and the resultant product was purified through a column (ethyl acetate/n-hexane=1:3) to thereby obtain 0.296 g of Compound 1 (yield: 74%). $^1H$ NMR ($CD_2Cl_2$, 300 MHz): δ 9.11 (d, J=6.3 Hz, 1H), 8.14 (dd, J=7.2, 0.6 Hz, 2H), 8.03 (d, J=7.8 Hz, 1H), 7.99 (d, J=7.8 Hz, 1H), 7.90 (d, J=8.4 Hz, 1H), 7.75 (d, J=7.8 Hz, 2H), 7.54-7.41 (m, 5H), 7.03 (dd, J=6.3, 2.1 Hz, 1H), 6.20 (s, 1H), 2.86 (s, 3H), 2.46 (s, 3H), 1.35 (s, 9H). HR-MS (m/z) for $C_{38}H_{30}N_4O_2Pt$: Theoretical value, 769.20; Experiment value [M+H], 770.20.

Synthesis Example 2: Synthesis of Compound 2

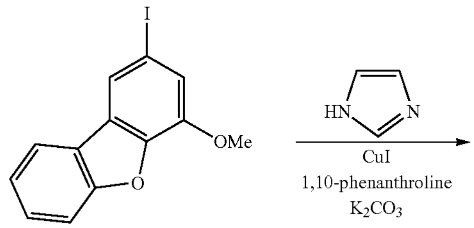

1a

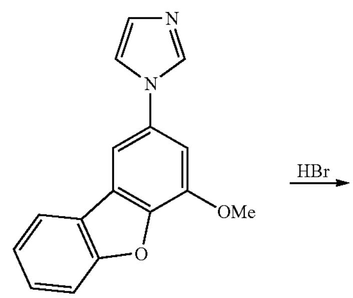

2b

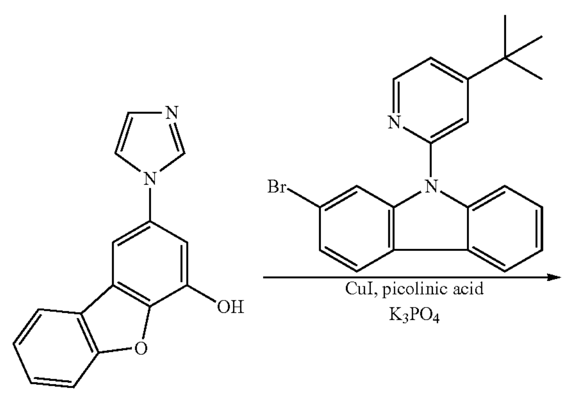

2c

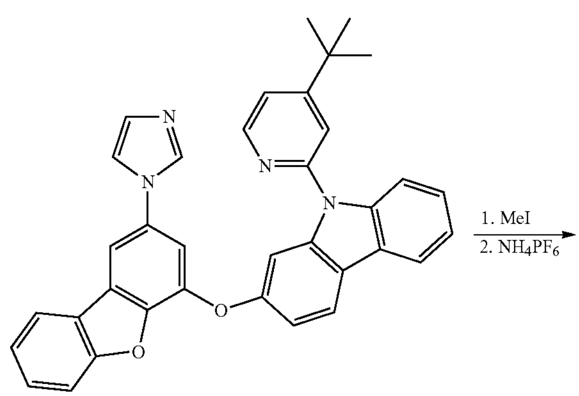

2d

-continued

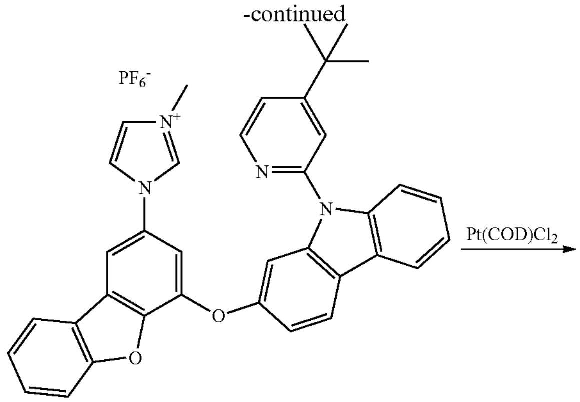
2e

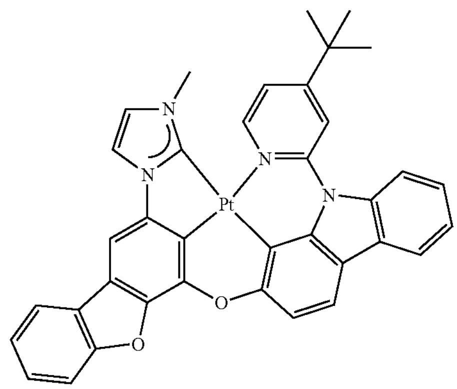
2

(1) Synthesis of Intermediate 2b 1.0 g (3.05 mmol) of 1a (2-iodo-4-methoxydibenzo[b,d]furan), 0.25 g (3.69 mmol) of 1H-imidazole, 0.029 g (0.15 mmol) of CuI, 0.055 g (0.30 mmol) of 1,10-phenanthroline, 0.89 g (6.46 mmol) of $K_2CO_3$, and 5 mL of dimethyl formamide (DMF) were added to a 10 mL Schlenk flask. Then, the mixture was heated under reflux for 2 days at a temperature of 140° C. in a nitrogen atmosphere. The reaction mixture was cooled to room temperature upon completion of the reaction. Then, 100 mL of water was added thereto, and a product was extracted therefrom using ethyl acetate. Then, the resultant was purified through a column (ethyl acetate/n-hexane=1:4) to thereby obtain 0.51 g of Intermediate 2b in the form of light brown powder (yield: 61%). $^1$H NMR ($CD_2Cl_2$, 300 MHz): δ 8.03 (d, J=7.8 Hz, 1H), 7.93 (s, 1H), 7.69 (d, J=8.4 Hz, 1H), 7.62 (sd, J=2.1 Hz, 1H), 7.58 (td, J=7.2, 1.2 Hz, 1H), 7.47-7.42 (m, 2H), 7.23 (s, 1H), 7.07 (sd, J=2.1 Hz, 1H), 4.13 (s, 3H).

(2) Synthesis of Intermediate 2c

This reaction was performed in substantially the same manner as in Synthesis of Intermediate 1c. 1.0 g (3.70 mmol) of Intermediate 2b and 3 mL of HBr (48%) were used to thereby obtain 0.80 g of Intermediate 2c in the form of light brown powder (yield: 86%). $^1$H NMR (DMSO-$d_6$, 300 MHz): δ 8.20 (s, 1H), 8.14 (d, J=7.5 Hz, 1H), 7.86 (sd, J=2.1 Hz, 1H), 7.75 (d, J=8.1 Hz, 1H), 7.72 (s, 1H), 7.57 (td, J=8.4, 1.2 Hz, 1H), 7.44 (t, J=7.5 Hz, 1H), 7.15 (sd, J=1.8 Hz, 1H), 7.13 (s, 1H).

(3) Synthesis of Intermediate 2d 0.32 g (1.28 mmol) of Intermediate 2c, 0.53 g (1.41 mmol) of 2-bromo-9-(4-(tert-butyl)pyridin-2-yl)-9H-carbazole, 0.05 g (0.0026 mmol) of CuI, 0.065 g (0.525 mmol) of picolinic acid, 0.68 g (3.20 mmol) of $K_3PO_4$, and 10 mL of dry DMSO were added to a 100 mL round flask. Then, the mixture was stirred at a temperature of 120° C. for 6 days in a nitrogen atmosphere. Then, the resulting solution was cooled to room temperature. Thereafter, 200 mL of water was added thereto, and a product was extracted therefrom using ethyl acetate (30 mL×3). The resultant was then purified through a column (ethyl acetate/$CH_2Cl_2$=1:3) to thereby obtain 0.36 g of Intermediate 2d in the form of light powder (yield: 51%). $^1$H NMR ($CD_2Cl_2$, 300 MHz): δ 8.56 (dd, J=5.4, 0.6 Hz, 1H), 8.16 (t, J=8.4 Hz, 2H), 8.06 (d, J=7.2 Hz, 1H), 7.87 (s, 1H), 7.82 (d, J=8.1 Hz, 1H), 7.79 (d, J=2.1 Hz, 1H), 7.67-7.63 (m, 2H), 7.61-7.55 (m, 2H), 7.51-7.44 (m, 2H), 7.35 (td, J=7.8, 0.9 Hz, 1H), 7.30 (dd, J=5.4, 1.8 Hz, 1H), 7.23-7.19 (m, 2H), 7.18 (s, 1H), 1.30 (s, 9H).

(4) Synthesis of Intermediate 2e 0.35 g (0.638 mmol) of Intermediate 2d was dissolved in 5 mL of acetone, and 0.04 mL (0.766 mmol) of $CH_3I$ was added to this solution and stirred at room temperature for 3 days. The solvent was removed therefrom, and the resultant was purified through a column (MeOH/$CH_2Cl_2$=1:10) to thereby obtain 0.378 g of a compound in the form of brown powder (yield: 86%). $^1$H NMR ($CD_2Cl_2$, 300 MHz): δ 10.52 (s, 1H), 8.57 (d, J=2.1 Hz, 1H), 8.53 (d, J=5.4 Hz, 1H), 8.23 (d, J=7.5 Hz, 1H), 8.16 (d, J=8.4 Hz, 1H), 8.13 (d, J=7.8 Hz, 1H), 7.75 (d, J=8.1 Hz, 1H), 7.67-7.57 (m, 5H), 7.47 (d, J=7.2 Hz, 2H), 7.42 (t, J=1.8 Hz, 1H), 7.36 (td, J=7.4, 0.9 Hz, 1H), 7.30 (dd, J=5.1, 1.5 Hz, 1H), 7.25 (d, J=2.1 Hz, 1H), 7.19 (dd, J=8.7, 2.4 Hz, 1H), 4.17 (s, H), 1.32 (s, 9H). 0.378 g (0.547 mmol) of the iodine salt compound was dissolved in 50 mL of a reaction mixture of MeOH/$H_2O$ (4:1, v/v), and an excessive amount of $NH_4PF_6$ (0.2 g, 1.23 mmol) was added thereto, followed by stirring at room temperature for 12 hours. The resultant product was purified using 50 mL of water, and a filtration process was performed thereon to thereby obtain 0.342 g of Intermediate 2e in the form of light brown powder (yield: 88%). $^1$H NMR ($CD_2Cl_2$, 300 MHz): δ 8.90 (s, 1H), 8.52 (d, J=5.4 Hz, 1H), 8.17-8.09 (m, 3H), 8.02 (sd, J=2.1 Hz, 1H), 7.53 (d, J=8.1 Hz, 1H), 7.68-7.54 (m, 5H), 7.48 (t, J=7.5 Hz, 2H), 7.38-7.30 (m, 3H), 7.17 (dd, J=8.4, 1.8 Hz, 1H), 7.13 (sd, J=1.8 Hz, 1H), 4.00 (s, 3H), 1.33 (s, 9H).

(5) Synthesis of Compound 2

0.17 g (0.240 mmol) of Intermediate 2-5, 0.1 g (0.267 mmol) of Pt(COD)$Cl_2$, 0.06 g (0.731 mmol) of $CH_3COONa$, and 15 mL of dry tetrahydrofuran (THF) were added to a pressure reactor in a nitrogen atmosphere. Then, the mixture was stirred at a temperature of 120° C. for 3 days. The obtained black suspending solution was filtered to obtain a filtrate. Then filtrate was purified through a column (ethyl acetate/n-hexane=1:2) to thereby obtain 0.1 g of Compound 2 in the form of light yellow powder (yield: 55%). $^1$H NMR ($CD_2Cl_2$, 300 MHz): δ 9.40 (d, J=6.3 Hz, 1H), 8.18 (sd, J=1.8 Hz, 1H), 8.13 (dd, J=6.9, 0.6 Hz, 1H), 8.03 (dq, J=7.8, 0.6 Hz, 1H), 7.98 (d, J=7.8 Hz, 1H), 7.92 (d, J=8.4 Hz, 1H), 7.74 (d, J=8.1 Hz, 1H), 7.61 (sd, J=1.8 Hz, 1H), 7.57 (t, J=7.2 Hz, 2H), 7.52-7.38 (m. 4H), 7.06-7.03 (m, 2H), 3.94

(s, 3H), 1.37 (s, 9H). HR-MS (m/z) for $C_{37}H_{28}N_4O_2Pt$: Theoretical value, 755.19; Experiment value [M+H], 756.18

Synthesis Example 3: Synthesis of Compound 3

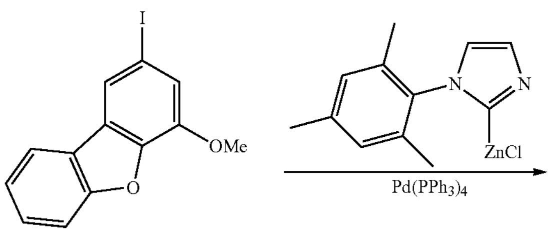

1a

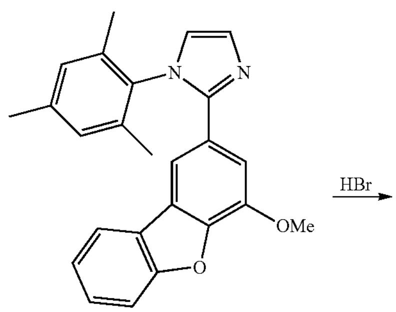

3b

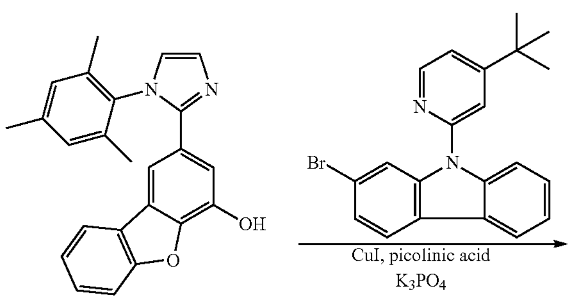

3c

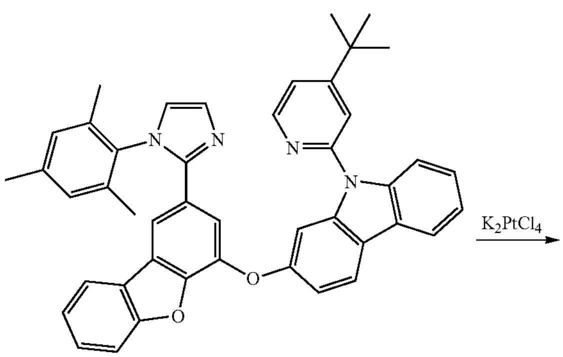

3d

-continued

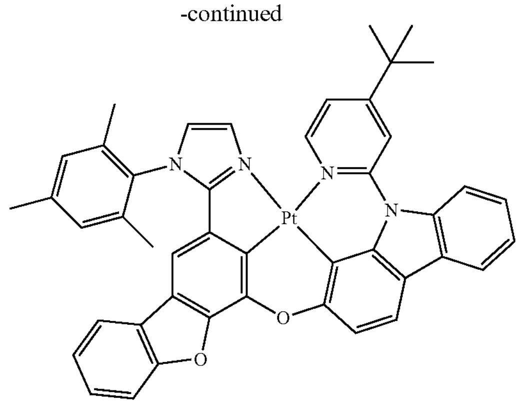

3

(1) Synthesis of Intermediate 3b 1.0 g (5.37 mmol) of 1-mesityl-1H-imidazole and 40 mL of dry THF was added to a 100 mL Schlenk flask. Then, the temperature was lowered to −78° C., and 2.2 mL (5.49 mmol) of n-BuLi (2.5 M in n-hexane) was slowly added thereto. The mixture was stirred at the same temperature for 1 hour and was further stirred at room temperature for 1 hour. This reaction mixture was cooled to a temperature of −78° C. 0.88 g (6.46 mmol) of anhydrous $ZnCl_2$ dissolved in 20 mL of THF was added thereto, and the temperature was raised to room temperature, followed by stirring at room temperature for 1 hour. Once the reaction was complete, THF solvent was removed therefrom, and 1.8 g (5.55 mmol) of 1a, 0.3 g (0.26 mmol) of $Pd(PPh_3)_4$, and 50 mL of dry toluene were added thereto, and the reaction mixture was refluxed for 3 days. Once the reaction was complete, 30 mL of 10% HCl was added thereto, and an extraction process was performed thereon using $CH_2Cl_2$ (30 mL×3), followed by washing with saturated $NaHCO_3$ aqueous solution (30 mL×3). The resultant product was purified through a column (ethyl acetate/n-hexane=1:3) to thereby obtain 1.5 g of Intermediate 3b in the form of light brown powder (yield: 73%). $^1H$ NMR ($CD_2Cl_2$, 300 MHz): δ 8.13 (dd, J=8.1, 1.5 Hz, 2H), 7.90 (d, J=7.2 Hz, 1H), 7.62 (d, J=8.1 Hz, 1H), 7.53 (td, J=7.2, 1.2 Hz, 1H), 7.40 (td, J=7.5, 0.9 Hz, 1H), 6.81 (sd, J=1.5 Hz, 1H), 6.75 (s, 2H), 5.90 (sd, J=1.5 Hz, 1H), 3.56 (s, 3H), 2.18 (s, 3H), 1.33 (s, 9H).

(2) Synthesis of Intermediate 3c

This reaction was performed in substantially the same manner as in Synthesis of Intermediate 1c. 1.5 g (3.92 mmol) of Intermediate 3b and excessive amount of 8 mL of HBr (48%) were used to thereby obtain 1.3 g of Intermediate 3c in the form of gray powder (yield: 90%). $^1H$ NMR (DMSO-de, 300 MHz): δ 10.87 (s, 1H), 8.10 (s, 1H), 8.03 (d, J=7.8 Hz, 1H), 7.94 (sd, J=1.2 Hz, 1H), 7.81 (s, 1H), 7.76 (d, J=8.1 Hz, 1H), 7.59 (t, J=7.5 Hz, 1H), 7.46 (t, J=7.5 Hz, 1H), 7.12 (s, 2H), 6.83 (s, 1H), 2.31 (s, 3H), 1.97 (s, 6H).

(3) Synthesis of Intermediate 3d 0.1 g (0.525 mmol) of CuI, 0.13 g (1.06 mmol) of picolinic acid, 0.52 g (2.45 mmol) of $K_3PO_4$, and 10 mL of dry DMSO were added to 100 mL Schlenk flask, followed by stirring at room temperature for 2 hours. 0.3 g (0.814 mmol) of Intermediate 3c and 0.35 g (0.923 mmol) of 2-bromo-9-(4-(tert-butyl)pyridin-2-yl)-9H-carbazole were dissolved in 10 mL of dry DMSO and added thereto, followed by stirring at a temperature of 120° C. for 3 days in a nitrogen atmosphere. The reaction solution was cooled to room temperature, and then, 100 mL of water was added thereto, and a product was extracted therefrom using ethyl acetate (30 mL×3). Then, the resultant product was purified through a column (ethyl acetate/n-hexane=1:2) to thereby obtain 0.2 g of Intermediate 3d (yield: 37%). $^{1}$H NMR ($CD_2Cl_2$, 300 MHz): δ 8.57 (dd, J=5.4, 0.6 Hz, 1H), 8.18 (dq, J=7.8, 0.6 Hz, 1H), 8.11 (s, 1H), 8.09 (d, J=6.3 Hz, 1H), 7.95 (dq, J=7.8, 0.6 Hz, 1H), 7.89 (dt, J=8.1, 0.6 Hz, 1H), 7.62 (dt, J=7.8, 0.6 Hz, 1H), 7.55-7.37 (m, 5H), 732-7.26 (m, 3H), 6.98 (dd, J=8.4, 2.1 Hz, 1H), 6.89 (sd, J=1.2 Hz, 1H), 6.85 (sd, J=1.5 Hz, 1H), 6.66 (s, 2H), 2.02 (s, 3H), 1.75 (s, 6H), 1.23 (s, 9H).

(4) Synthesis of Compound 3

Compound 3 was synthesized in substantially the same manner as in Synthesis of Compound 1. 0.34 g (0.51 mmol) of Intermediate 3d, 0.25 g (0.601 mmol) of $K_2PtCl_4$, 0.02 g (0.062 mmol) of n-$Bu_4NBr$, and 20 mL of degassed $CH_3COOH$ were used, and after purification using a column (ethyl acetate/n-hexane=1:3), 0.24 g of Compound 3 in a light yellow crystalline form was obtained (yield: 55%). $^{1}$H NMR ($CD_2Cl_2$, 300 MHz): δ 8.38 (d, J=6.3 Hz, 1H), 8.28 (sd, J=1.8 Hz, 1H), 8.13 (dd, J=7.5, 0.9 Hz, 1H), 8.03 (d, J=8.1 Hz, 1H), 7.88 (d, J=8.4 Hz, 1H), 7.67 (d, J=8.1 Hz, 1H), 7.55-7.43 (m, 6H), 7.32-7.26 (m, 3H), 7.24 (s, 2H), 7.16 (sd, J=1.5 Hz, 1H), 6.66 (s, 1H), 2.56 (s, 3H), 2.11 (s, 6H), 1.46 (s, 9H). HR-MS (m/z) for $C_{45}H_{36}N_4O_2Pt$: Theoretical value, 859.25; Experiment value [M+H], 860.24.

Evaluation Example: Evaluation of Emission Wavelength and Luminescence Efficiency Example 1

A solution having a concentration of 20 μM was prepared using methylene chloride (MC), and a photoluminescence (PL) spectrum and a photoluminescence quantum yield (PLQY, $\varphi_{PL}$) of Compound 1 in a solution state were obtained by 320 nm excitation in a nitrogen atmosphere. The results thereof are shown in Table 2 and FIG. 2.

Example 2

A solution having a concentration of 20 μM was prepared using MC, and a PL spectrum and a PLQY ($\varphi_{PL}$) of Compound 2 in a solution state were obtained by 360 nm excitation in a nitrogen atmosphere. The results thereof are shown in Table 2 and FIG. 3.

Example 3

A solution having a concentration of 20 μM was prepared using MC, and a PL spectrum and a PLQY ($\varphi_{PL}$) of Compound 3 in a solution state were obtained by 360 nm excitation in a nitrogen atmosphere. The results thereof are shown in Table 2 and FIG. 4.

Comparative Example 1

Figure 5:
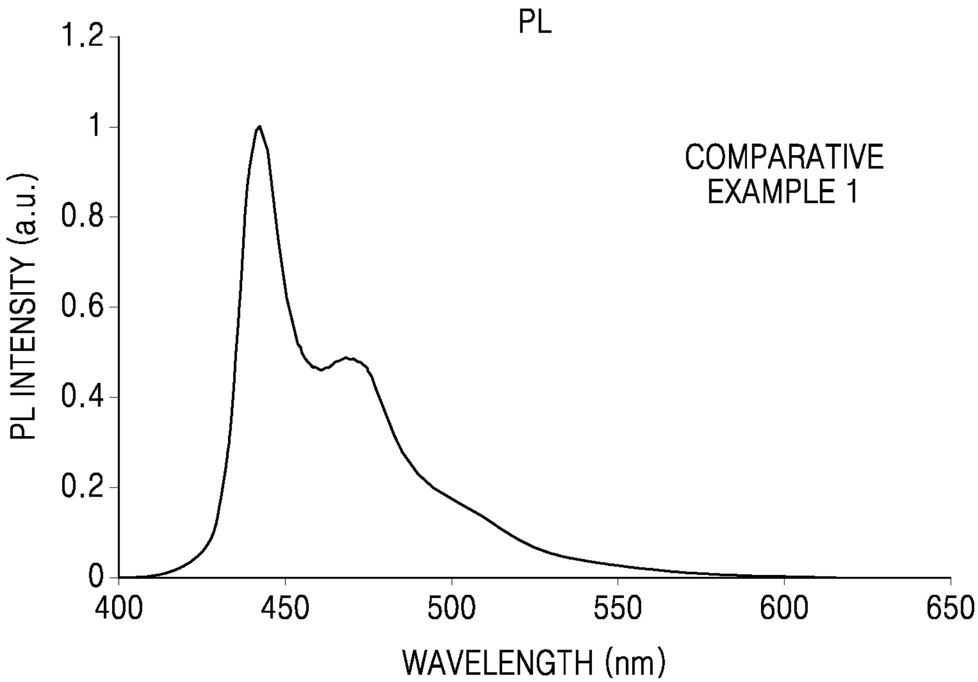
FIG. 5 shows a photoluminescence spectrum and of Comparative Compound 1 in a solution obtained by 320 nm excitation.

A solution having a concentration of 20 μM was prepared using MC, and a PL spectrum and a PLQY ($\varphi_{PL}$) of Compound A in a solution state were obtained by 320 nm excitation in a nitrogen atmosphere. The results thereof are shown in Table 2 and FIG. 5.

Comparative Examples 2 and 3

A solution having a concentration of 20 μM was prepared using MC, and a maximum emission wavelength and a PLQY ($\varphi_{PL}$) of Compounds B3 and B4 in a solution state were obtained by 320 nm excitation in a nitrogen atmosphere. The results thereof are shown in Table 2.

TABLE 2

| | Compound | PL max | $\varphi_{PL}$ | CIEy |
|---|---|---|---|---|
| Example 1 | Compound 1 | 439 nm | 0.712 | 0.075 |
| Example 2 | Compound 2 | 441 nm | 0.738 | 0.074 |
| Example 3 | Compound 3 | 454 nm | 0.670 | 0.211 |
| Comparative Example 1 | Compound A | 442 nm | 0.702 | 0.080 |
| Comparative Example 2 | Compound B3 | 448 nm | 0.07 | — |
| Comparative Example 3 | Compound B4 | 448 nm | 0.51 | — |

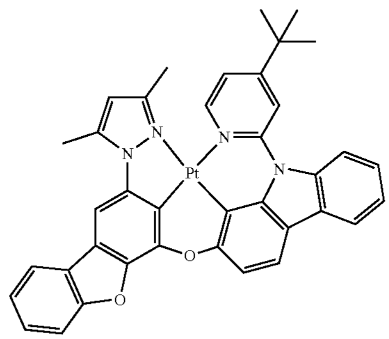

1

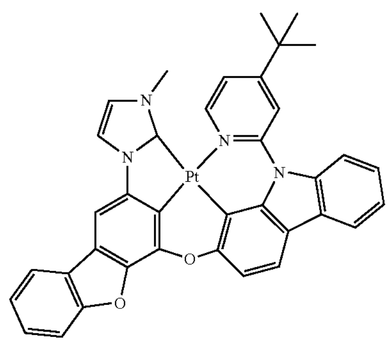

2

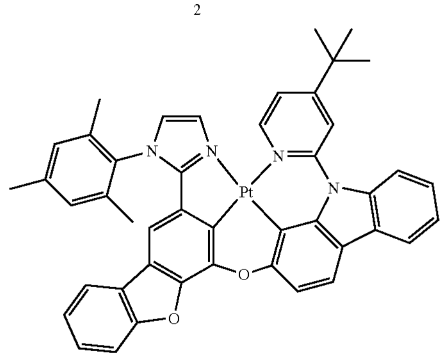

3

TABLE 2-continued

| Compound | PL max | $\varphi_{PL}$ | CIEy |
|---|---|---|---|
| 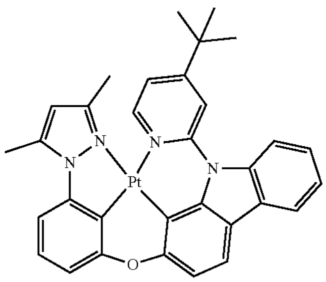 A | | | |
| 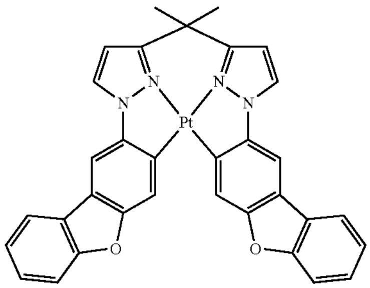 B3 | | | |
| 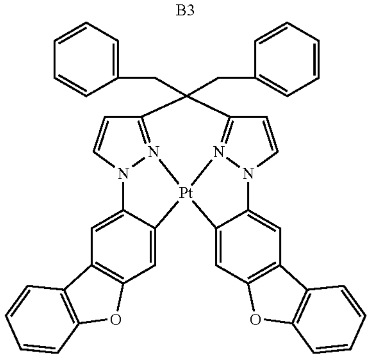 B4 | | | |

Figure 2:
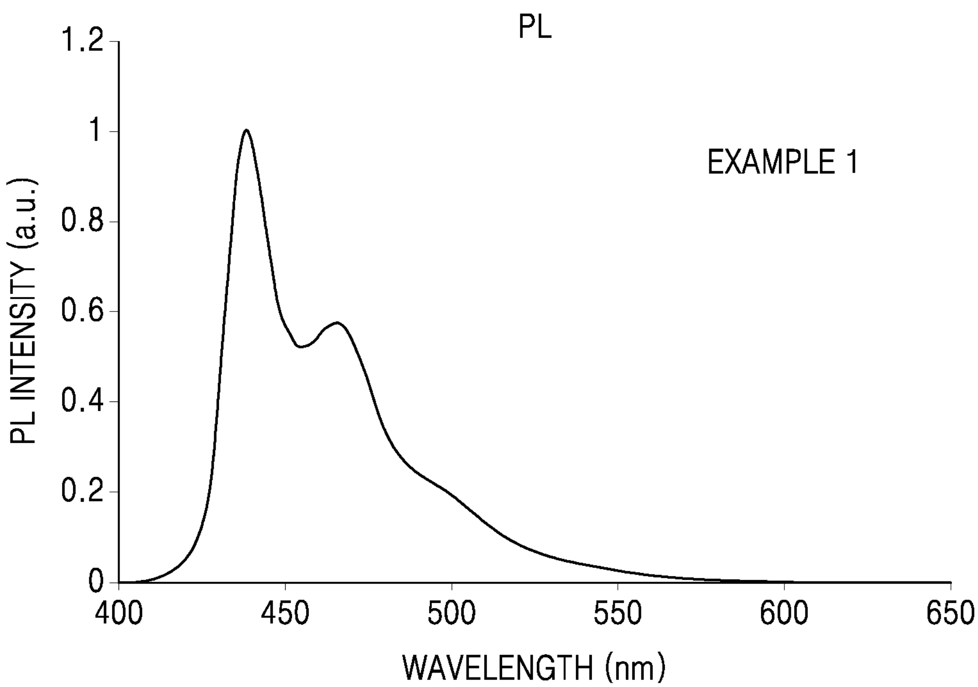
FIG. 2 shows a photoluminescence spectrum and of Compound 1 in a solution state obtained by 320 nm excitation.
Figure 3:
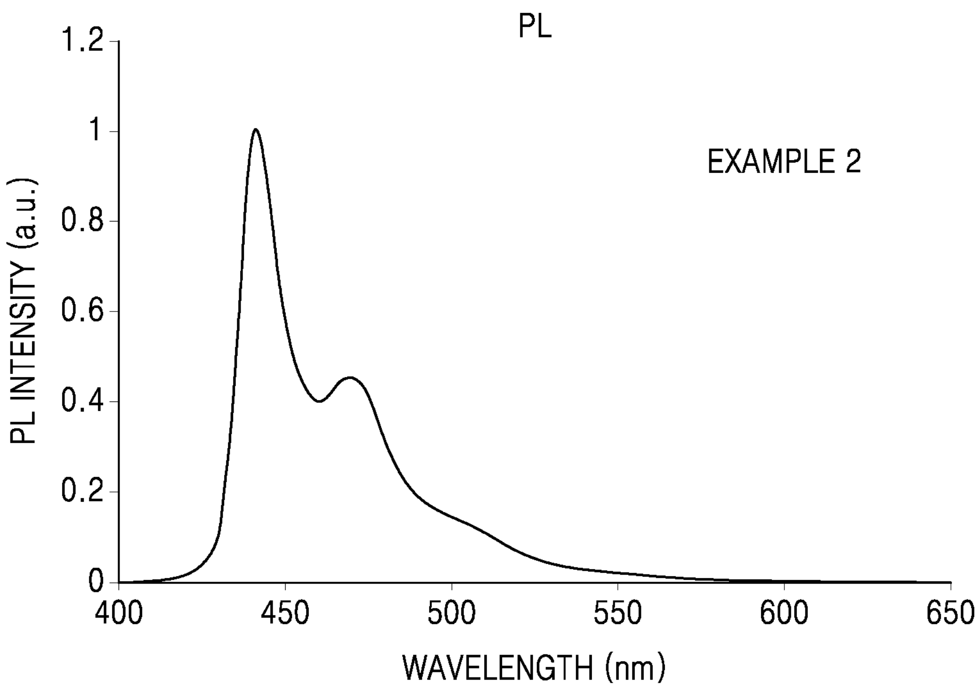
FIG. 3 shows a photoluminescence spectrum and of Compound 2 in a solution state obtained by 360 nm excitation.
Figure 4:
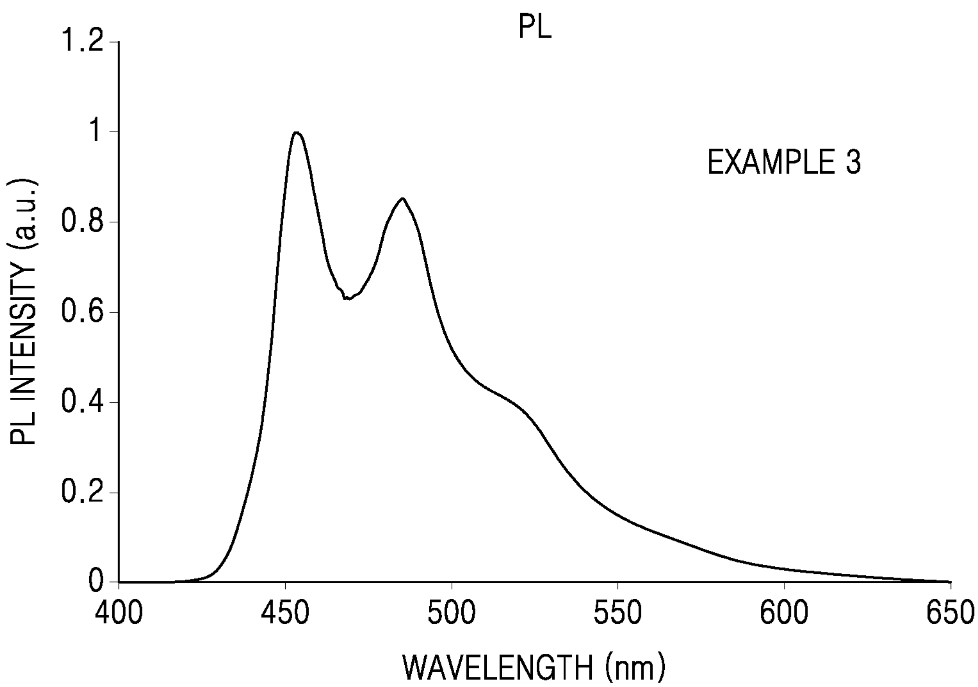
FIG. 4 shows a photoluminescence spectrum and of Compound 4 in a solution state obtained by 360 nm excitation.

Referring to the results of Table 2 and FIGS. 2 to 4, the organometallic compound according to one or more embodiments was found to be suitable for blue light emission and have excellent luminescence quantum efficiency. In addition, the organometallic compound according to one or more embodiments was found to have improved luminescence quantum efficiency, as compared with Compounds A, B3, and B4.

The organometallic compound is excellent in luminescence efficiency and emits deep blue light emission. Such organometallic compounds have excellent phosphorescent luminescent characteristics, and thus, when used, a diagnostic composition having a high diagnostic efficiency may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organometallic compound represented by Formula 1:

$$M_1(L_{11})_{n11}(L_{12})_{n12} \qquad \text{Formula 1}$$

wherein, in Formula 1, $M_1$ is a Period 1 transition metal, a Period 2 transition metal, or a Period 3 transition metal, $L_{11}$ is a ligand represented by Formula 1-1, $L_{12}$ is a monodentate ligand or a bidentate ligand, n11 is 1, and n12 is 0, 1, or 2:

Formula 1-1

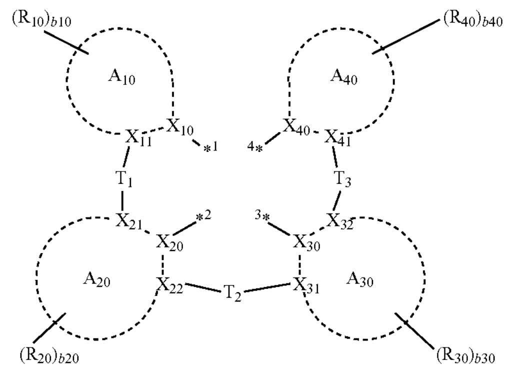

Formula 1-1A

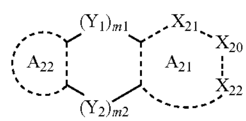

Formula 1-1B

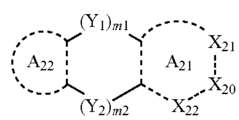

wherein in Formulae 1, 1-1, 1-1A, and 1-1B,

*1 to *4 each independently indicate a binding site to $M_1$, $A_{10}$, $A_{30}$, and $A_{40}$ are each independently a $C_5$-$C_{30}$ carbocyclic group or a $C_1$-$C_{30}$ heterocyclic group, $A_{20}$ is a group represented by one of Formulae 1-1A or 1-1B, $A_{21}$ and $A_{22}$ are each independently a benzene group, a naphthalene group, a pyridine group, a pyrimidine group, or a triazine group, $X_{10}$, $X_{11}$, $X_{20}$ to $X_{22}$, $X_{30}$ to $X_{32}$, $X_{40}$, and $X_{41}$ are each independently C or N, $Y_1$ and $Y_2$ are each independently *—O—*', *—S—*', *—N($R_{21}$)—*', *—C($R_{21}$)($R_{22}$)—*', *—Si($R_{21}$)($R_{22}$)—*', *—Ge($R_{21}$)($R_{22}$)—*', or *—Se—*', m1 and m2 are each independently 0 or 1, wherein m1+m2=1, when m1 is 0, $Y_1$ is a single bond, when m2 is 0, $Y_2$ is a single bond, $T_1$ to $T_3$ are each independently a single bond, *—N[($L_1$)$_{a1}$-($R_1$)$_{b1}$]—*', *—B($R_1$)—*', *—P($R_1$)—*', *—C($R_1$)($R_2$)—*', *—Si($R_1$)($R_2$)—*', *—Ge($R_1$)($R_2$)—*', *—S—*', *—Se—*', *—O—*', *—C(=O)—*', *—S(=O)—*', *—S(=O)$_2$*', *—C($R_1$)=C($R_2$)—*', *—C(=S)—*', or *—C≡C—*', $L_1$ is a single bond, a substituted or unsubstituted $C_5$-$C_{30}$ carbocyclic group, or a substituted or unsubstituted $C_1$-$C_{30}$ heterocyclic group, a1 is an integer from 1 to 3, and when a1 is 2 or more, two or more of $L_1$(s) are identical to or different from each other, $R_1$, $R_2$, $R_{10}$, $R_{20}$ to $R_{22}$, $R_{30}$, and $R_{40}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$, two of $R_1$, $R_2$, $R_{10}$, $R_{20}$ to $R_{22}$, $R_{30}$, and $R_{40}$ are optionally bound to form a substituted or unsubstituted $C_5$-$C_{30}$ carbocyclic group or a substituted or unsubstituted $C_1$-$C_{30}$ heterocyclic group, b1 is an integer from 1 to 5, and when b1 is 2 or more, two or more of $R_1$(s) are identical to or different from each other, b10, b20, b30, and b40 are each independently an integer from 1 to 10, when b10 is 2 or more, two or more of $R_{10}$(s) are identical to or different from each other, when b20 is 2 or more, two or more of $R_{20}$(s) are identical to or different from each other, when b30 is 2 or more, two or more of $R_{30}$(s) are identical to or different from each other, when b40 is 2 or more, two or more of $R_{40}$(s) are identical to or different from each other, and at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a combination thereof;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a combination thereof, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, —$P(=O)(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or a combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or a combination thereof, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, —$P(=O)(Q_{28})(Q_{29})$, or a combination thereof; or —$N(Q_{31})(Q_{32})$, —$Si(Q_{33})(Q_{34})(Q_{35})$, —$B(Q_{36})(Q_{37})$, —$P(=O)(Q_{38})(Q_{39})$, or a combination thereof, wherein $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryl group substituted with at least one a $C_1$-$C_{60}$ alkyl group, a $C_6$-$C_{60}$ aryl group, or a combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

2. The organic light-emitting device of claim 1, wherein $M_1$ is Pt, Pd, or Au.

3. The organic light-emitting device of claim 1, wherein $A_{10}$, $A_{30}$, and $A_{40}$ are each independently a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, an indazole group, a benzoxazole group, a benzothiazole group, a benzoxadiazole group, a benzothiadiazole group, a benzotriazole group, a diazaindene group, a triazaindene group, a 5,6,7,8-tetrahydroisoquinoline group, or a 5,6,7,8-tetrahydroquinoline group.

4. The organic light-emitting device of claim 1, wherein

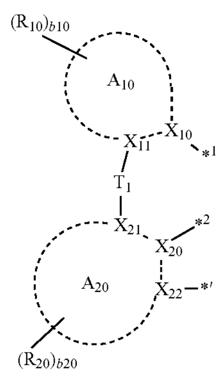

moiety in Formula 1-1 is one of Formulae 4-1 to 4-8:

4-1

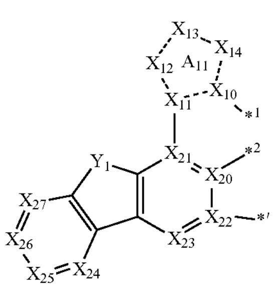

-continued 4-2

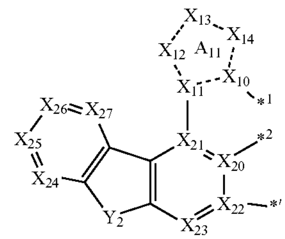

4-3

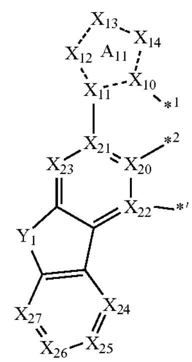

4-4

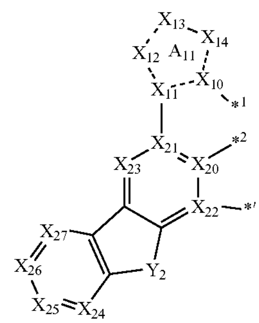

4-5

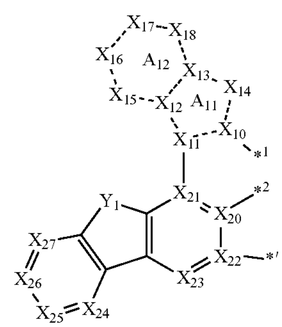

4-6

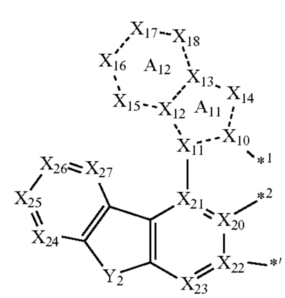

-continued 4-7

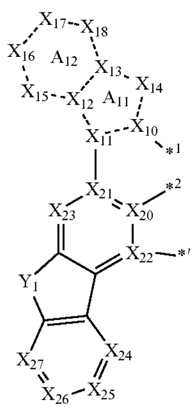

4-8

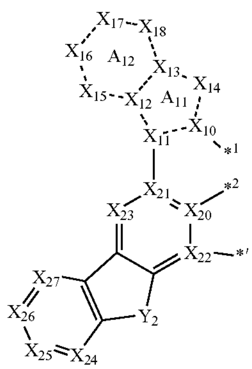

wherein, in Formulae 4-1 to 4-8, $X_{10}$, $X_{11}$, and $X_{20}$ to $X_{22}$ are defined the same as $X_{10}$, $X_{11}$, and $X_{20}$ to $X_{22}$ in claim 1, $A_{11}$ is a 5-membered heterocyclic group, $A_{12}$ is a 6-membered carbocyclic group or a 6-membered heterocyclic group, $X_{12}$ is N or $C(R_{12})$, $X_{13}$ is N or $C(R_{13})$, $X_{14}$ is N or $C(R_{14})$, $X_{15}$ is N or $C(R_{15})$, $X_{16}$ is N or $C(R_{16})$, $X_{17}$ is N or $C(R_{17})$, and $X_{18}$ is N or $C(R_{18})$, $X_{23}$ is N or $C(R_{23})$, $X_{24}$ is N or $C(R_{24})$, $X_{25}$ is N or $C(R_{25})$, $X_{26}$ is N or $C(R_{26})$, and $X_{27}$ is N or $C(R_{27})$, $R_{12}$ to $R_{18}$ are each independently defined the same as $R_{10}$ in claim 1, and $R_{23}$ to $R_{27}$ are each independently defined the same as $R_{20}$ in claim 1.

5. The organic light-emitting device of claim 1, wherein $A_{20}$ is Formulae 2-2A or 2-2B:

Formula 2-2A

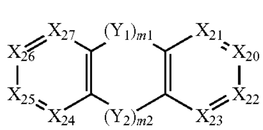

Formula 2-2B

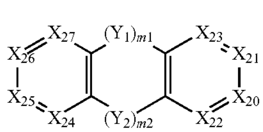

wherein in Formulae 2-2A and 2-2B, $X_{20}$ to $X_{22}$, $Y_1$, $Y_2$, m1, and m2 are each independently defined the same as $X_{20}$ to $X_{22}$, $Y_1$, $Y_2$, m1, and m2 in claim 1, $X_{23}$ is N or $C(R_{23})$, $X_{24}$ is N or $C(R_{24})$, $X_{25}$ is N or $C(R_{25})$, $X_{26}$ is N or $C(R_{26})$, and $X_{27}$ is N or $C(R_{27})$, and $R_{23}$ to $R_{27}$ are each independently defined the same as $R_{20}$ in claim 1.

6. The organic light-emitting device of claim 1, wherein $X_{10}$ is N or C, $X_{20}$ and $X_{30}$ are each C, and $X_{40}$ is N.

7. The organic light-emitting device of claim 1, wherein a bond between $M_1$ and $X_{10}$ is a coordinate bond, a bond between $M_1$ and $X_{20}$ is a covalent bond, a bond between $M_1$ and $X_{30}$ is a covalent bond, and a bond between M and $X_{40}$ is a coordinate bond.

8. The organic light-emitting device of claim 1, wherein $T_1$ to $T_3$ are each independently a single bond, *—N[$(L_1)_{a1}$-$(R_1)_{b1}$]—*', *—C($R_1$)($R_2$)—*', *—Si($R_1$)($R_2$)—*', *—O—*', or *—S—*'.

9. The organic light-emitting device of claim 1, wherein $L_1$ is selected from the group consisting of:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or a combination thereof.

10. The organic light-emitting device of claim 1, wherein $R_1$, $R_2$, $R_{10}$, $R_{20}$ to $R_{22}$, $R_{30}$, $R_{40}$, and $R_{50}$ are each independently hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, a group represented by one of Formulae 9-1 to 9-19, or a group represented by one of Formulae 10-1 to 10-194:

9-1

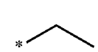

9-2

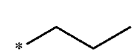

9-3

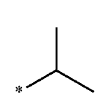

-continued
9-4
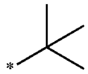
9-5
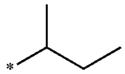
9-6
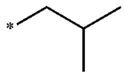
9-7
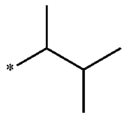
9-8
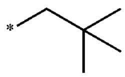
9-9
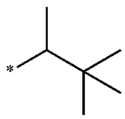
9-10
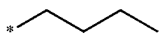
9-11
9-12
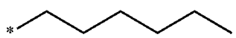
9-13
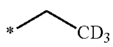
9-14
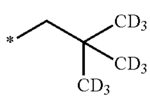
9-15
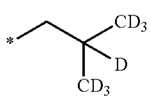
9--16
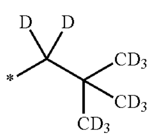
9-17
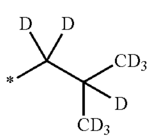
9-18
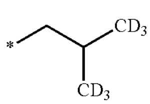
9-19
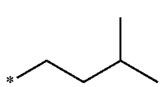
10-1
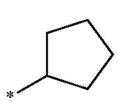
-continued
10-2
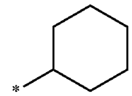
10-3
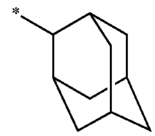
10-4
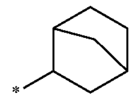
10-5
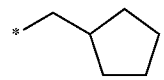
10-6
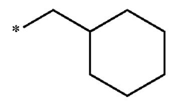
10-7
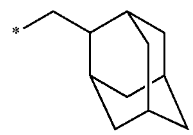
10-8
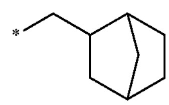
10-9
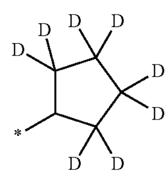
10-10
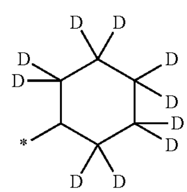
10-11
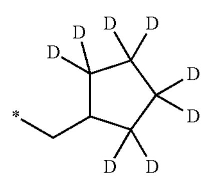
10-12
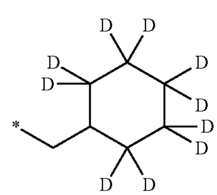

-continued
10-13
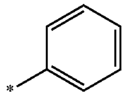
10-14
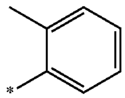
10-15
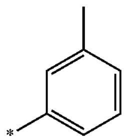
10-16
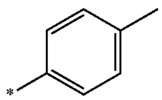
10-17
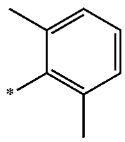
10-18
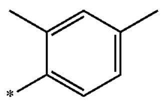
10-19
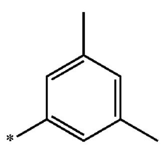
10-20
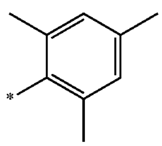
10-21
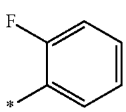
10-22
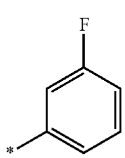
10-23
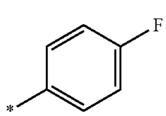
10-24
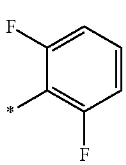
-continued
10-25
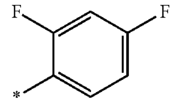
10-26
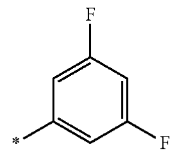
10-27
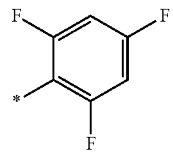
10-28
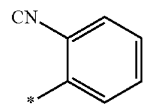
10-29
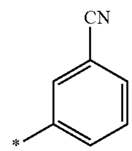
10-30
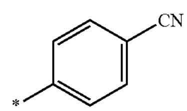
10-31
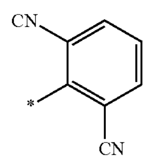
10-32
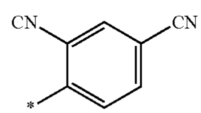
10-33
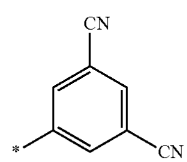
10-34
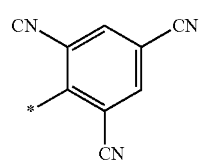
10-35
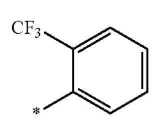

-continued
10-36
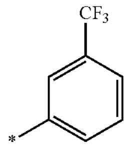
10-37
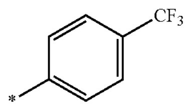
10-38
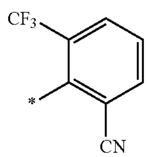
10-39
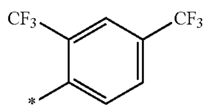
10-40
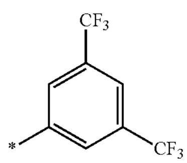
10-41
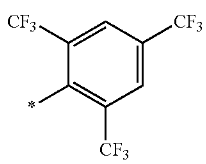
10-42
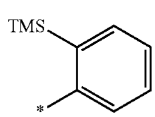
10-43
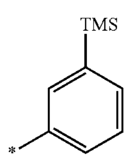
10-44
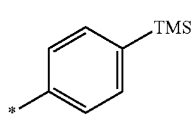
10-45
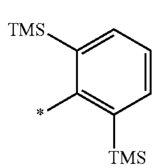
10-46
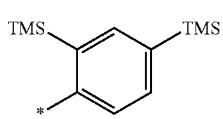
-continued
10-47
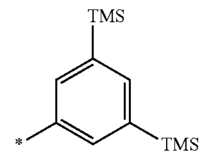
10-48
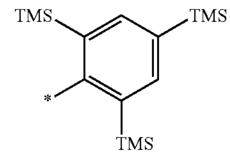
10-49
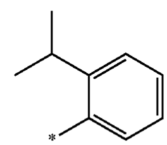
10-50
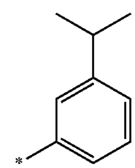
10-51
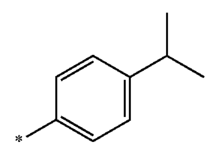
10-52
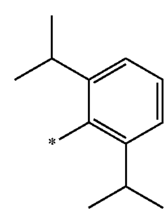
10-53
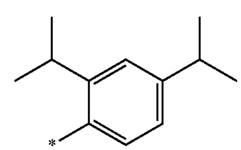
10-54
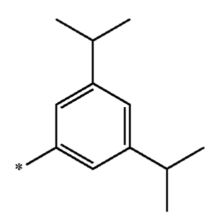
10-55
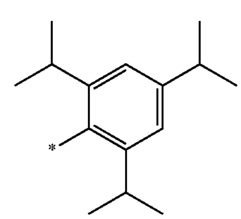

-continued
10-56
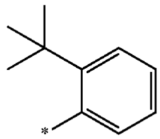
10-57
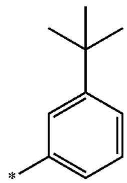
10-58
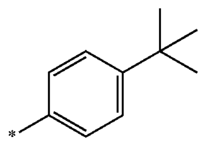
10-59
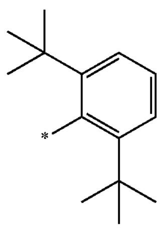
10-60
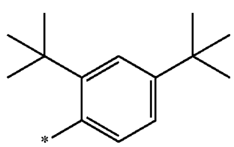
10-61
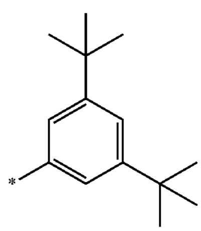
10-62
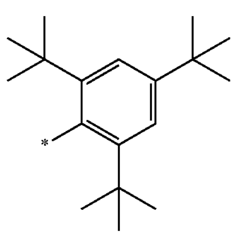
10-63
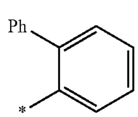
10-64
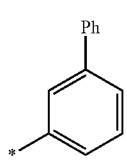
-continued
10-65
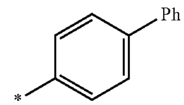
10-66
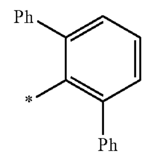
10-67
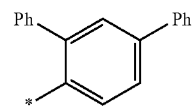
10-68
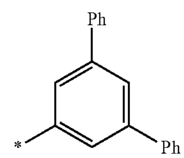
10-69
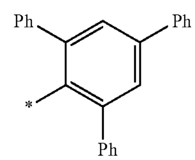
10-70
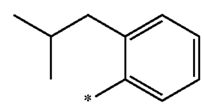
10-71
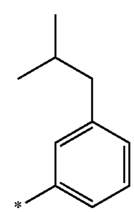
10-72
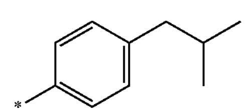
10-73
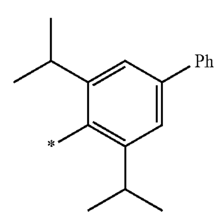
10-74
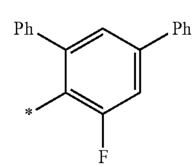

-continued
10-75
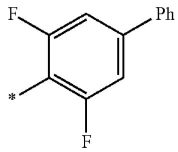
10-76
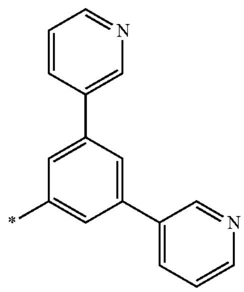
10-77
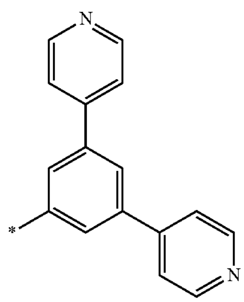
10-78
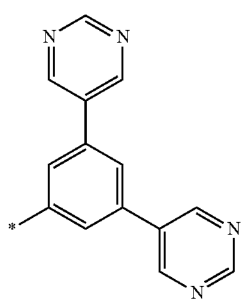
10-79
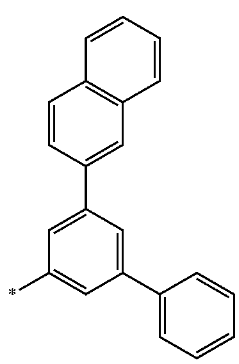
-continued
10-80
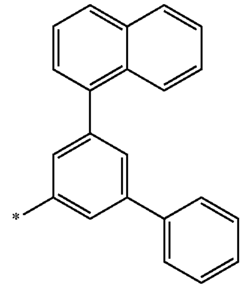
10-81
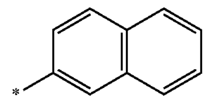
10-82
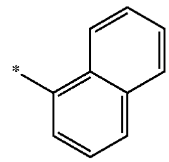
10-83
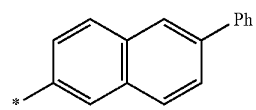
10-84
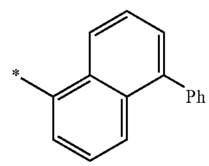
10-85
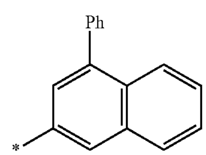
10-86
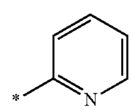
10-87
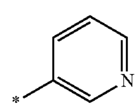
10-88
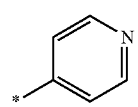
10-89
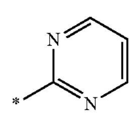
10-90
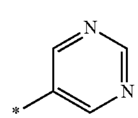

-continued
10-91
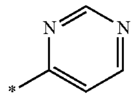
10-92
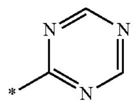
10-93
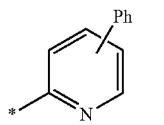
10-94
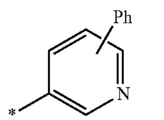
10-95
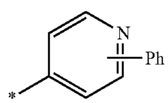
10-96
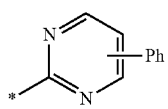
10-97
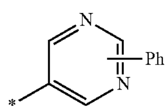
10-98
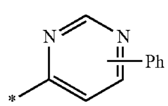
10-99
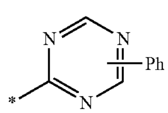
10-100
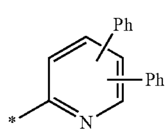
10-101
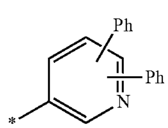
10-102
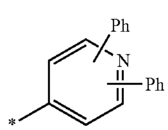
10-103
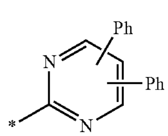
-continued
10-104
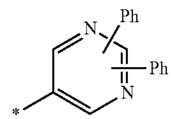
10-105
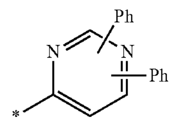
10-106
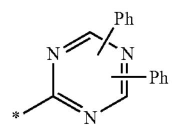
10-107
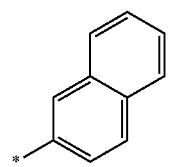
10-108
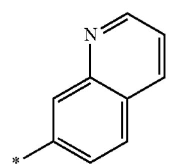
10-109
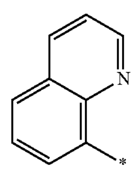
10-110
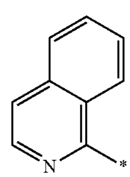
10-111
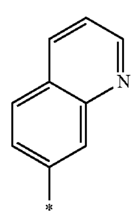
10-112
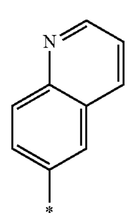

-continued
10-113
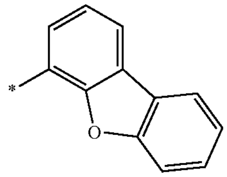
10-114
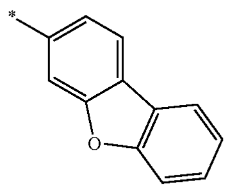
10-115
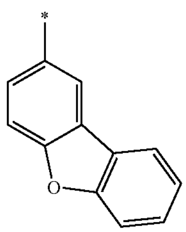
10-116
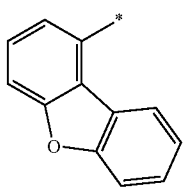
10-117
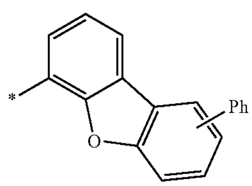
10-118
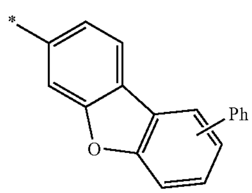
10-119
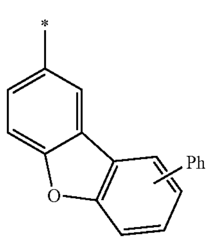
10-120
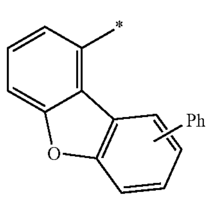
-continued
10-121
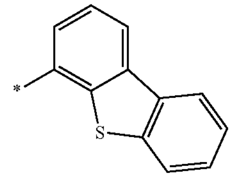
10-122
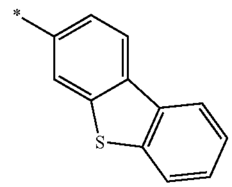
10-123
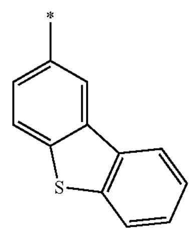
10-124
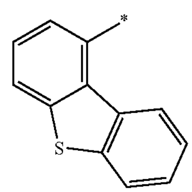
10-125
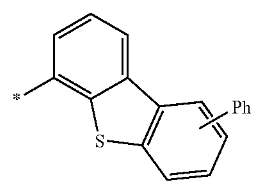
10-126
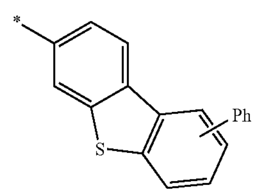
10-127
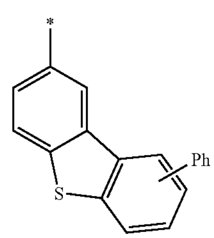
10-128
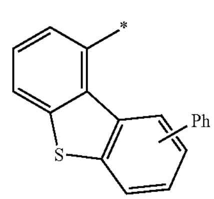

10-129
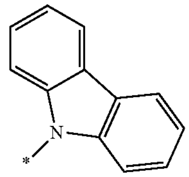
10-130
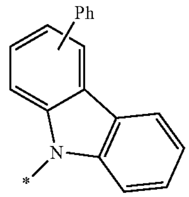
10-131
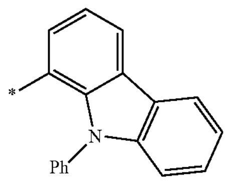
10-132
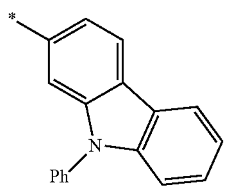
10-133
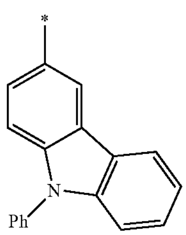
10-134
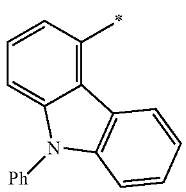
10-135
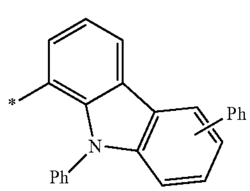
10-136
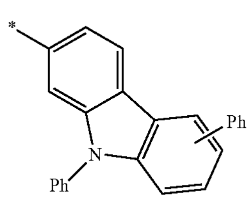
10-137
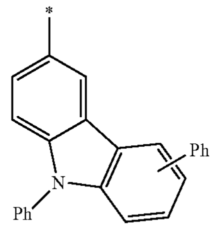
10-138
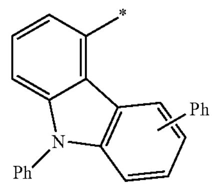
10-139
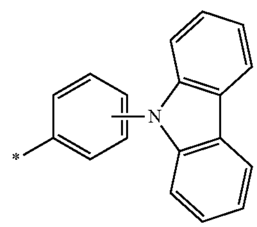
10-140
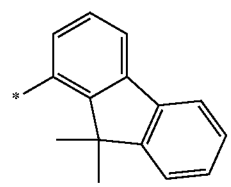
10-141
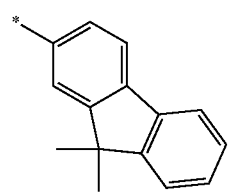
10-142
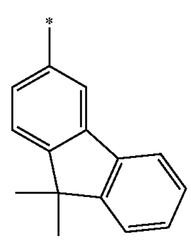
10-143
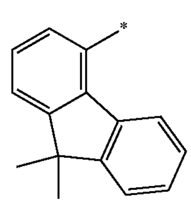

-continued
10-144
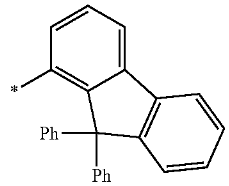
10-145
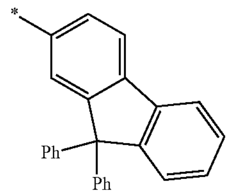
10-146
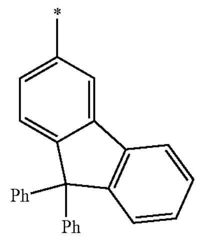
10-147
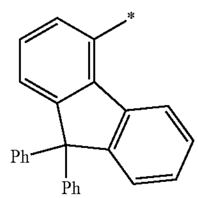
10-148
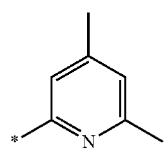
10-149
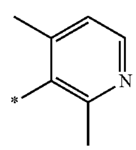
10-150
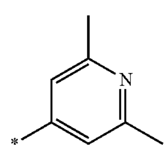
10-151
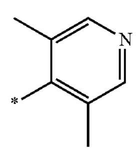
10-152
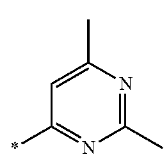
-continued
10-153
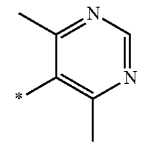
10-154
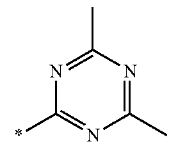
10-155
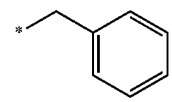
10-156
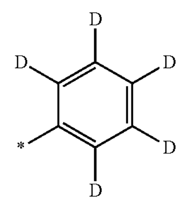
10-157
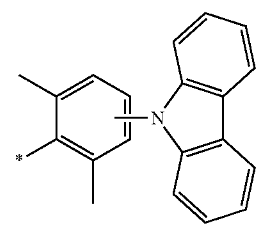
10-158
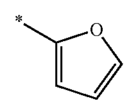
10-159
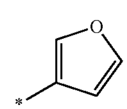
10-160
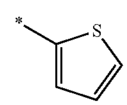
10-161
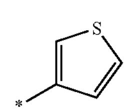
10-162
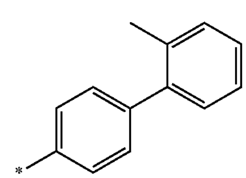

-continued
10-163
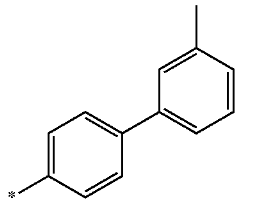
10-164
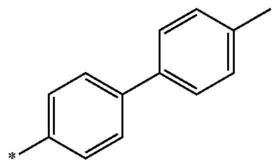
10-165
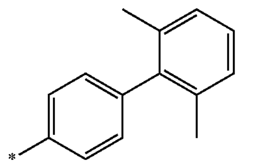
10-166
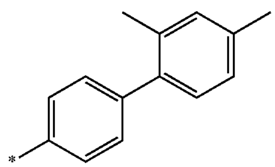
10-167
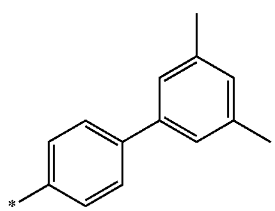
10-168
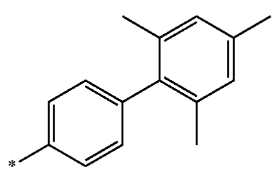
10-169
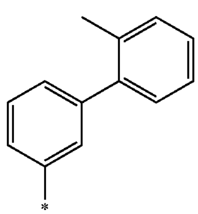
10-170
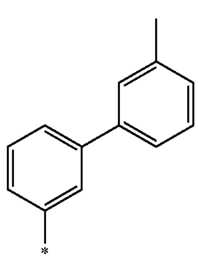
-continued
10-171
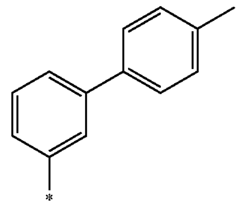
10-172
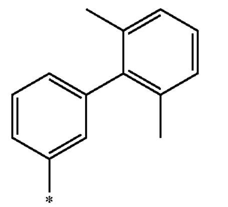
10-173
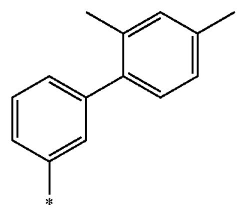
10-174
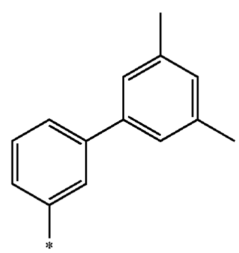
10-175
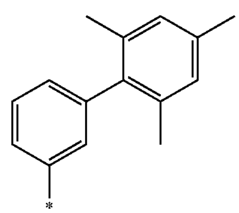
10-176
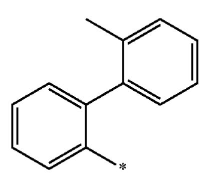
10-177
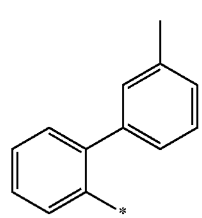

-continued 10-178

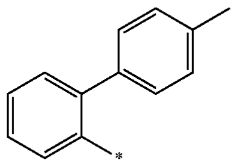

10-179

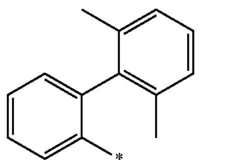

10-180

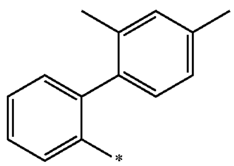

10-181

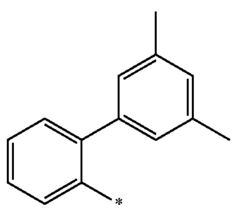

10-182

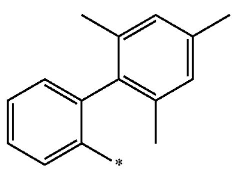

10-183

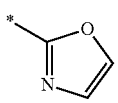

10-184

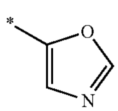

10-185

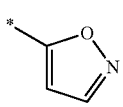

10-186

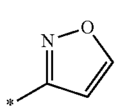

10-187

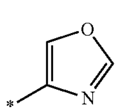

10-188

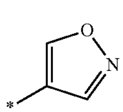

-continued 10-189

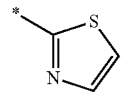

10-190

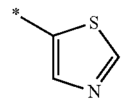

10-191

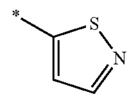

10-192

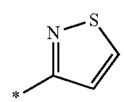

10-193

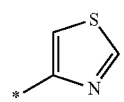

10-194

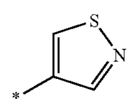

wherein, in Formulae 9-1 to 9-19 and 10-1 to 10-194, * indicates a binding site to an adjacent atom, "Ph" represents a phenyl group, and "TMS" represents a trimethylsilyl group.

11. The organic light-emitting device of claim 1, wherein the organometallic compound represented by Formula 1 is asymmetric.

12. The organic light-emitting device of claim 1, wherein the organometallic compound represented by Formula 1 is represented by one of Formulae 11-1 to 11-4:

Formula 11-1

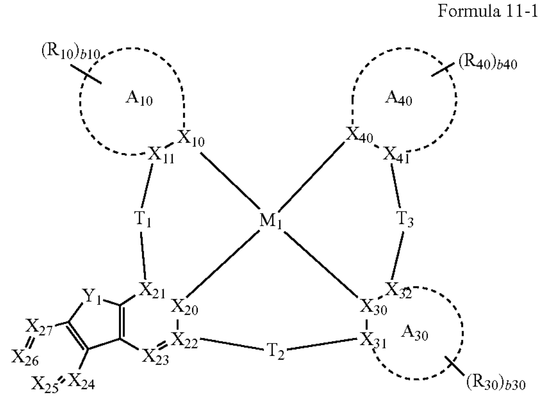

-continued

Formula 11-2

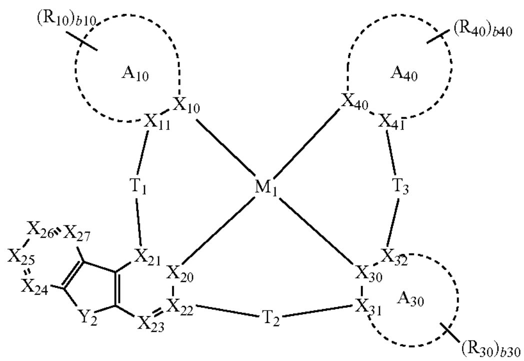

Formula 11-3

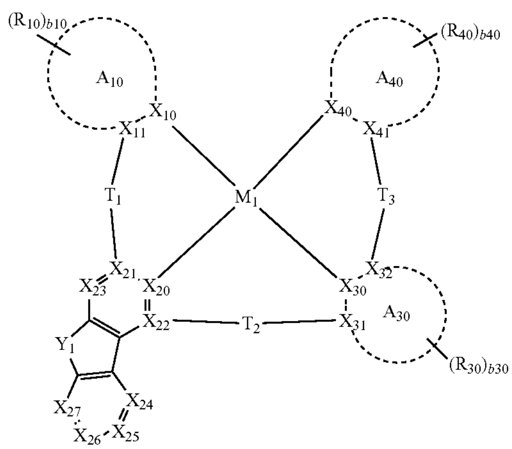

Formula 11-4

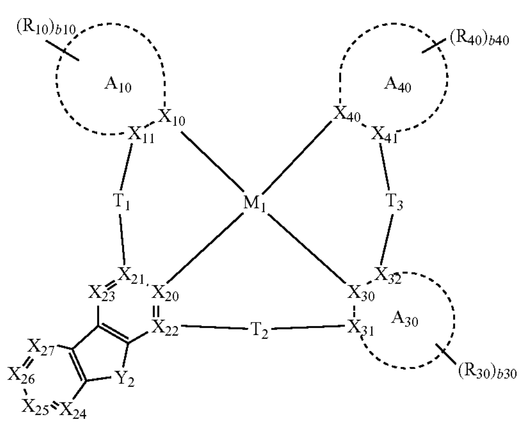

wherein, in Formulae 11-1 to 11-4, $M_1$, $A_{10}$, $A_{30}$, $A_{40}$, $Y_1$, $Y_2$, $X_{10}$, $X_{11}$, $X_{20}$ to $X_{22}$, $X_{30}$ to $X_{32}$, $X_{40}$, $X_{41}$, $T_1$ to $T_3$, $R_{10}$, $R_{30}$, $R_{40}$, b10, b30, and b40 are defined the same as $M_1$, $A_{10}$, $A_{30}$, $A_{40}$, $Y_1$, $Y_2$, $X_{10}$, $X_{11}$, $X_{20}$ to $X_{22}$, $X_{30}$ to $X_{32}$, $X_{40}$, $X_{41}$, $T_1$ to $T_3$, $R_{10}$, $R_{30}$, $R_{40}$, b10, b30, and b40 in claim 1, $X_{23}$ is N or $C(R_{23})$, $X_{24}$ is N or $C(R_{24})$, $X_{25}$ is N or $C(R_{25})$, $X_{26}$ is N or $C(R_{26})$, and $X_{27}$ is N or $C(R_{27})$, and $R_{23}$ to $R_{27}$ are each defined the same as $R_{20}$ in claim 1.

13. The organic light-emitting device of claim 1, wherein the organometallic compound represented by Formula 1 is represented by one of Formulae 12-1 to 12-16:

12-1

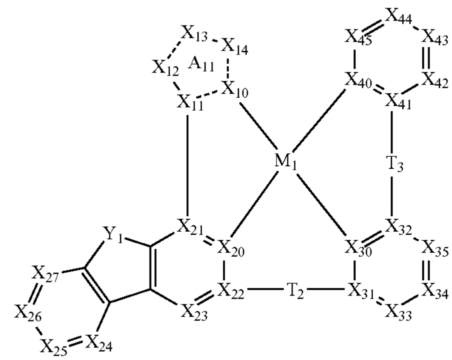

12-2

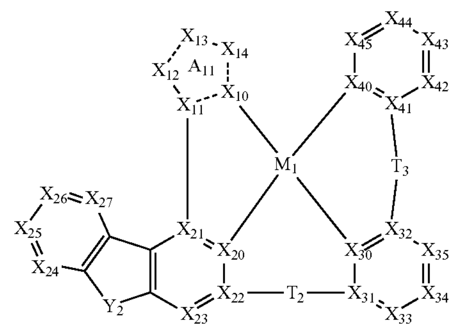

12-3

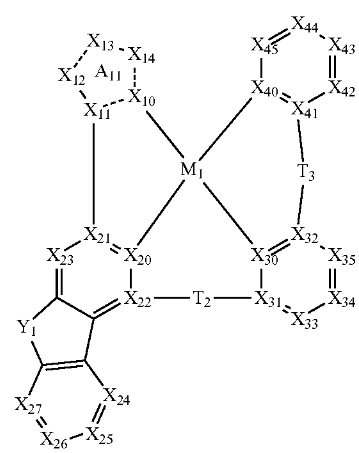

12-4

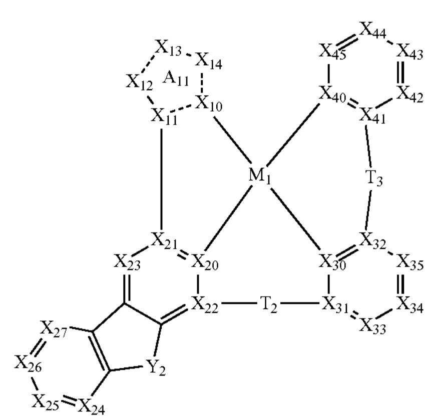

12-5
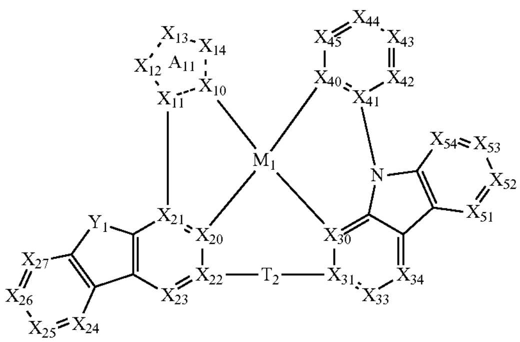
12-6
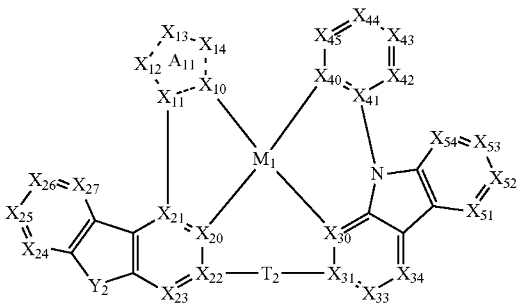
12-7
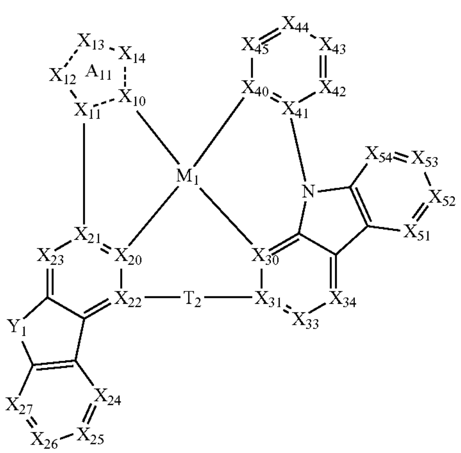
12-8
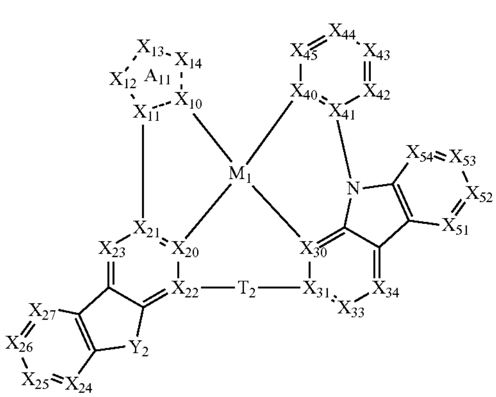
12-9
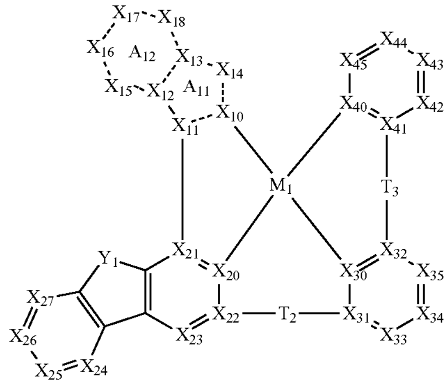
12-10
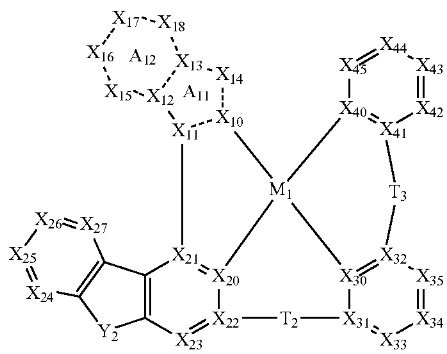
12-11
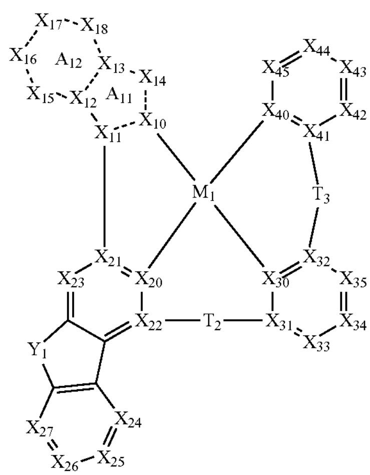
12-12
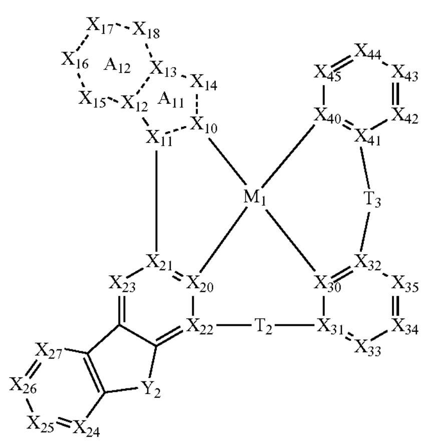

-continued 12-13

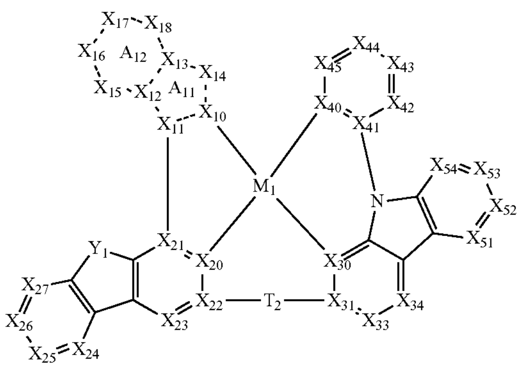

12-14

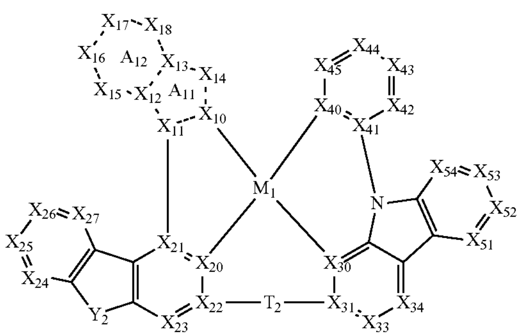

12-15

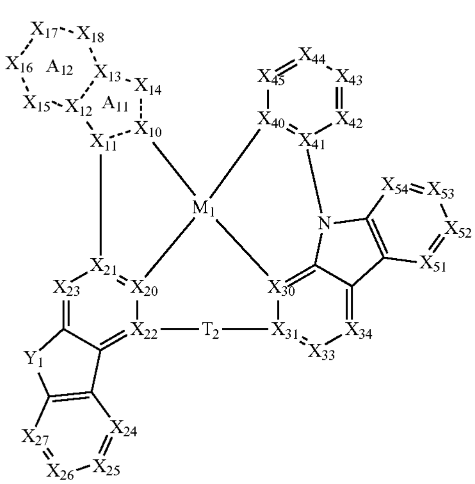

-continued 12-16

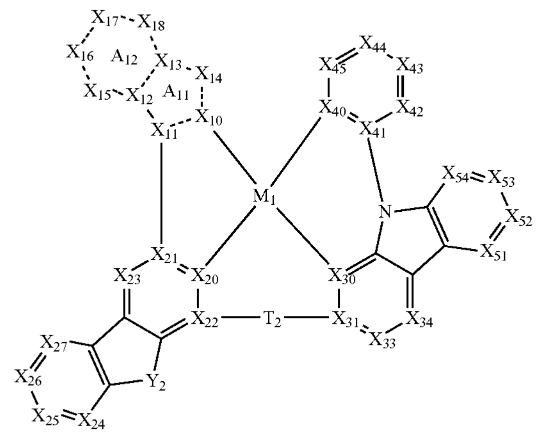

wherein, in Formulae 12-1 to 12-16, $M_1$, $X_{10}$, $X_{11}$, $X_{20}$ to $X_{22}$, $X_{30}$, $X_{31}$, $X_{40}$, and $X_{41}$ are defined the same as $M_1$, $X_{10}$, $X_{11}$, $X_{20}$ to $X_{22}$, $X_{30}$, $X_{31}$, $X_{40}$, and $X_{41}$ in claim 1, $A_{11}$ is a 5-membered heterocyclic group, $A_{12}$ is a 6-membered carbocyclic group or a 6-membered heterocyclic group, $T_2$ is *—O—*' or *—S—*', $T_3$ is a single bond, *—O—*', or *—S—*', $X_{12}$ is N or $C(R_{12})$, $X_{13}$ is N or $C(R_{13})$, $X_{14}$ is N or $C(R_{14})$, $X_{15}$ is N or $C(R_{15})$, $X_{16}$ is N or $C(R_{16})$, $X_{17}$ is N or $C(R_{17})$, and $X_{18}$ is N or $C(R_{18})$, $X_{23}$ is N or $C(R_{23})$, $X_{24}$ is N or $C(R_{24})$, $X_{25}$ is N or $C(R_{25})$, $X_{26}$ is N or $C(R_{26})$, and $X_{27}$ is N or $C(R_{27})$, $X_{33}$ is N or $C(R_{33})$, $X_{34}$ is N or $C(R_{34})$, and $X_{35}$ is N or $C(R_{35})$, $X_{42}$ is N or $C(R_{42})$, $X_{43}$ is N or $C(R_{43})$, $X_{44}$ is N or $C(R_{44})$, and $X_{45}$ is N or $C(R_{45})$, $X_{51}$ is N or $C(R_{51})$, $X_{52}$ is N or $C(R_{52})$, $X_{53}$ is N or $C(R_{53})$, and $X_{54}$ is N or $C(R_{54})$, $R_{12}$ to $R_{18}$ are each independently defined the same as $R_{10}$ in claim 1, $R_{23}$ to $R_{27}$ are each independently defined the same as $R_{20}$ in claim 1, $R_{33}$ to $R_{35}$ are each independently defined the same as $R_{30}$ in claim 1, $R_{42}$ to $R_{45}$ are each independently defined the same as $R_{40}$ in claim 1, and $R_{51}$ to $R_{54}$ are each independently defined the same as $R_{30}$ in claim 1.

14. The organic light-emitting device of claim 1, wherein the organometallic compound is at least one of Compounds 1 to 35:

-continued
1
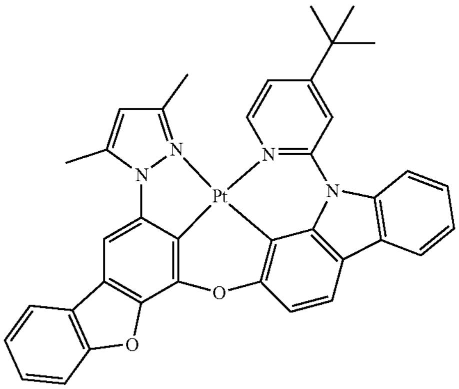
2
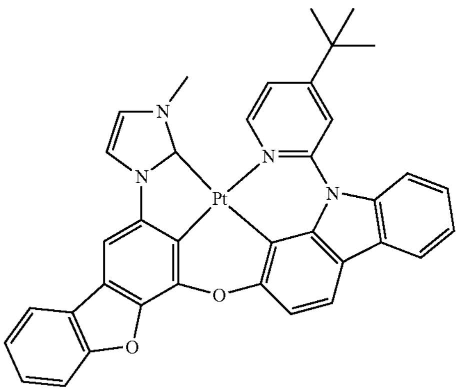
3
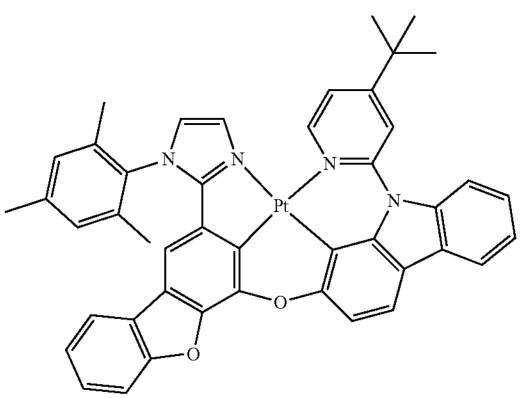
4
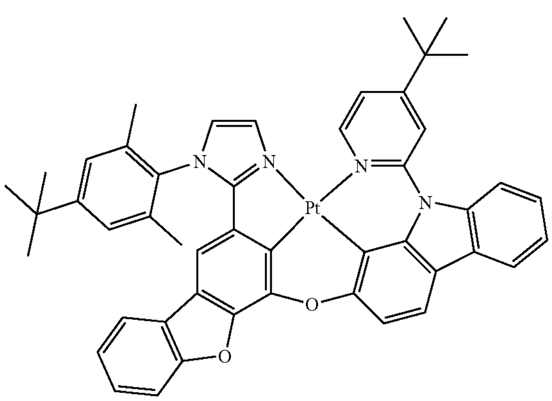
5
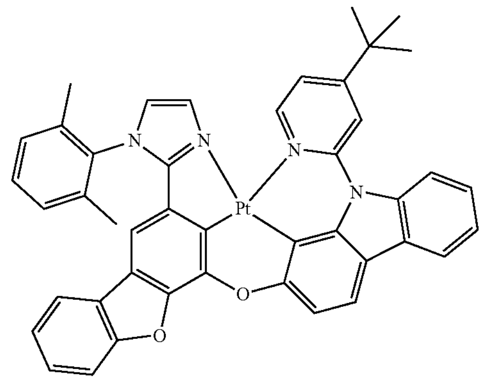
6
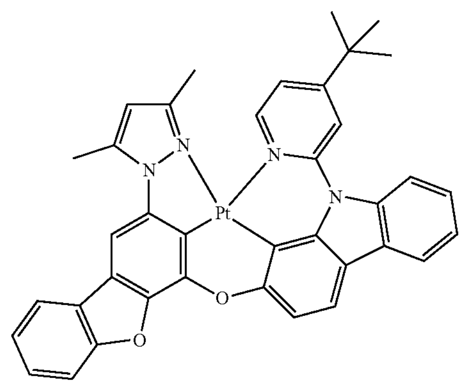
7
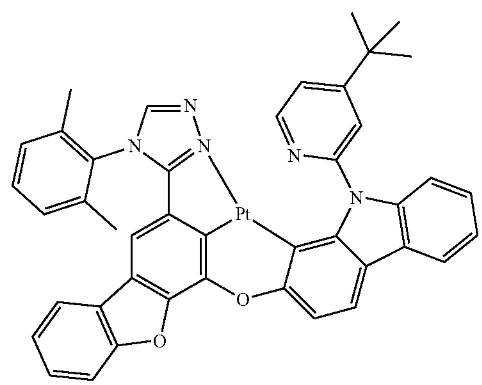
8
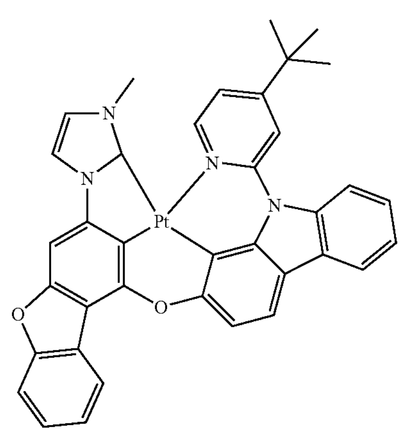

9
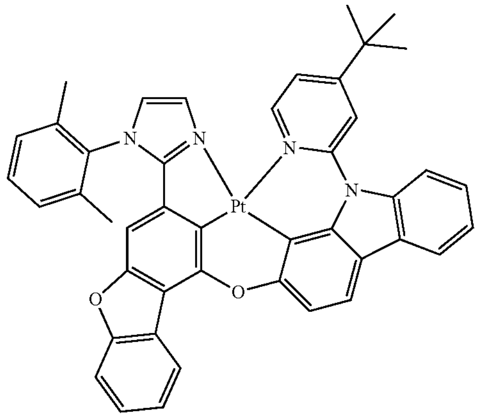
10
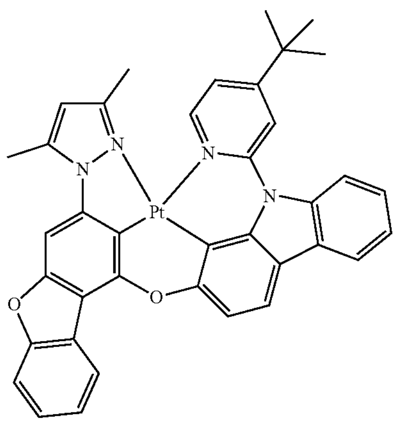
11
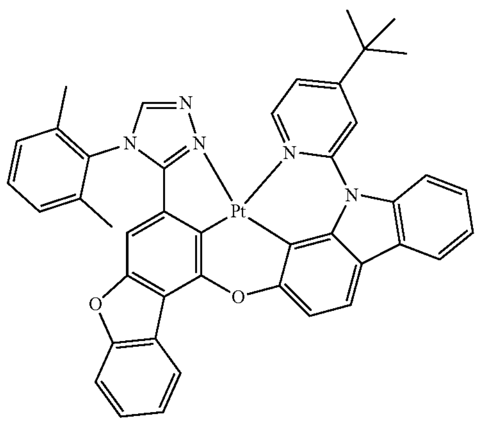
12
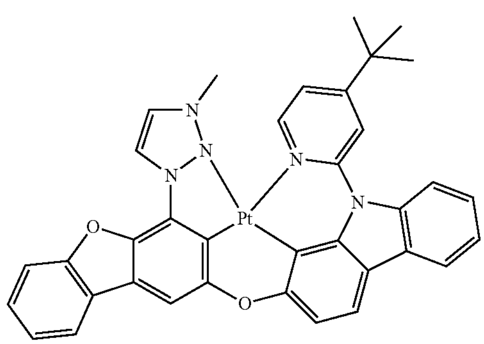
13
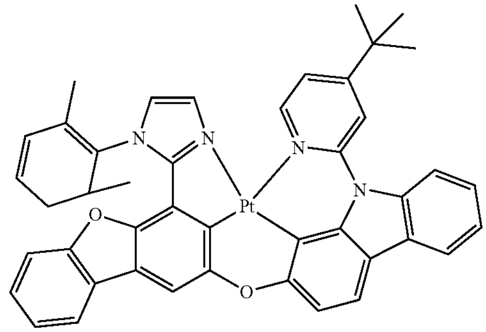
14
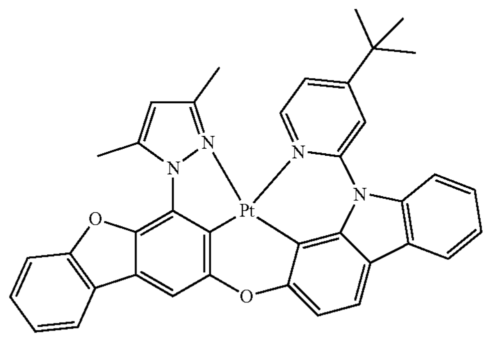
15
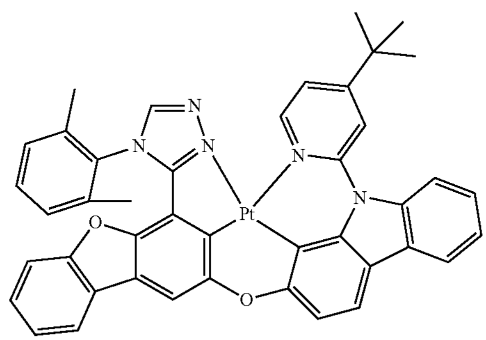
16
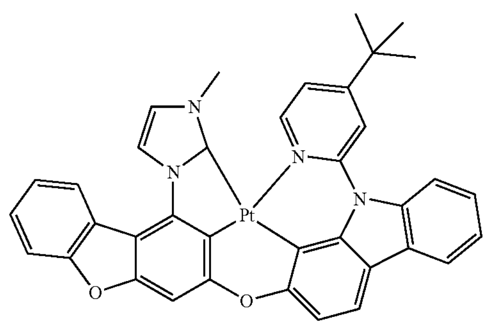
17
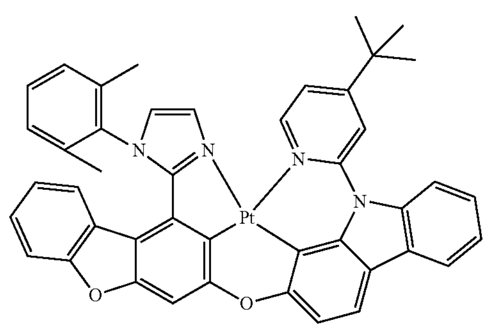

-continued
18
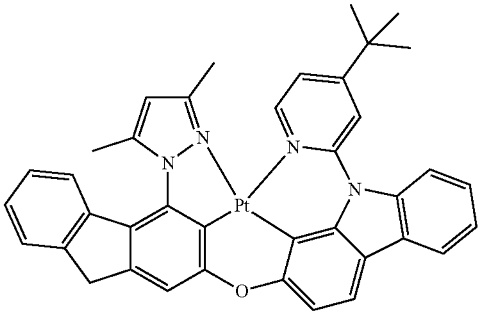
19
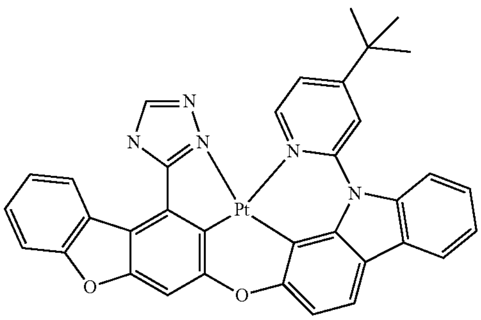
20
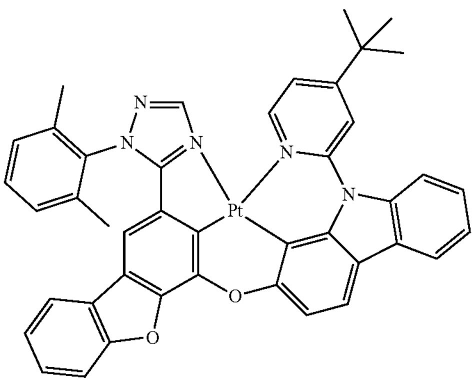
21
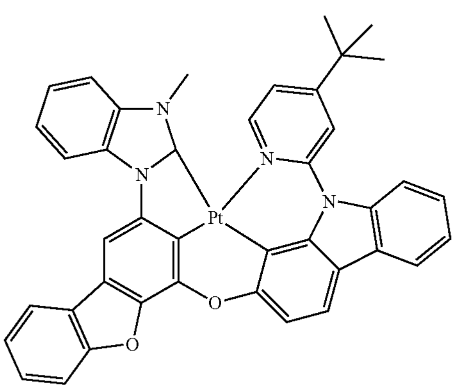
-continued
22
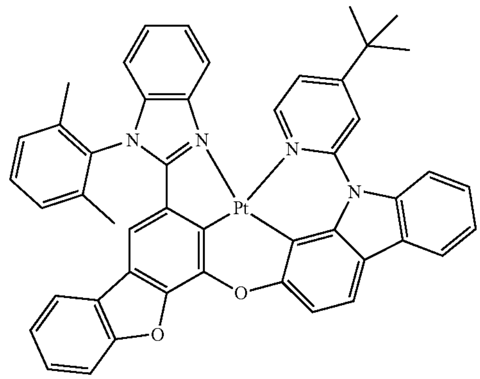
23
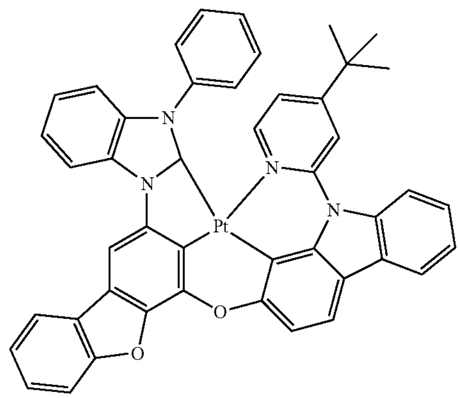
24
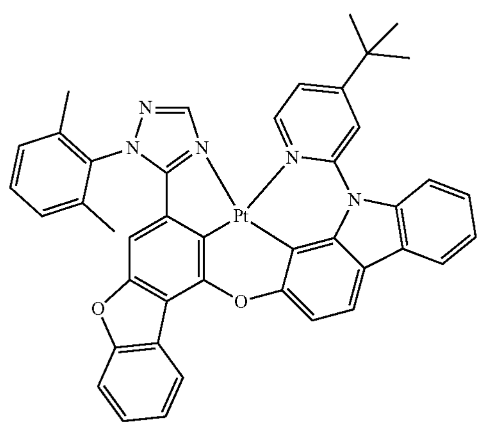
25
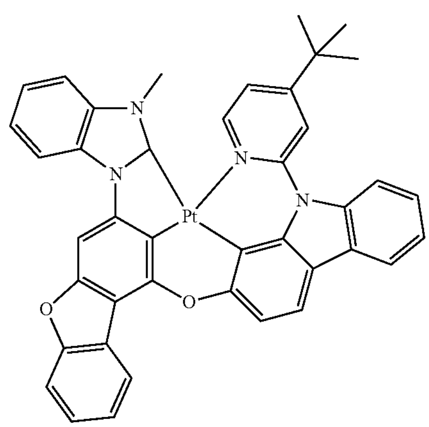

26
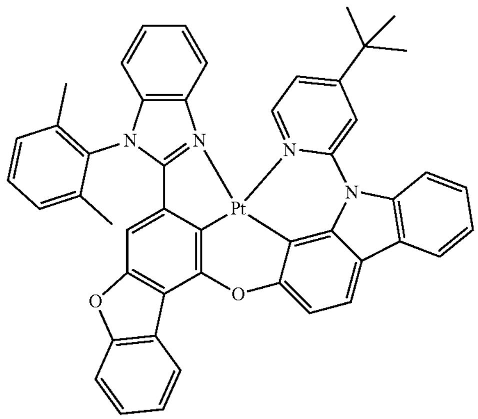
27
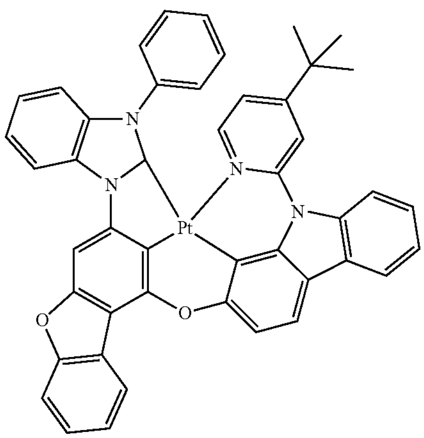
28
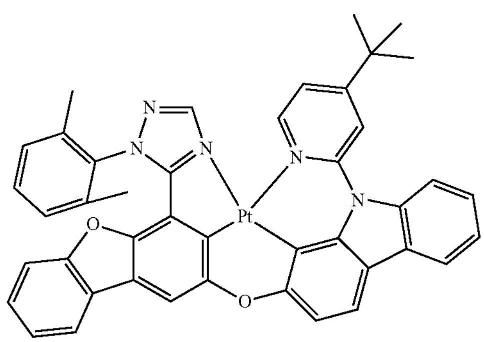
29
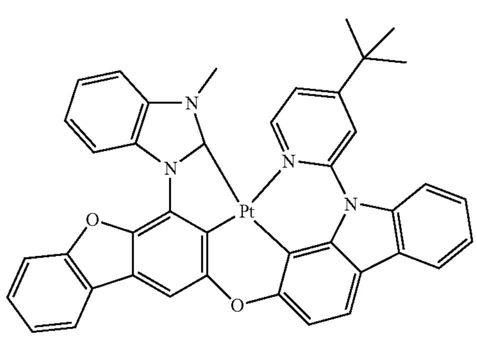
30
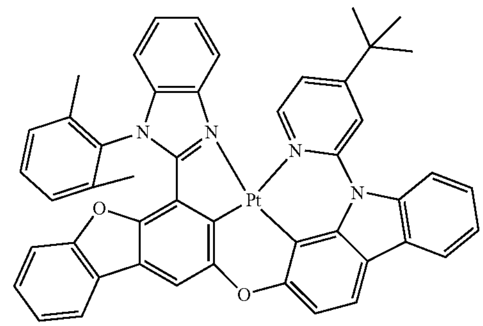
31
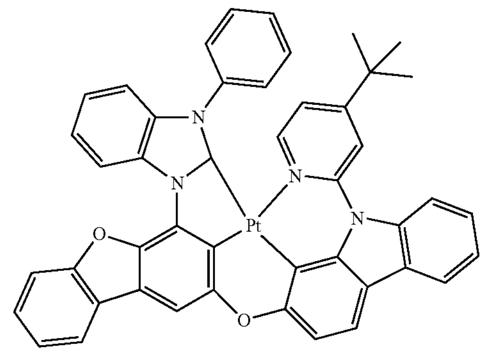
32
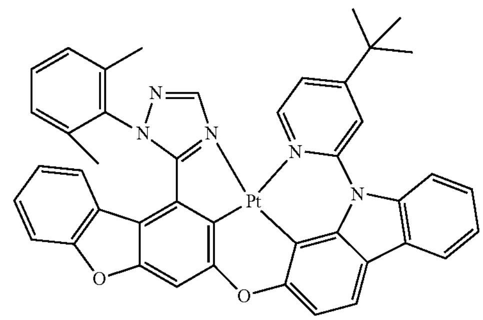
33
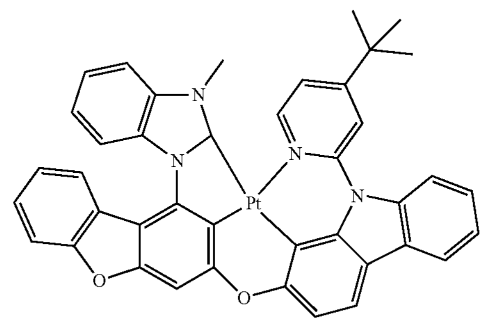
34
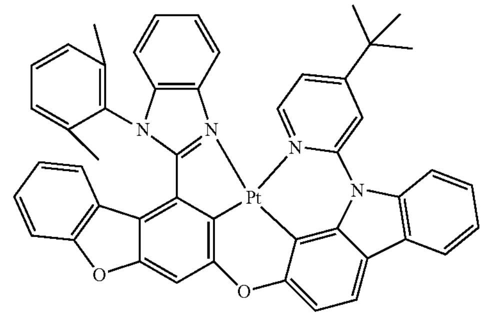

-continued

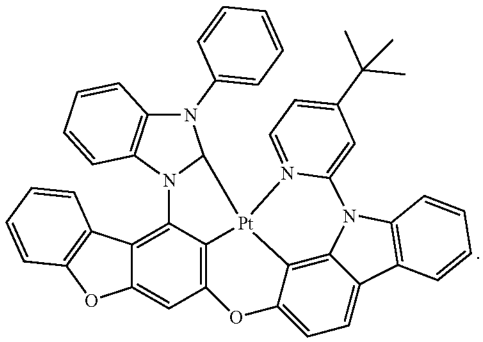

15. An organic light-emitting device comprising:

a first electrode;

a second electrode; and an organic layer between the first electrode and the second electrode, the organic layer comprising an emission layer and at least one of the organometallic compound of claim 1.

16. The organic light-emitting device of claim 15, wherein the first electrode is an anode, the second electrode is a cathode, the organic layer further comprises a hole transport region between the first electrode and the emission layer and an electron transport region between the emission layer and the second electrode, wherein the hole transport region comprises a hole injection layer, a hole transport layer, an electron blocking layer, or a combination thereof, and the electron transport region comprises a hole blocking layer, an electron transport layer, an electron injection layer, or a combination thereof.

17. The organic light-emitting device of claim 15, wherein the organometallic compound is comprised in the emission layer.

18. The condensed cyclic compound of claim 17, wherein the emission layer further comprises a host, and the amount by weight of the host is greater than the amount by weight of the organometallic compound.

19. The condensed cyclic compound of claim 17, wherein the emission layer emits blue light having a maximum emission wavelength in a range of about 410 nanometers (nm) to about 490 nm.

20. A diagnostic composition comprising at least one of the organometallic compound of claim 1.

* * * * *